United States Patent
Katsuoka et al.

(10) Patent No.: US 6,629,883 B2
(45) Date of Patent: Oct. 7, 2003

(54) POLISHING APPARATUS

(75) Inventors: Seiji Katsuoka, Atsugi (JP); Masahiko Sekimoto, Zushi (JP); Mitsuru Miyazaki, Kamakura (JP); Naoki Noji, Yamato (JP); Kazuki Chiba, Yokohama (JP); Kenji Fujimoto, Fujisawa (JP)

(73) Assignees: Ebara Corporation, Tokyo (JP); Mitsubishi Materials Corporation, Tokyo (JP)

( * ) Notice: Subject to any disclaimer, the term of this patent is extended or adjusted under 35 U.S.C. 154(b) by 5 days.

(21) Appl. No.: 09/855,677

(22) Filed: May 16, 2001

(65) Prior Publication Data

US 2001/0044266 A1 Nov. 22, 2001

(30) Foreign Application Priority Data

May 16, 2000 (JP) ........................................ 2000-143771

(51) Int. Cl.[7] ................................................. B24B 7/00
(52) U.S. Cl. ........................ 451/332; 451/67; 451/333; 451/41
(58) Field of Search ............................. 451/67, 65, 66, 451/73, 287, 288, 290, 332, 333, 334; 51/131.5, 132; 134/62, 41, 287–289, 902

(56) References Cited

U.S. PATENT DOCUMENTS

| | | | | |
|---|---|---|---|---|
| 3,659,386 A | * | 5/1972 | Goetz et al. ................... | 451/37 |
| 3,906,678 A | * | 9/1975 | Roth ........................... | 451/271 |
| 3,913,271 A | * | 10/1975 | Boettcher .............. | 414/223.01 |
| 4,141,180 A | * | 2/1979 | Gill et al. .................... | 451/276 |
| 4,680,893 A | * | 7/1987 | Cronkhite et al. ........... | 451/287 |
| 5,232,875 A | * | 8/1993 | Tuttle et al. ................... | 216/88 |
| 5,329,732 A | * | 7/1994 | Karlsrud et al. ............. | 451/289 |
| 5,551,986 A | * | 9/1996 | Jain .............................. | 134/33 |
| 5,554,064 A | * | 9/1996 | Breivogel et al. ............. | 451/41 |
| 5,562,524 A | * | 10/1996 | Gill, Jr. .......................... | 451/1 |
| 5,616,063 A | * | 4/1997 | Okumura et al. ............... | 451/1 |
| 5,618,227 A | * | 4/1997 | Tsutsumi et al. ........... | 451/288 |
| 5,649,854 A | * | 7/1997 | Gill, Jr. ....................... | 451/290 |
| 5,655,954 A | * | 8/1997 | Oishi et al. .................... | 451/67 |
| 5,679,059 A | * | 10/1997 | Nishi et al. .................. | 451/285 |
| 5,718,618 A | * | 2/1998 | Guckel et al. ................. | 216/89 |
| 5,804,507 A | * | 9/1998 | Perlov et al. .................. | 134/33 |
| 5,827,110 A | * | 10/1998 | Yajima et al. .............. | 451/288 |
| 5,830,045 A | * | 11/1998 | Togawa et al. ............. | 451/288 |
| 5,885,138 A | * | 3/1999 | Okumura et al. ........... | 451/285 |
| 5,897,426 A | * | 4/1999 | Somekh ....................... | 451/41 |
| 6,354,922 B1 | * | 3/2002 | Sakurai et al. .............. | 451/288 |
| 6,358,126 B1 | * | 3/2002 | Jackson et al. ............. | 451/279 |
| 6,358,128 B1 | * | 3/2002 | Sakurai et al. .............. | 451/287 |

* cited by examiner

Primary Examiner—Joseph J. Hail, III
Assistant Examiner—Anthony Ojini
(74) Attorney, Agent, or Firm—Wenderoth, Lind & Ponack, L.L.P.

(57) ABSTRACT

A multi-head type polishing apparatus includes a polishing table having a polishing surface, a plurality of top rings for holding workpieces and pressing the workpieces against the polishing surface, and a carousel for supporting the top rings and indexing the top rings. The polishing apparatus further includes a rotary transporter disposed in a position which can be accessed by the top rings, and having a plurality of portions positioned on a predetermined circumference from a center of rotation of the rotary transporter for holding the workpieces. The polishing apparatus also has a pusher for transferring the workpieces between the rotary transporter and the top rings.

14 Claims, 57 Drawing Sheets

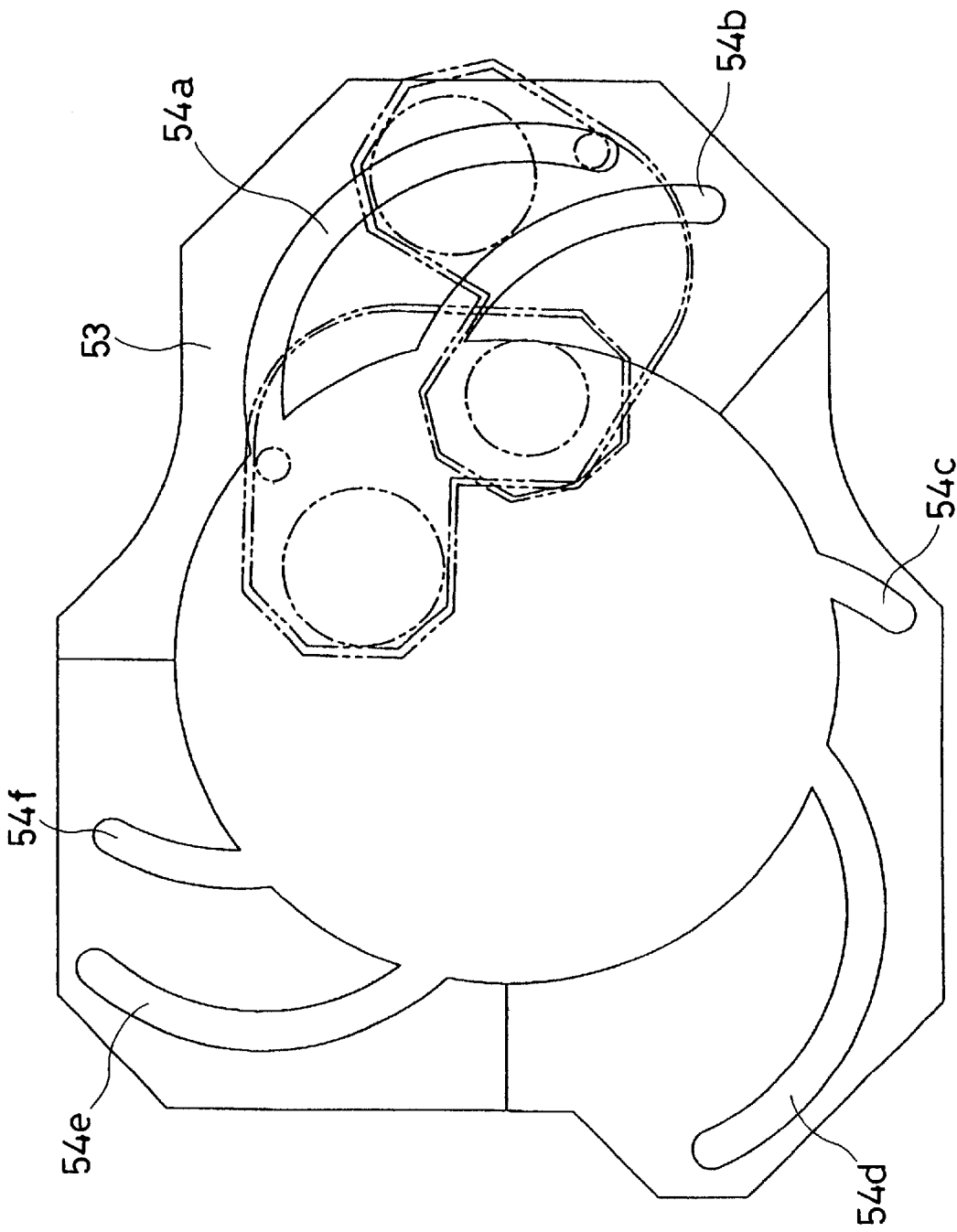

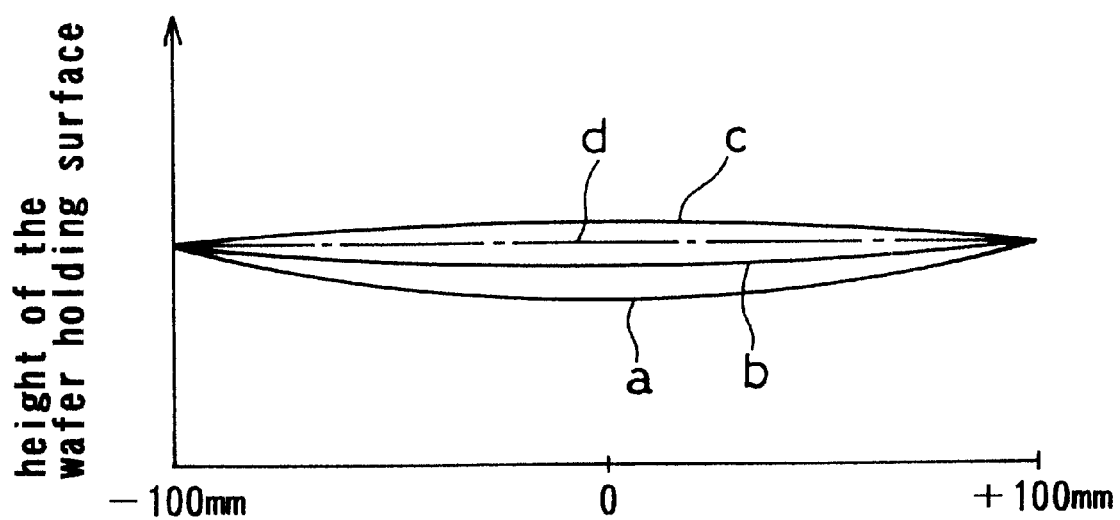
F I G. 1 6

$F_1 > F_2$ $F_1 \approx F_2$ $F_1 < F_2$

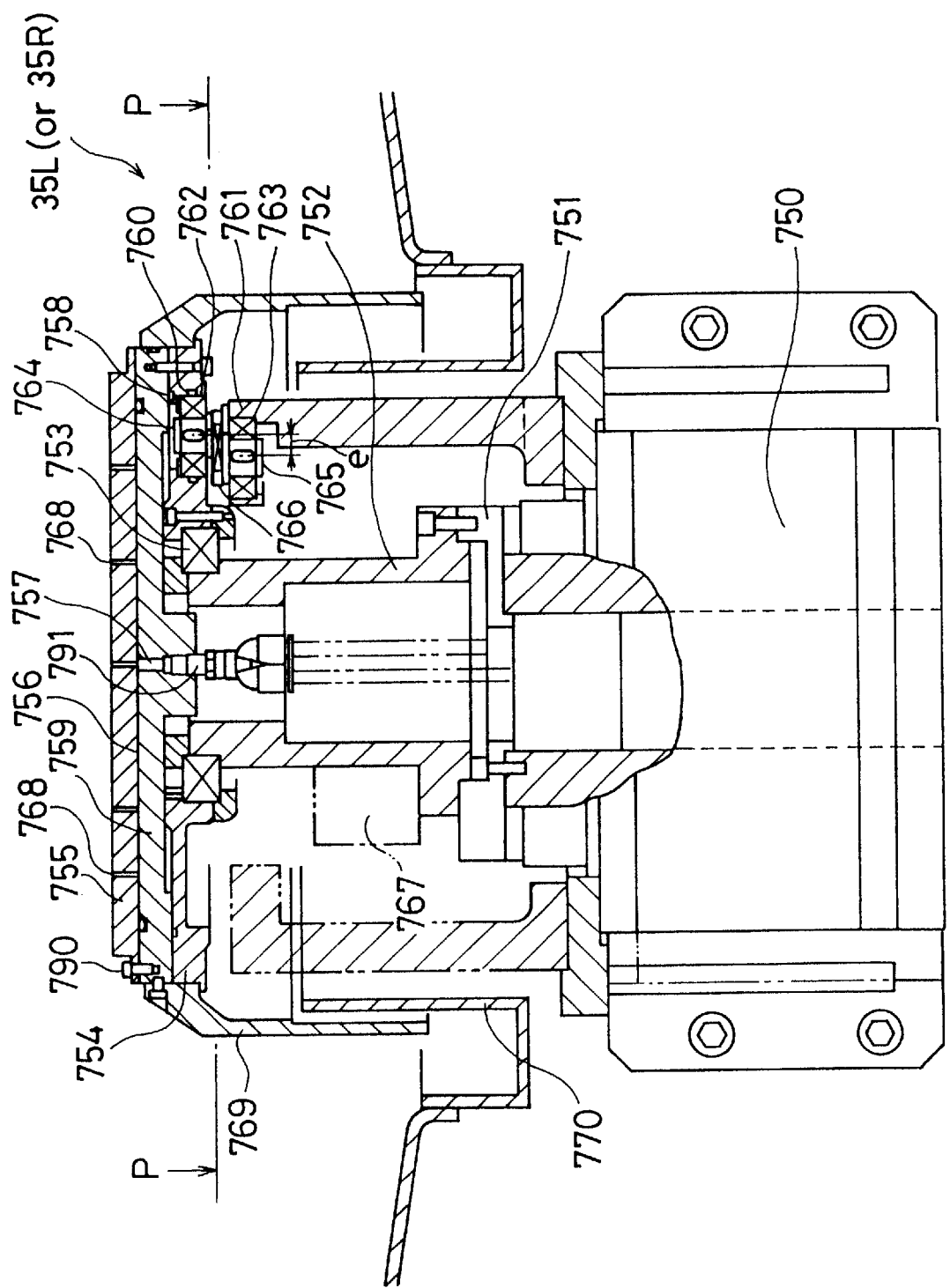

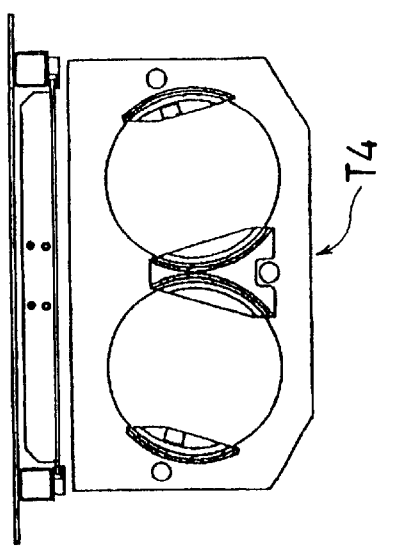
FIG. 22E
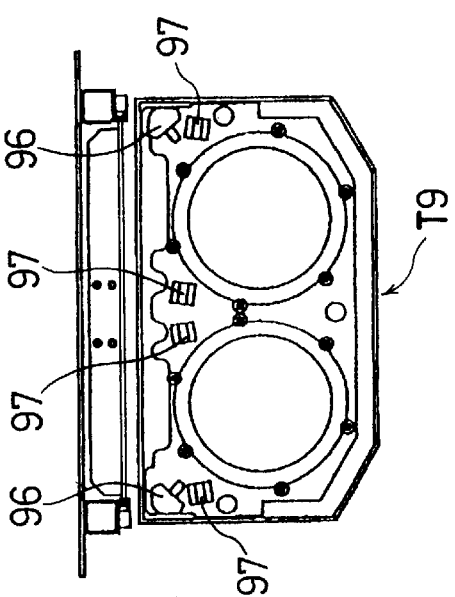
FIG. 22B
FIG. 22D
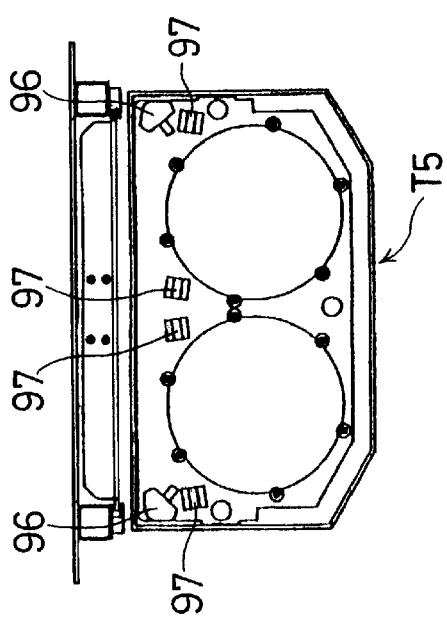
FIG. 22A
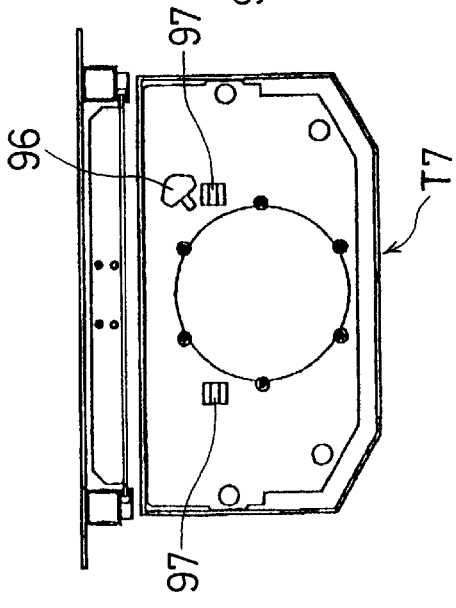
FIG. 22C

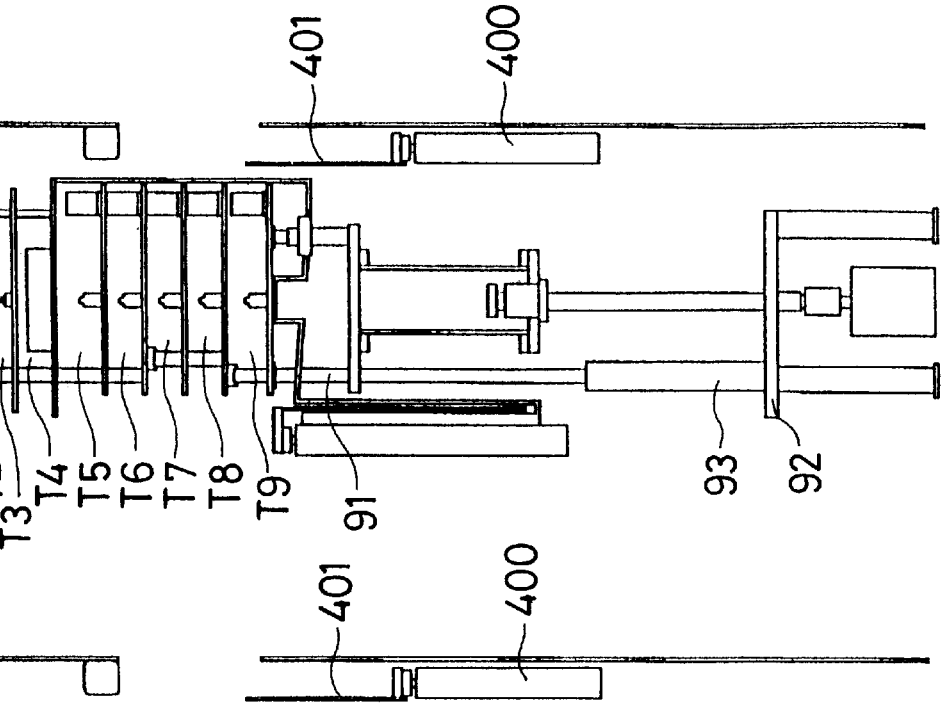
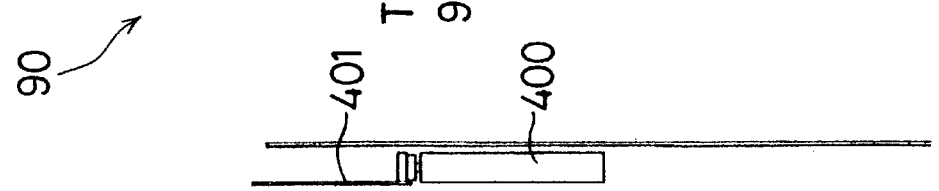
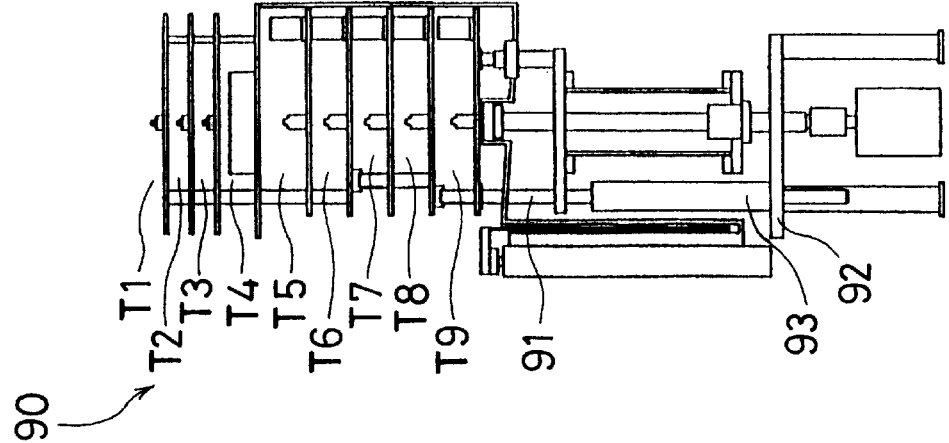

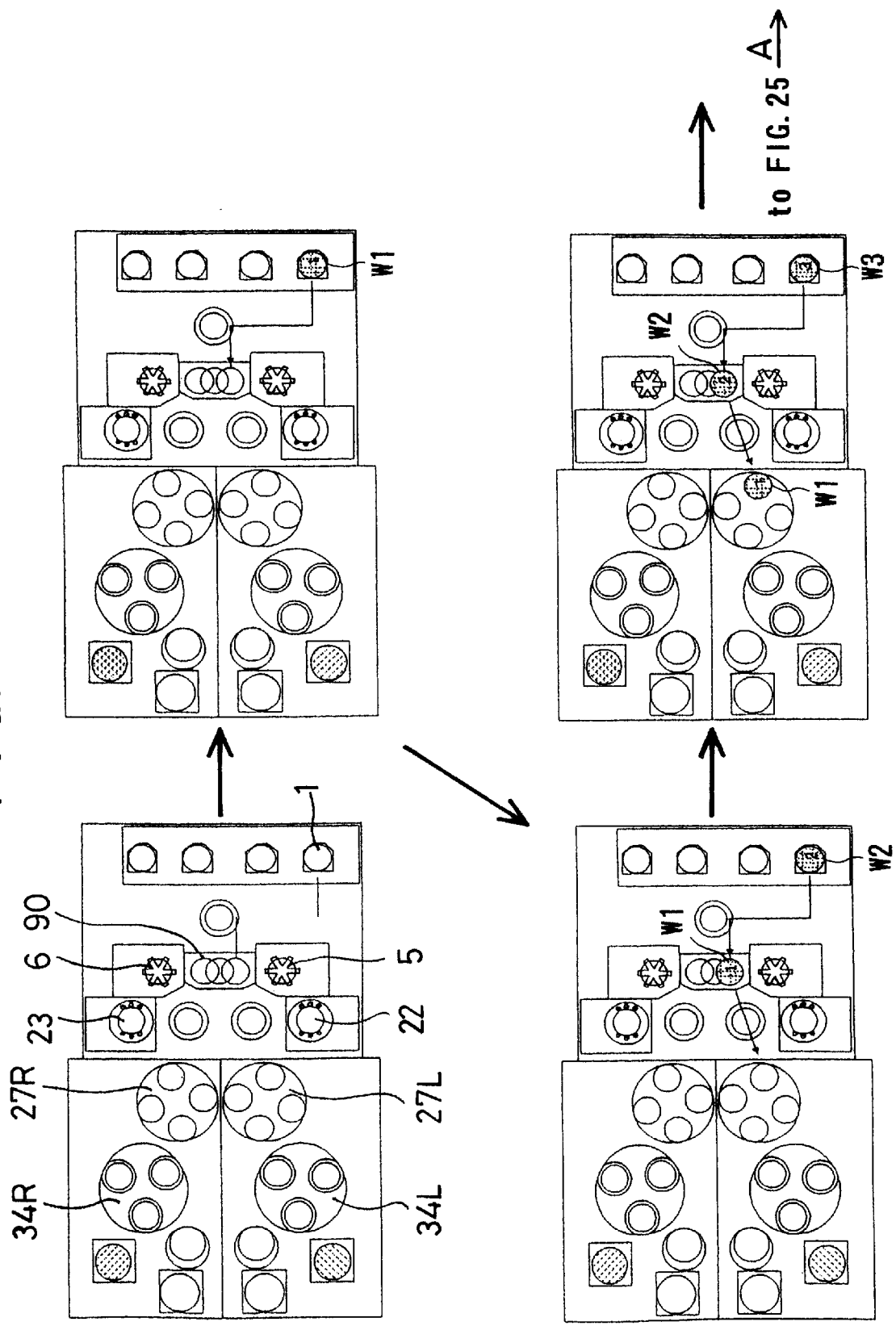

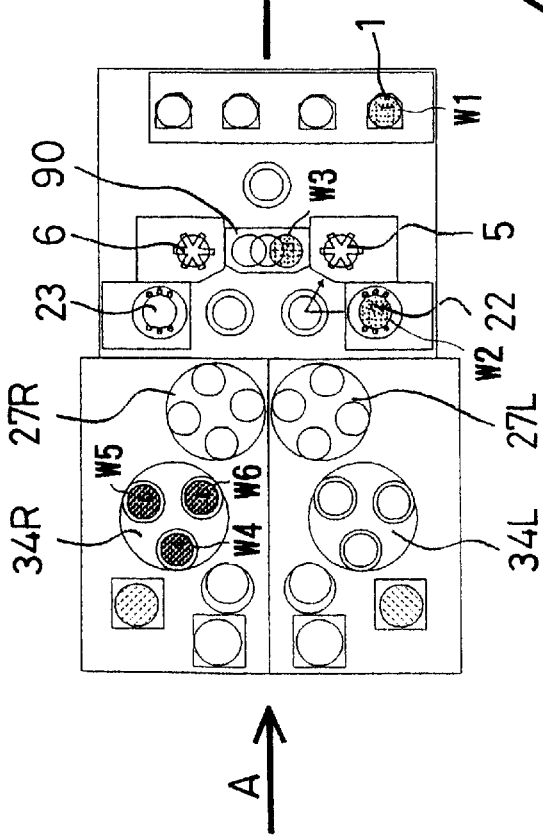
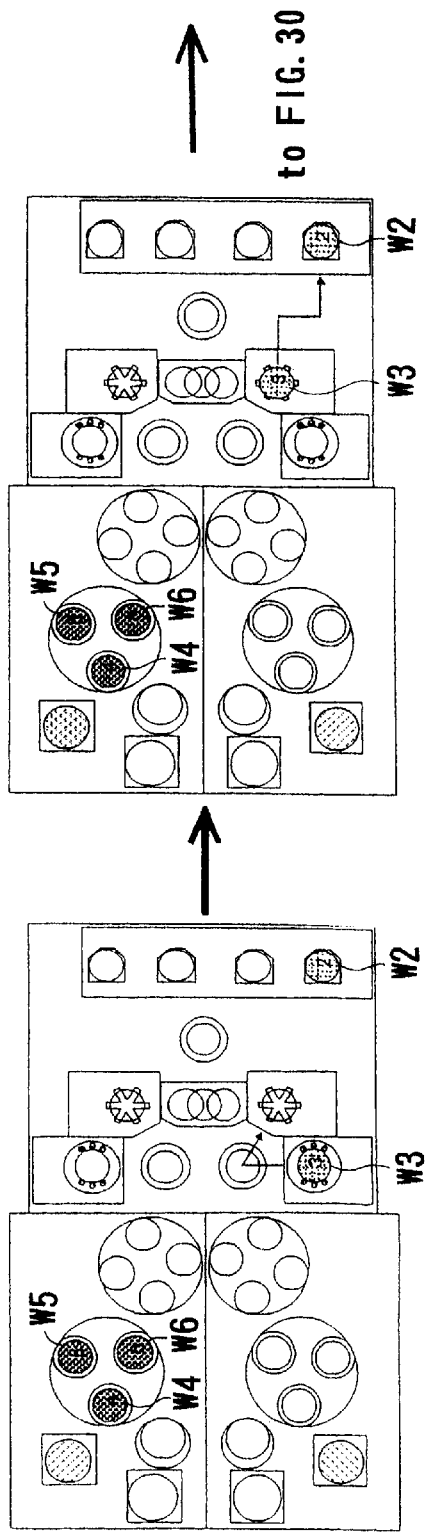
FIG. 29

FIG. 34
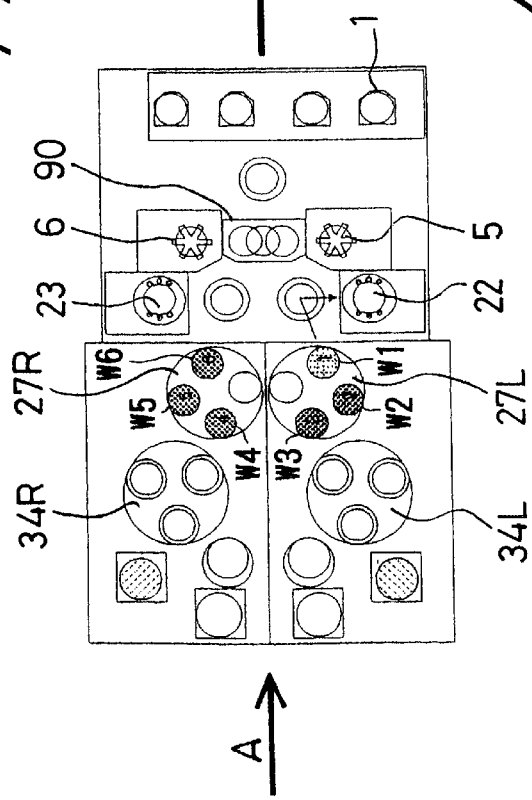
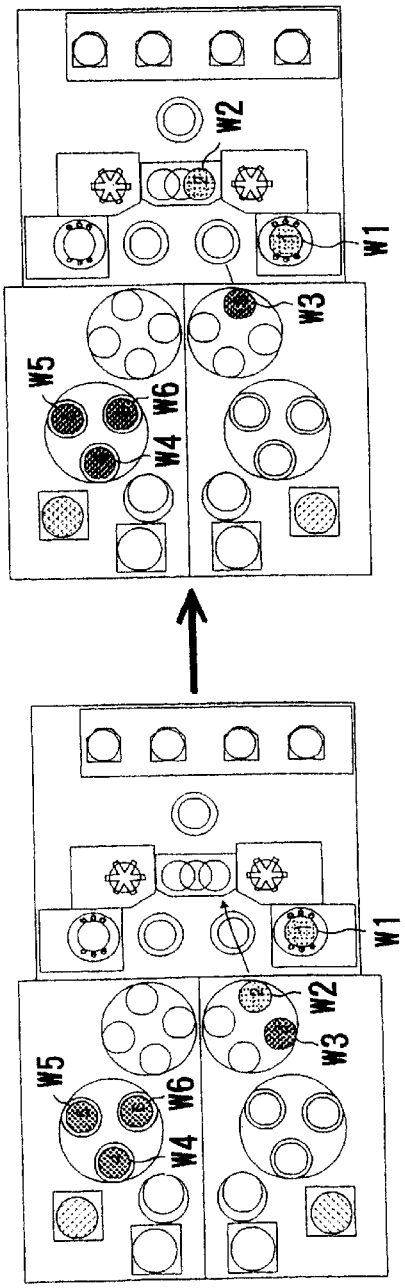
to FIG. 35

FIG. 35
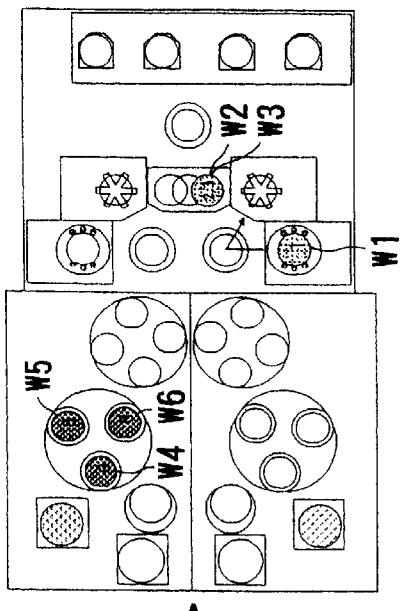
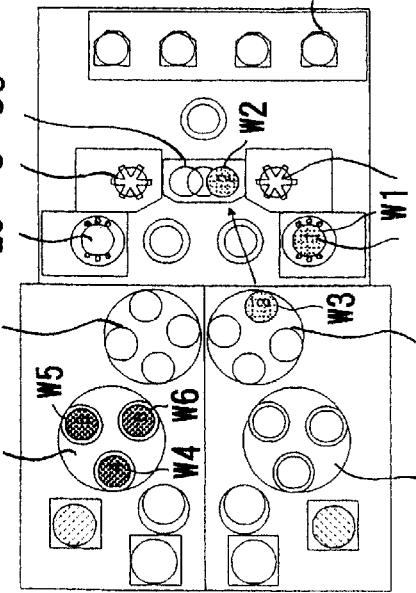
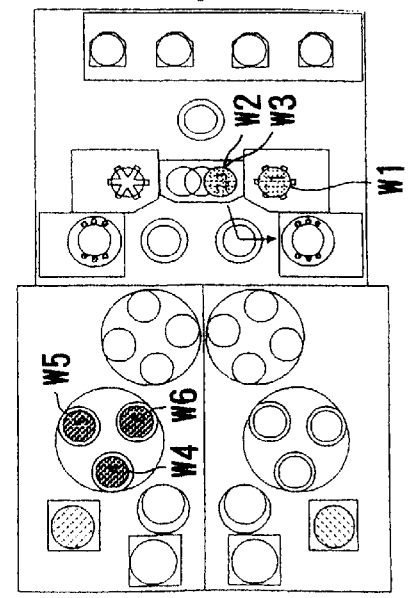
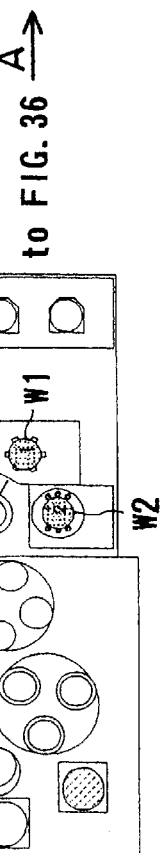

FIG. 40
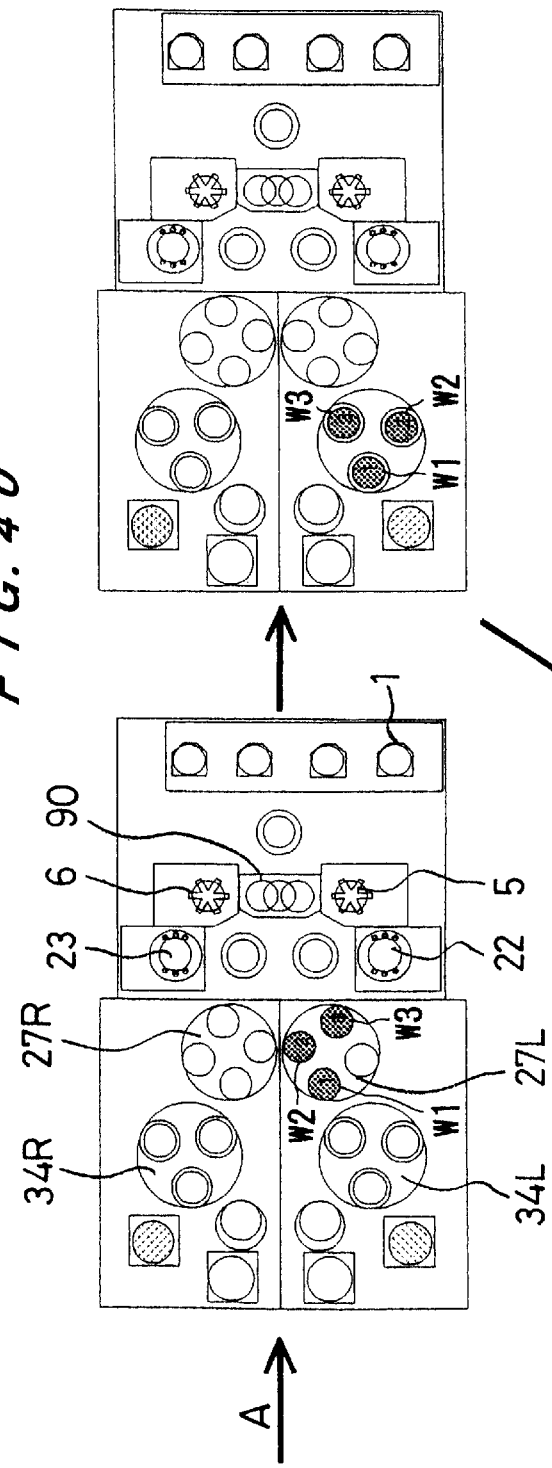
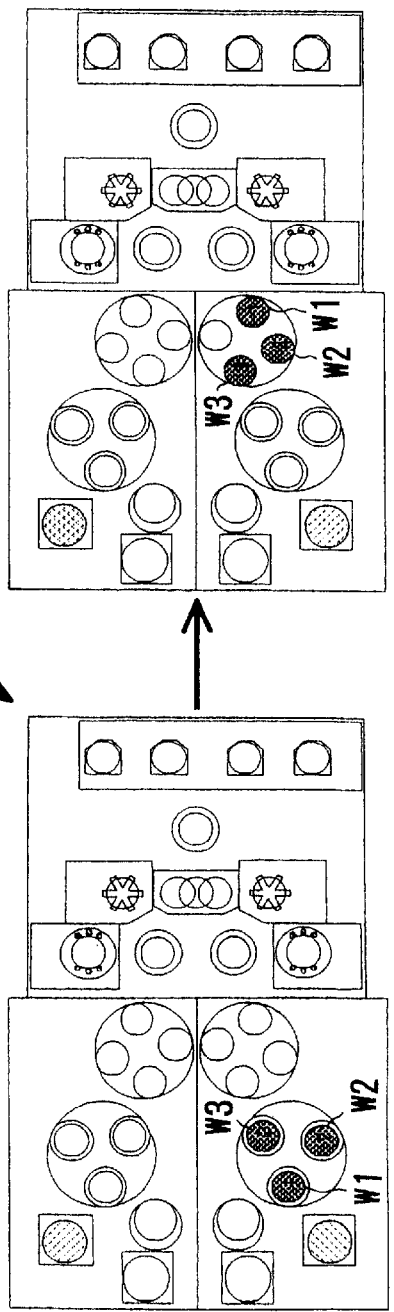
to FIG. 41

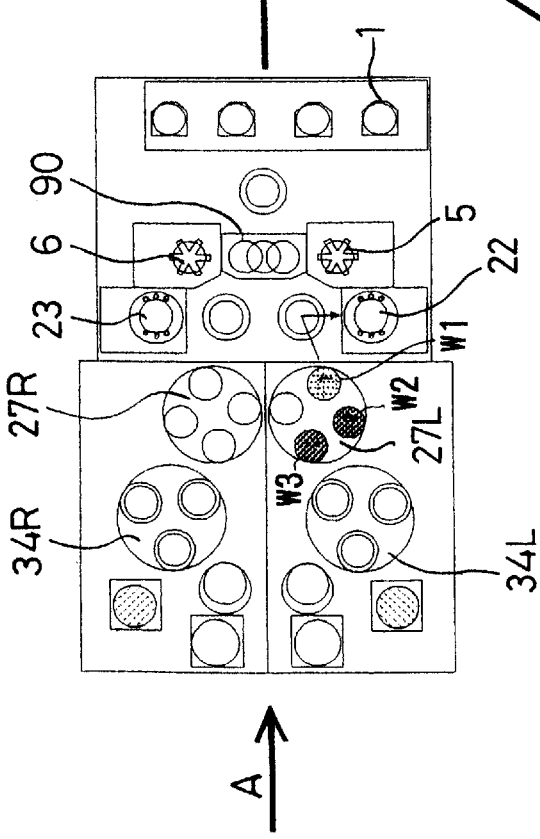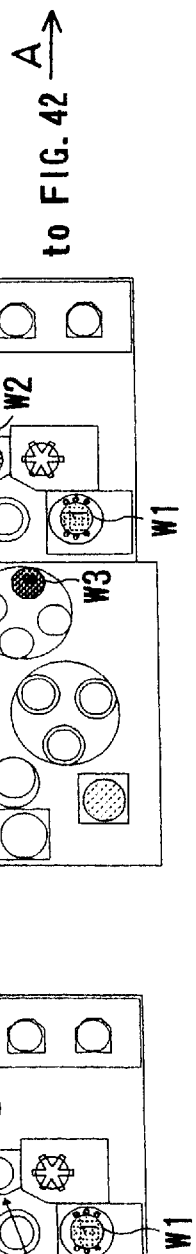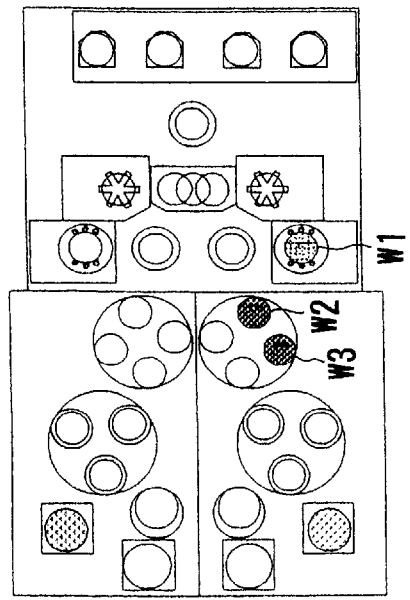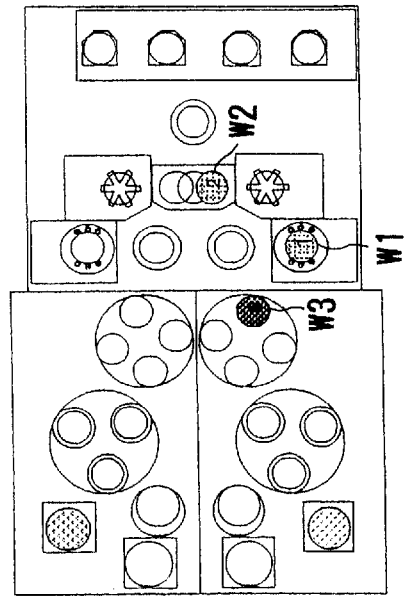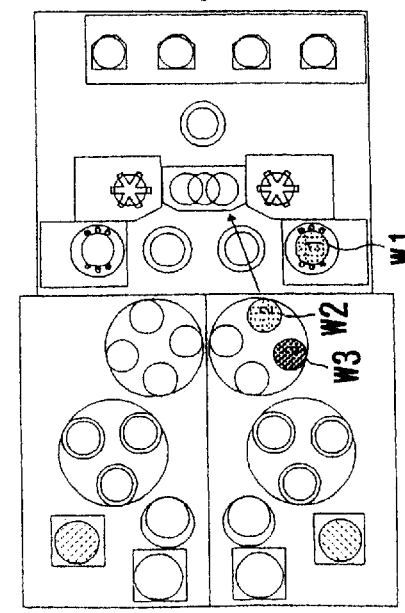
FIG. 41

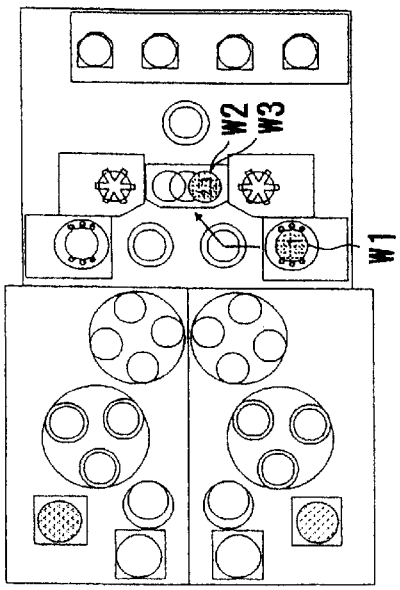
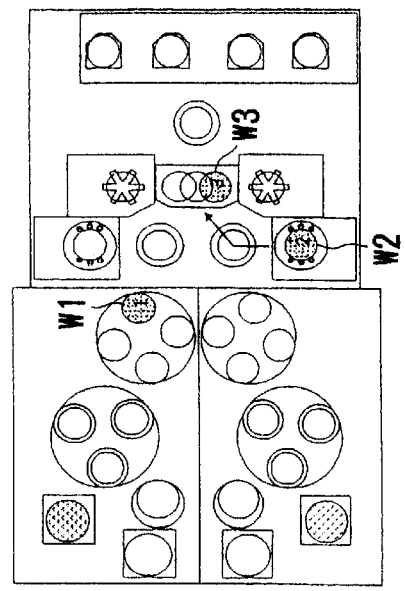
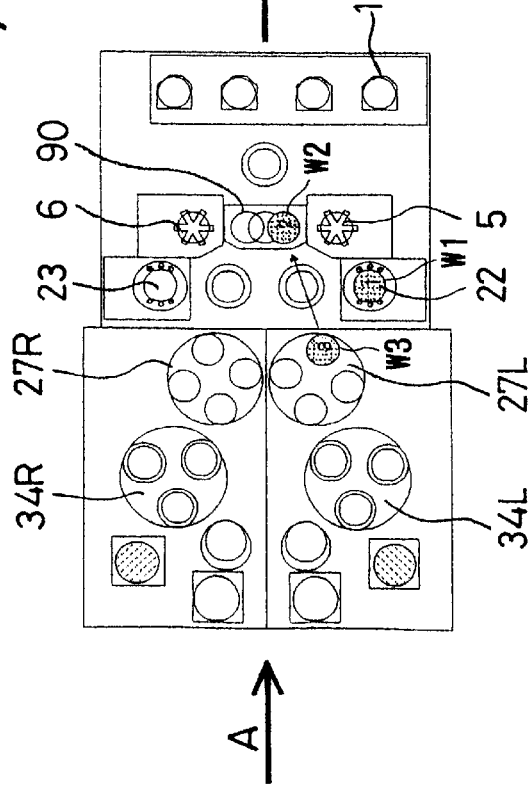
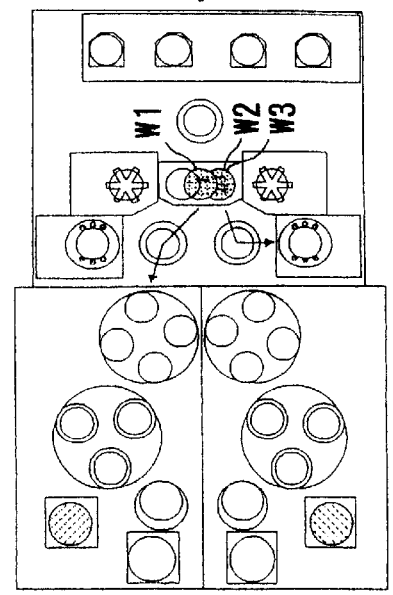
FIG. 42

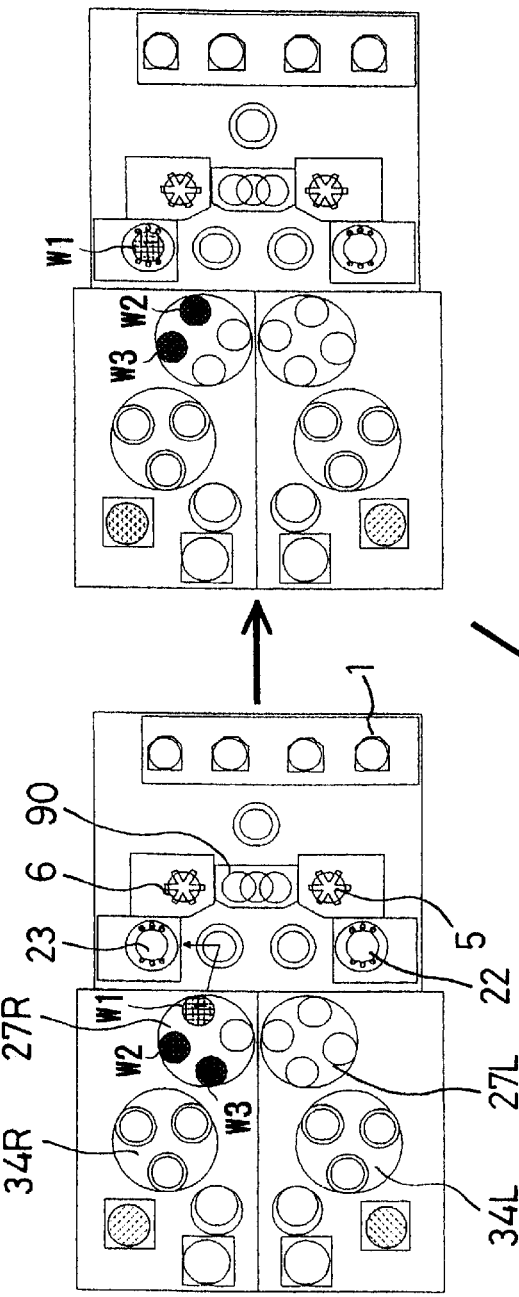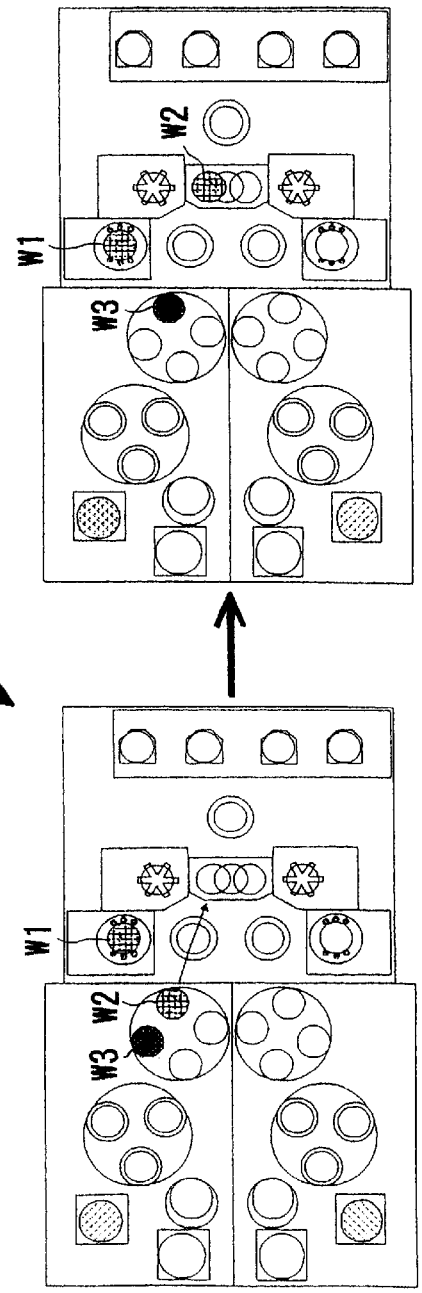
FIG. 45
to FIG. 46

FIG. 48
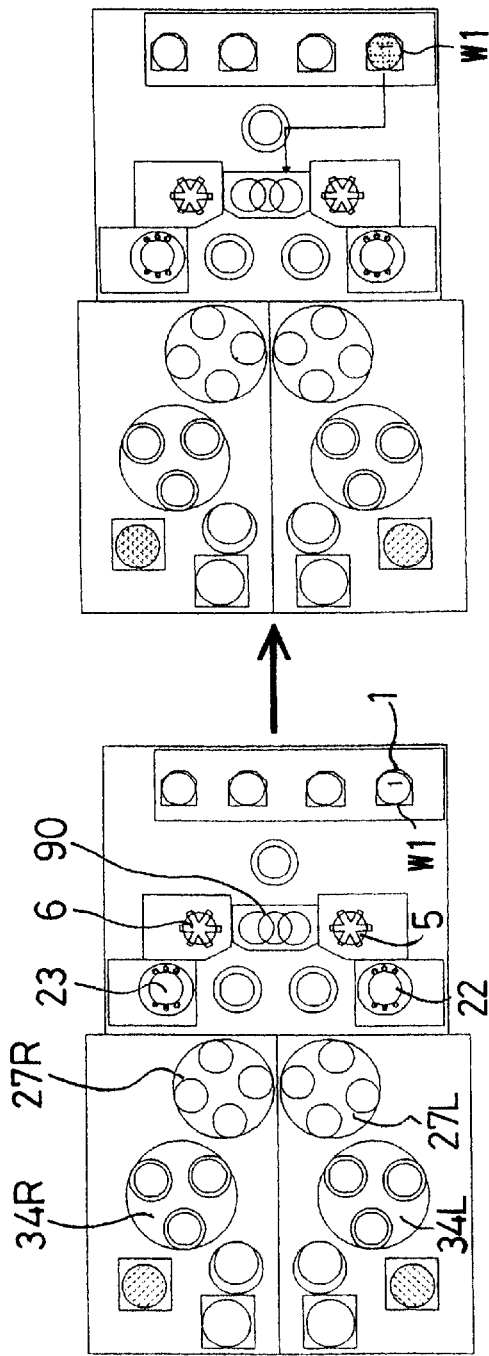
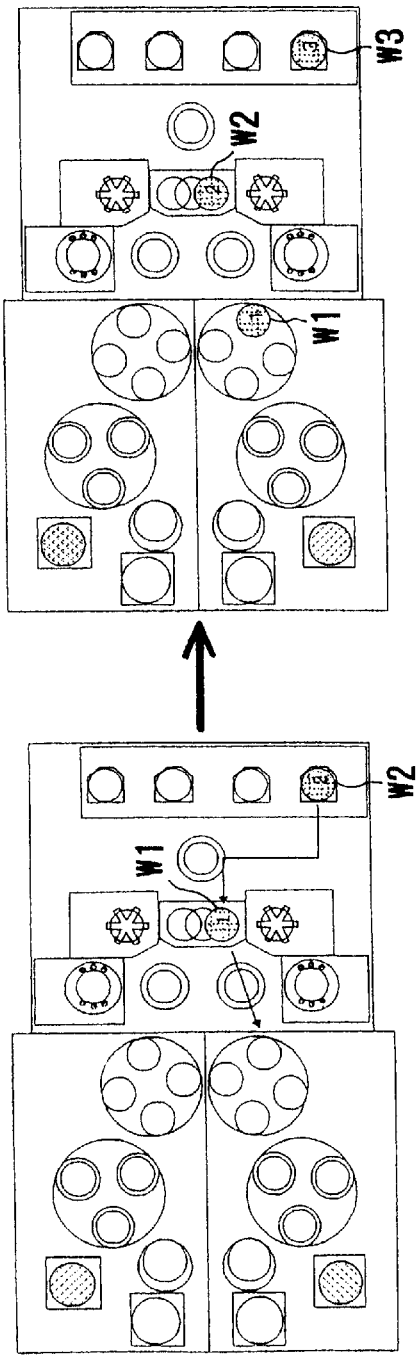
to FIG. 49 A→

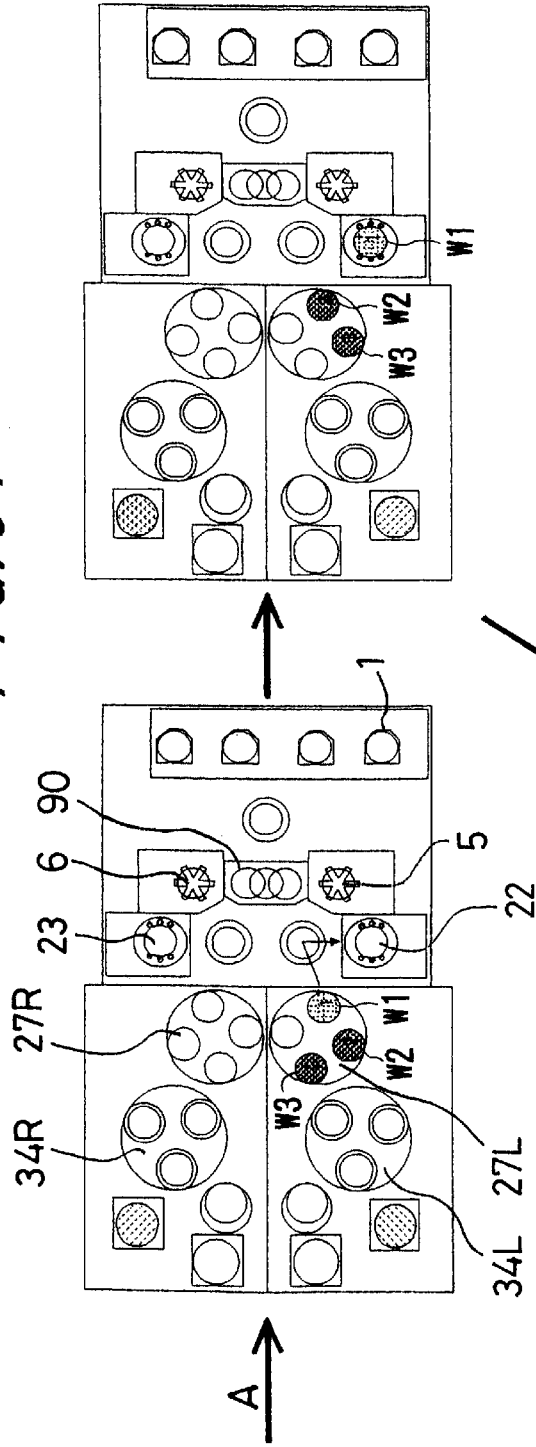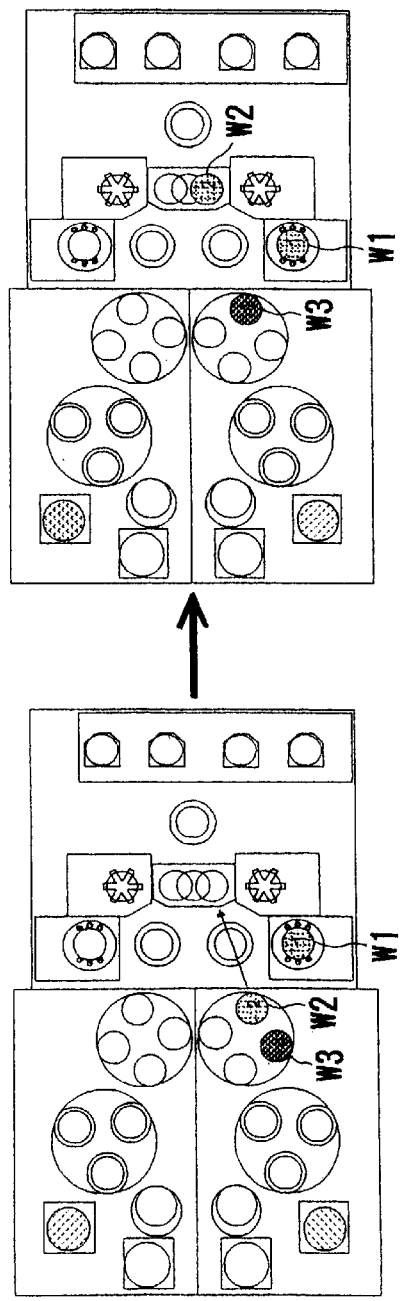
FIG. 51
to FIG. 52

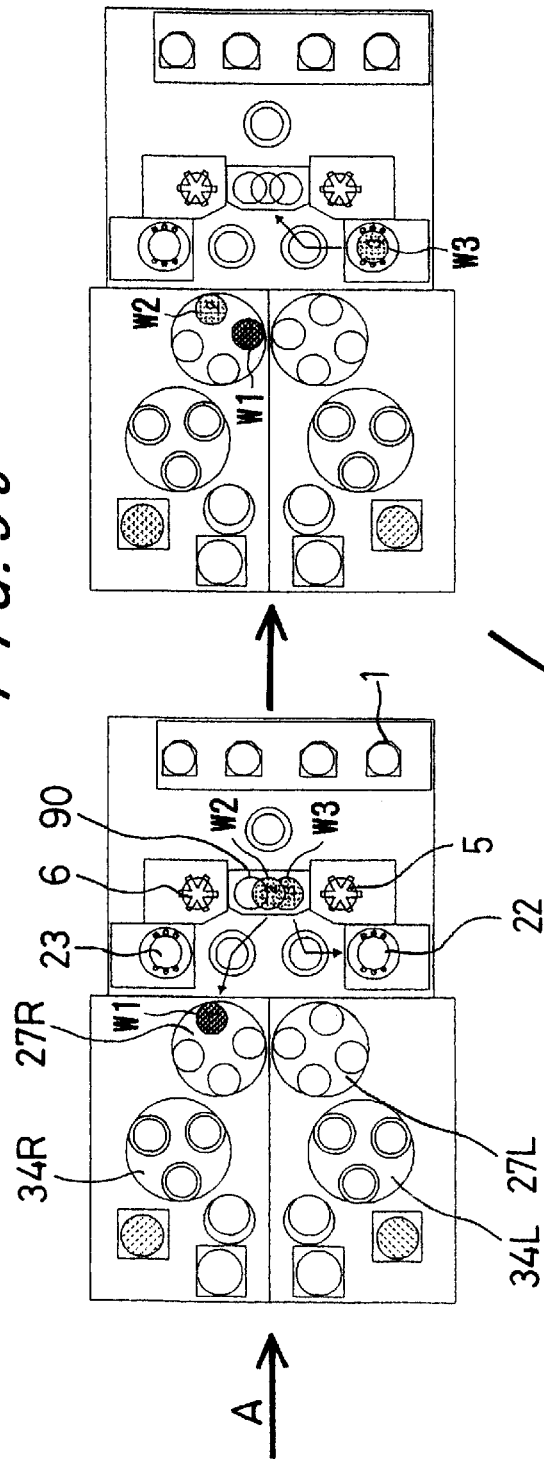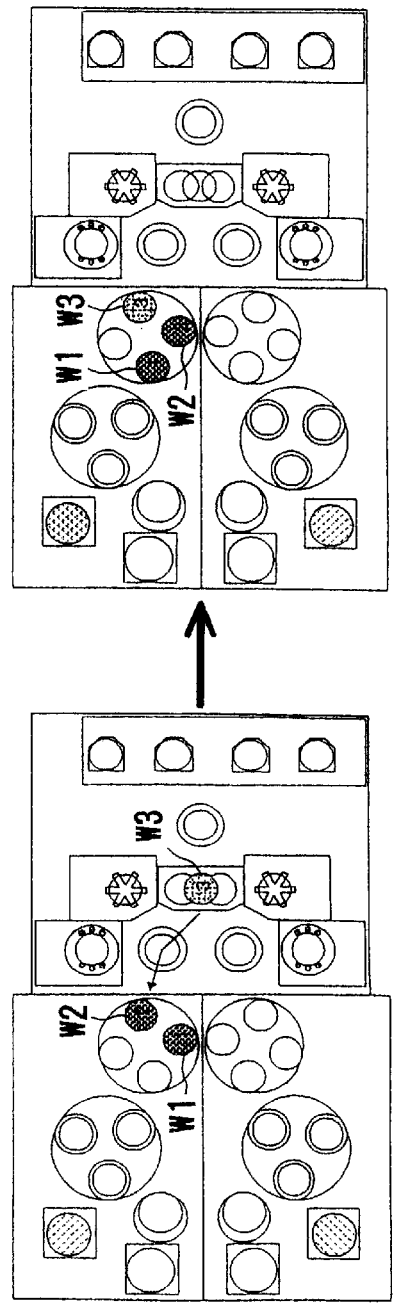
FIG. 53

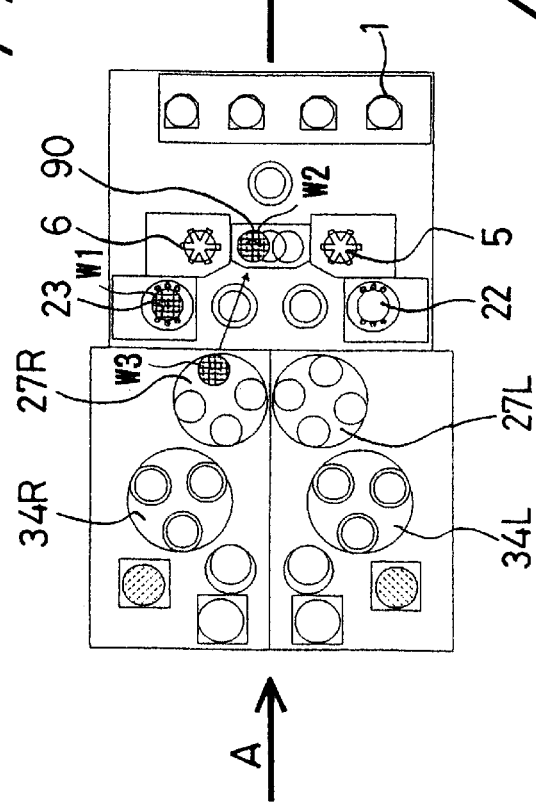
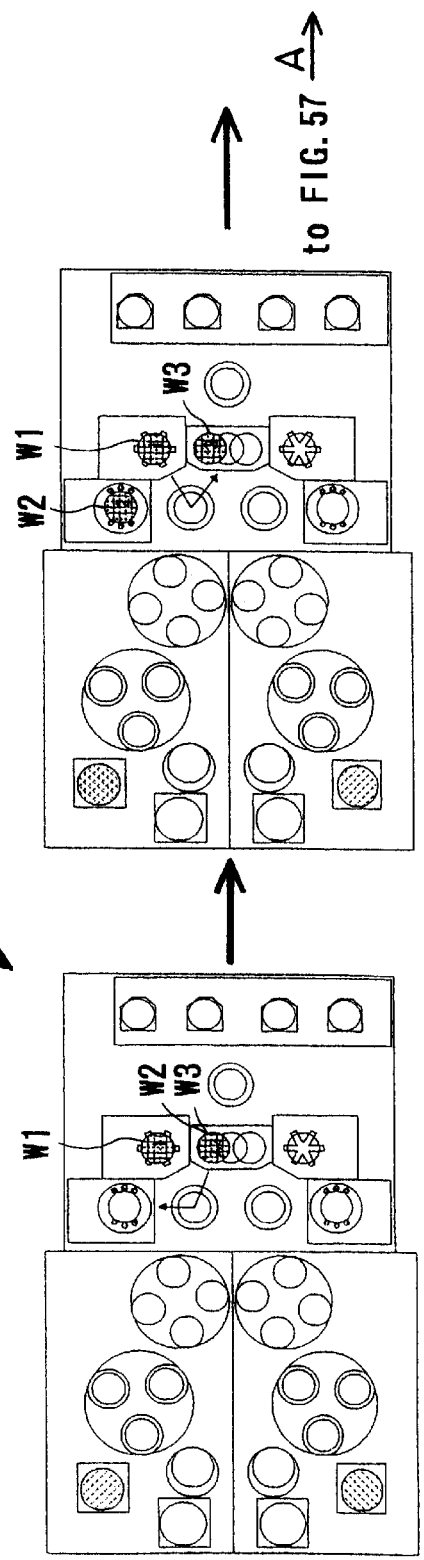
FIG. 56

POLISHING APPARATUS

BACKGROUND OF THE INVENTION

1. Field of the Invention

The present invention relates to a polishing apparatus for polishing a workpiece such as a semiconductor wafer to a flat mirror finish, and more particularly to a multi-head type polishing apparatus having a plurality of top rings for holding workpieces with respect to a single polishing table.

2. Description of the Related Art

Recent rapid progress in semiconductor device integration demands smaller and smaller wiring patterns or interconnections and also narrower spaces between interconnections which connect active areas. One process available for forming such interconnections is photolithography. A photolithographic process requires that surfaces on which pattern images are to be focused by a stepper should be as flat as possible because depth of focus of an optical system is relatively small. It is therefore necessary to make surfaces of semiconductor wafers flat for photolithography.

One customary way of planarizing a surface of a semiconductor wafer is to polish the semiconductor wafer by a chemical mechanical polishing (CMP) process.

There has been known a multi-head type polishing apparatus which has a plurality of top rings for holding semiconductor wafers with respect to a single polishing table, and which can polish a plurality of semiconductor wafers simultaneously. In this multi-head type polishing apparatus, semiconductor wafers are mounted on respective top rings, and then all of the semiconductor wafers held by the top rings are simultaneously pressed against a polishing surface of the polishing table and polished. After polishing of the semiconductor wafers is conducted for a predetermined time, all of the top rings holding the semiconductor wafers are raised from the polishing table, and then all of the semiconductor wafers which have been polished are removed from the top rings. Thereafter, new semiconductor wafers are mounted on the top rings.

In the conventional multi-head type polishing apparatus described above, a plurality of semiconductor wafers are simultaneously polished, and loading and unloading (i.e. replacement) of the semiconductor wafers are simultaneously conducted. However, in the case where loading of the semiconductor wafers to be polished onto a plurality of top rings, and unloading of the semiconductor wafers which have been polished from the top rings, are automated, loading and unloading of the semiconductor wafers are necessary to be performed in a short time without a transfer error. However, in the multi-head type polishing apparatus, there has been no loading and unloading mechanism which can meet such requirements.

The conventional multi-head type polishing apparatus is a dedicated polishing apparatus for conducting only polishing of semiconductor wafers, and hence the semiconductor wafers which have been polished are transported to a next cleaning process by a movable container in which they are immersed in water to keep them from drying during transportation. However, in the method in which the polishing process and the cleaning process are separately carried out, cleanliness of a clean room tends to be impaired, and the polished semiconductor wafers need to be transported by an operator or a manually operated transportation device. Further, a large installation space is required for two kinds of apparatuses, i.e. a polishing apparatus and a cleaning apparatus that is used to carry out a subsequent cleaning process.

Therefore, in order to make a polishing process clean and reduce installation space of the apparatus, there has been demanded a multi-head type polishing apparatus which performs both a polishing process and a cleaning process therein, and is of a dry-in and dry-out type for introducing semiconductor wafers therein in a dry condition and removing polished and cleaned semiconductor wafers therefrom in a dry condition.

SUMMARY OF THE INVENTION

It is therefore an object of the present invention to provide a multi-head type polishing apparatus which can be used as a dry-in and dry-out type polishing apparatus, has a high processing capability per unit time and unit installation area for processing workpieces such as semiconductor wafers.

In order to achieve the above object, according to a first aspect of the present invention, there is provided a polishing apparatus having a multi-head, comprising: a polishing table having a polishing surface; a plurality of top rings for holding workpieces and pressing the workpieces against the polishing surface; a carousel for supporting the top rings and indexing the top rings; a rotary transporter disposed in a position which can be accessed by the top rings; and a pusher for transferring the workpieces between the rotary transporter and the top rings. The rotating transporter has a plurality of portions positioned on a predetermined circumference, from a center of rotation of the rotary transporter, for holding the workpieces, and the rotary transporter also has an indexing function for indexing the plurality of portions.

According to the present invention, it is possible to shorten time required to transfer workpieces to be polished, such as semiconductor wafers, to the top rings for thereby greatly increasing the number of processed workpieces per unit time, i.e., throughput.

According to a second aspect of the present invention, there is provided a polishing apparatus having a multi-head, comprising: a polishing table having a polishing surface; a plurality of top rings for holding workpieces and pressing the workpieces against the polishing surface; a carousel for supporting the top rings and indexing the top rings; a plurality of cleaning apparatuses for cleaning the workpieces which have been polished; a transfer mechanism for transferring the polished workpieces between the cleaning apparatuses; and a workpiece station having workpiece trays for holding the workpieces in a standby state, while the workpieces are cleaned in a plurality of stages in the cleaning apparatuses or before the workpieces are cleaned.

According to the present invention, some of workpieces can be placed in a standby state in workpiece supports (workpiece trays) of a workpiece station before being processed in a subsequent process.

The above and other objects, features, and advantages of the present invention will be apparent from the following description when taken in conjunction with the accompanying drawings which illustrates preferred embodiments of the present invention by way of example.

BRIEF DESCRIPTION OF THE DRAWINGS

FIG. 6 is a plan view of a guide plate;

FIG. 16 is a graph showing configuration of?a wafer holding surface of a holding plate of the top ring;

FIG. 18 is a vertical cross-sectional view of a scroll-type polishing table;

FIG. 22A is a view of the Wafer station as viewed in the direction indicated by the arrow I of FIG. 21A;

FIG. 22B is a view of the wafer station as viewed in the direction indicated by the arrow II;

FIG. 22C is a view of the wafer station as viewed in the direction indicated by the arrow III;

FIG. 22D is a view of the wafer station as viewed in the direction by the arrow IV;

FIG. 22E is a view of the wafer station as viewed in the direction by the arrow V;

FIGS. 23A through 23C are views illustrative of a manner in which the wafer station operates;

FIG. 24 is a diagram illustrative of a wafer processing route in the polishing apparatus shown in FIGS. 1 though 23;

FIG. 29 is a diagram illustrative of the wafer processing route in the polishing apparatus shown in FIGS. 1 though 23;

FIG. 34 is a schematic diagram illustrative of the example of the process of parallel polishing and three-stage cleaning;

FIG. 35 is a schematic diagram illustrative of the example of the process of parallel polishing and three-stage cleaning;

FIG. 40 is a schematic diagram illustrative of the example of the process of serial polishing and two-stage cleaning;

FIG. 41 is a schematic diagram illustrative of the example of the process of serial polishing and two-stage cleaning;

FIG. 42 is a schematic diagram illustrative of the example of the process of serial polishing and two-stage cleaning;

FIG. 45 is a schematic diagram illustrative of the example of the process of serial polishing and two-stage cleaning;

FIG. 48 is a schematic diagram illustrative of an example of a process of serial polishing and three-stage cleaning;

FIG. 51 is a schematic diagram illustrative of the example of the process of serial polishing and three-stage cleaning;

FIG. 53 is a schematic diagram illustrative of the example of the process of serial polishing and three-stage cleaning;

FIG. 56 is a schematic diagram illustrative of the example of the process of serial polishing and three-stage cleaning;

DETAILED DESCRIPTION OF THE PREFERRED EMBODIMENTS

A polishing apparatus according to embodiments of the present invention will be described below.

Figure 1:
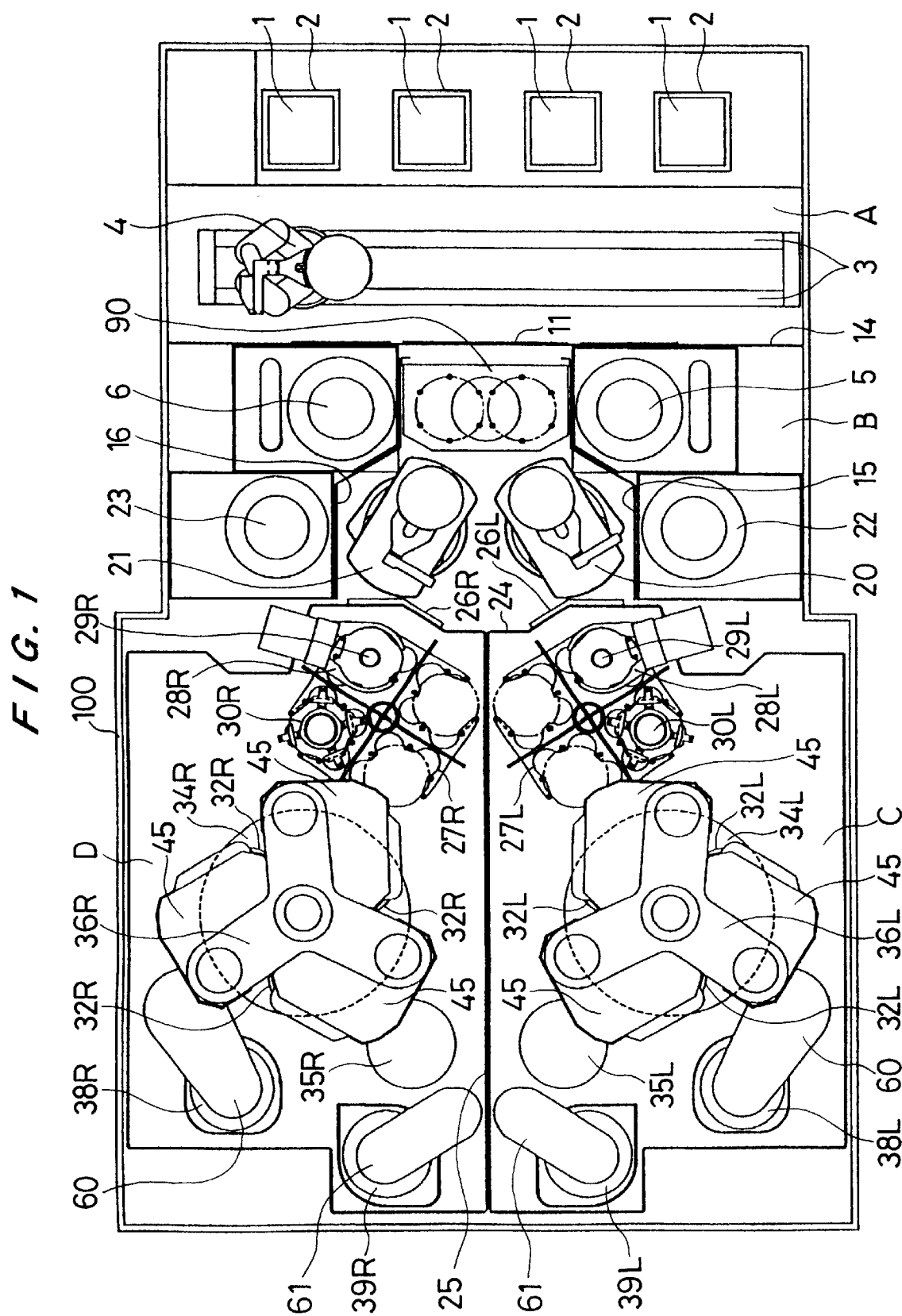
FIG. 1 is a plan view showing a layout of various components of a polishing apparatus.

FIG. 1 shows a layout of various components of a polishing apparatus. As shown in FIG. 1, a polishing apparatus comprises four load-unload stages 2 each for placement of a wafer cassette 1 which accommodates a plurality of semiconductor wafers. Each load-unload stage 2 may have a mechanism for raising and lowering the wafer cassette 1. A transfer robot 4 having two hands is provided on rails 3 so that the transfer robot 4 can move along the rails 3 and access the respective wafer cassettes 1 on the respective load-unload stages 2.

The transfer robot 4 has two hands which are located in a vertically spaced relationship, wherein a lower hand is used only for removing a semiconductor wafer from the wafer cassette 1 and an upper hand is used only for returning the semiconductor wafer to the wafer cassette 1. This arrangement allows for a semiconductor wafer which has been cleaned to be placed at an upper side and is not contaminated. The lower hand is a vacuum attraction-type hand for holding a semiconductor wafer under vacuum, and the upper hand is a recess support-type hand for supporting a peripheral edge of a semiconductor wafer by a recess formed in the hand. The vacuum attraction-type hand can hold a semiconductor wafer and transport the semiconductor wafer even if the semiconductor wafer is not located at a normal position in the wafer cassette due to a slight displacement, and the recess support-type hand can transport a semiconductor wafer while keeping the semiconductor wafer clean because dust is not collected, unlike the vacuum attraction-type hand.

Two cleaning apparatuses 5 and 6 are disposed at an opposite side of the wafer cassettes I with respect to the rails 3 of the transfer robot 4. The cleaning apparatuses 5 and 6 are disposed at positions that can be accessed by the hands of the transfer robot 4. Between the two cleaning apparatuses 5 and 6 and at a position that can be accessed by the transfer robot 4, there is provided a wafer station 90 having multi-stage wafer supports (wafer trays) arranged in a vertical direction. The cleaning apparatuses 5 and 6 have a spin-dry mechanism for drying a semiconductor wafer by spinning the semiconductor wafer at a high speed, and hence two-stage cleaning or three-stage cleaning of a semiconductor wafer can be conducted without replacing any cleaning module.

An area B in which the cleaning apparatuses 5 and 6 and the wafer station 90 are disposed, and an area A in which the wafer cassettes 1 and the transfer robot 4 are disposed are partitioned by a partition wall 14 so that cleanliness of area B and area A can be separated. The partition wall 14 has an opening for allowing semiconductor wafers to pass therethrough, and a shutter 11 is provided at the opening of the partition wall 14. A transfer robot 20 having two hands is disposed at a position where the transfer robot 20 can access the cleaning apparatus 5 and the wafer station 90, and a transfer robot 21 having two hands is disposed at a position where the transfer robot 21 can access the cleaning apparatus 6 and the wafer station 90.

The transfer robot 20 and the transfer robot 21 each have two hands which are located in a vertically spaced relationship. Respective upper hands of the transfer robot 20 and the transfer robot 21 are used for transporting a semiconductor wafer which has been cleaned to the cleaning apparatuses or wafer trays of the wafer station 90, and respective lower hands of the transfer robot 20 and the transfer robot 21 are used for transporting a semiconductor wafer which has not been cleaned or a semiconductor wafer to be polished. Since each lower hand is used to transfer a semiconductor wafer to or from a reversing device, each respective upper hand is not contaminated by drops of a rinsing water which fall from an upper wall of the reversing device.

A cleaning apparatus 22 is disposed at a position adjacent to the cleaning apparatus 5 and is accessible by the hands of the transfer robot 20, and another cleaning apparatus 23 is disposed at a position adjacent to the cleaning apparatus 6 and is accessible by the hands of the transfer robot 21.

All the cleaning apparatuses 5, 6, 22 and 23, the wafer station 90, and the transfer robots 20 and 21 are placed in area B. Pressure in area B is adjusted so as to be lower than pressure in area A. Each of the cleaning apparatuses 22 and 23 is capable of cleaning both surfaces of a semiconductor wafer.

The polishing apparatus has a housing 100 for enclosing various components therein. An interior of the housing 100 is partitioned into a plurality of compartments or chambers (including areas A and B) by partitions 14, 15, 16, 24 and 25.

A polishing chamber separated from area B by the partition wall 24 is formed, and is further divided into two areas C and D by the partition wall 25. In each of areas C and D, there is provided a polishing unit, with each of the polishing units comprising two polishing tables, and a carousel having three top rings for holding semiconductor wafers and pressing the semiconductor wafers against the polishing tables. That is, polishing tables 34L and 35L are provided in area C, and polishing tables 34R and 35R are provided in area D. Further, carousel 36L is provided in area C and carousel 36R is provided in area D.

An abrasive liquid nozzle (not shown) for supplying an abrasive liquid to the polishing table 34L, and a dresser 38L for dressing the polishing table 34L, are disposed in area C. An abrasive liquid nozzle (not shown) for supplying an abrasive liquid to the polishing table 34R, and a dresser 38R for dressing the polishing table 34R, are disposed in area D. A dresser 39L for dressing the polishing table 35L is disposed in area C, and a dresser 39R for dressing the polishing table 35R is disposed in area D. As shown in FIG. 1, the polishing units disposed on left and right sides are disposed in line symmetry with respect to the partition wall 25. The polishing units have three respective top rings 32L and 32R, which hold semiconductor wafers to be polished.

As shown in FIG. 1, in area C separated from area B by the partition wall 24 and at a position that can be accessed by the hands of the transfer robot 20, there is provided a reversing device 28L for reversing a semiconductor wafer, and in area D and at a position that can be accessed by the hands of the transfer robot 21, there is provided a reversing device 28R for reversing a semiconductor wafer. The partition wall 24 between area B and areas C, D has two openings, each for allowing semiconductor wafers to pass therethrough. One of the openings is used for transferring a semiconductor wafer to or from the reversing device 28L, and the other of the opening is used for transferring a semiconductor wafer to or from the reversing device 28R. Shutters 26L and 26R are provided at the respective openings of the partition wall 24. The reversing devices 28L and 28R each have a chuck mechanism for chucking a semiconductor wafer, a reversing mechanism for reversing a semiconductor wafer, and a semiconductor wafer detecting sensor for detecting whether or not the chuck mechanism chucks a semiconductor wafer. The transfer robot 20 transfers a semiconductor wafer to the reversing device 28L, and the transfer robot 21 transfers a semiconductor wafer to the reversing device 28R.

A rotary transporter 27L is disposed in area C for transferring semiconductor wafers between the reversing device 28L and the three top rings 32L supported by the carousel 36L. The rotary transporter 27L has four stages for placing semiconductor wafers at angularly equal intervals, and can hold a plurality of semiconductor wafers thereon at the same time. A semiconductor wafer which has been transported to the reversing device 28L is transferred to the rotary transporter 27L by actuating a lifter 29L disposed below the rotary transporter 27L, when a center of a stage of the rotary transporter 27L is aligned with a center of the semiconductor wafer held by the reversing device 28L. The semiconductor wafer placed on the stage of the rotary transporter 27L is transported to a position above a pusher 30L by an indexing motion of the rotary transporter 27L. At this time, one of the top rings 32L is located at a position above the rotary transporter 27L (loading and unloading position) beforehand by a swing motion thereof. The semiconductor wafer is transferred from the rotary transporter 27L to this top ring 32L by actuating a pusher 30L disposed below the rotary transporter 27L, when a center of this top ring 32L is aligned with a center of the semiconductor wafer placed on the stage of the rotary transporter 27L.

By repeating the above operation, semiconductor wafers are sequentially loaded onto the three top rings 32L supported by the carousel 36L.

The semiconductor wafer transferred to the top ring 32L is held under vacuum by a vacuum attraction mechanism of the top ring 32L, and transported to the polishing table 34L. Thereafter, the semiconductor wafer is polished by a polishing surface comprising a polishing cloth or a grinding stone (or a fixed abrasive plate) attached on the polishing table 34L. The second polishing table 35L is disposed at a position that can be accessed by one of the top rings 32L when this top ring 32L is located at an accessible position relative to the second polishing table 35L. With this arrangement, a primary polishing of the semiconductor wafer can be conducted by the polishing table 34L, and then a secondary polishing of the semiconductor wafer can be conducted by the second polishing table 35L. In this case, a buffing polishing of the semiconductor wafer can be conducted by the second polishing table 35L.

A rotary transporter 27R is disposed in area D for transferring semiconductor wafers between the reversing device 28R and the three top rings 32R supported by the carousel 36R. The rotary transporter 27R has four stages for placing semiconductor wafers at angularly equal intervals, and can hold a plurality of semiconductor wafers thereon at the same time. A semiconductor wafer which has been transported to the reversing device 28R is transferred to the rotary transporter 27R by actuating a lifter 29R disposed below the rotary transporter 27R, when a center of a stage of the rotary transporter 27R is aligned with a center of the semiconductor wafer held by the reversing device 28R. The semiconductor wafer placed on the stage of the rotary transporter 27R is transported to a position above a pusher 30R by an indexing motion of the rotary transporter 27R. At this time, one of the top rings 32R is located at a position above the rotary transporter 27R (loading and unloading position) beforehand by a swing motion thereof. The semiconductor wafer is transferred from the rotary transporter 27R to this top ring 32R by actuating a pusher 30R disposed below the rotary transporter 27R, when a center of this top ring 32R is aligned with a center of the semiconductor wafer placed on the stage of the rotary transporter 27R.

By repeating the above operation, semiconductor wafers are sequentially loaded onto the three top rings 32R supported by the carousel 36R.

The semiconductor wafer transferred to the top ring 32R is held under vacuum by a vacuum attraction mechanism of the top ring 32R, and transported to the polishing table 34R. Thereafter, the semiconductor wafer is polished by a polishing surface comprising a polishing cloth or a grinding stone (or a fixed abrasive plate) attached on the polishing table 34R. The second polishing table 35R is disposed at a position that can be accessed by one of the top rings 32R when this top ring 32R is located at an accessible position relative to the second polishing table 35R. With this arrangement, a primary polishing of the semiconductor wafer can be conducted by the polishing table 34R, and then a secondary polishing of the semiconductor wafer can be conducted by the second polishing table 35R. In this case, a buffing polishing of the semiconductor wafer can be conducted by the second polishing table 35R.

In both of the polishing units, after a semiconductor wafer is polished by the first polishing table 34L or 34R and before the top ring 32L or 32R moves to the second polishing table 35L or 35R, a cleaning liquid is supplied from cleaning liquid nozzles (not shown), disposed adjacent to the polishing table 34L or 34R, to the lower and side surfaces of the semiconductor wafer held by the top ring 32L or 32R at a position where the top ring 32L or 32R is spaced from the polishing table 34L or 34R. Because the semiconductor wafer is rinsed before being moved to the second polishing table 35L or 35R, a transfer of contamination between the polishing tables is prevented to thus avoid cross contamination of the polishing tables.

After the semiconductor wafer is polished by the first polishing surface of the first polishing table 34L or 34R and the second polishing surface of the second polishing table 35L or 35R, the first and second polishing surfaces are dressed by the dressers 38L, 38R, 39L and 39R, respectively. The dressing process is a process for recovering the polishing surface of the polishing table which has been degraded by polishing of the semiconductor wafers. This process is also called conditioning or rectification.

In the polishing unit on the left side, the semiconductor wafer which has been polished is transferred from the top ring 32L to the pusher 30L, and then transferred from the pusher 30L to the rotary transporter 27L by lowering the pusher 30L. Thereafter, the semiconductor wafer is transported to a position below the reversing device 28L by an indexing motion of the rotary transporter 27L, and then returned to the reversing device 28L by raising the lifter 29L.

In the polishing unit on the right side, the semiconductor wafer which has been polished is transferred from the top ring 32R to the pusher 30R, and then transferred from the pusher 30R to the rotary transporter 27R by lowering the pusher 30R. Thereafter, the semiconductor wafer is transported to a position below the reversing device 28R by an indexing motion of the rotary transporter 27R, and then returned to the reversing device 28R by raising the lifter 29R.

The semiconductor wafer returned to the reversing device 28L or 28R by the above operation is rinsed by pure water or chemicals supplied from rinsing nozzles. Further, a semiconductor wafer holding surface of the top ring 32L or 32R from which the semiconductor wafer has been removed is also cleaned by pure water or chemicals supplied from top ring cleaning nozzles, and in some cases, the semiconductor wafer holding surface of the top ring 32L or 32R is rinsed for preventing the semiconductor wafer holding surface from being dried. Pusher cleaning nozzles are provided on the partition wall to clean each of the pushers. Further, in order to improve yield of semiconductor wafers or cleaning effect of the semiconductor wafers, the semiconductor wafer may be rinsed with chemicals in such a state that the semiconductor wafer is held by the top ring under vacuum. Furthermore, the semiconductor wafer may be rinsed with chemicals in such a state that the semiconductor wafer is held by the rotary transporter 27L or 27R above the pusher. The lifter may be cleaned by nozzles described below.

Figure 2:
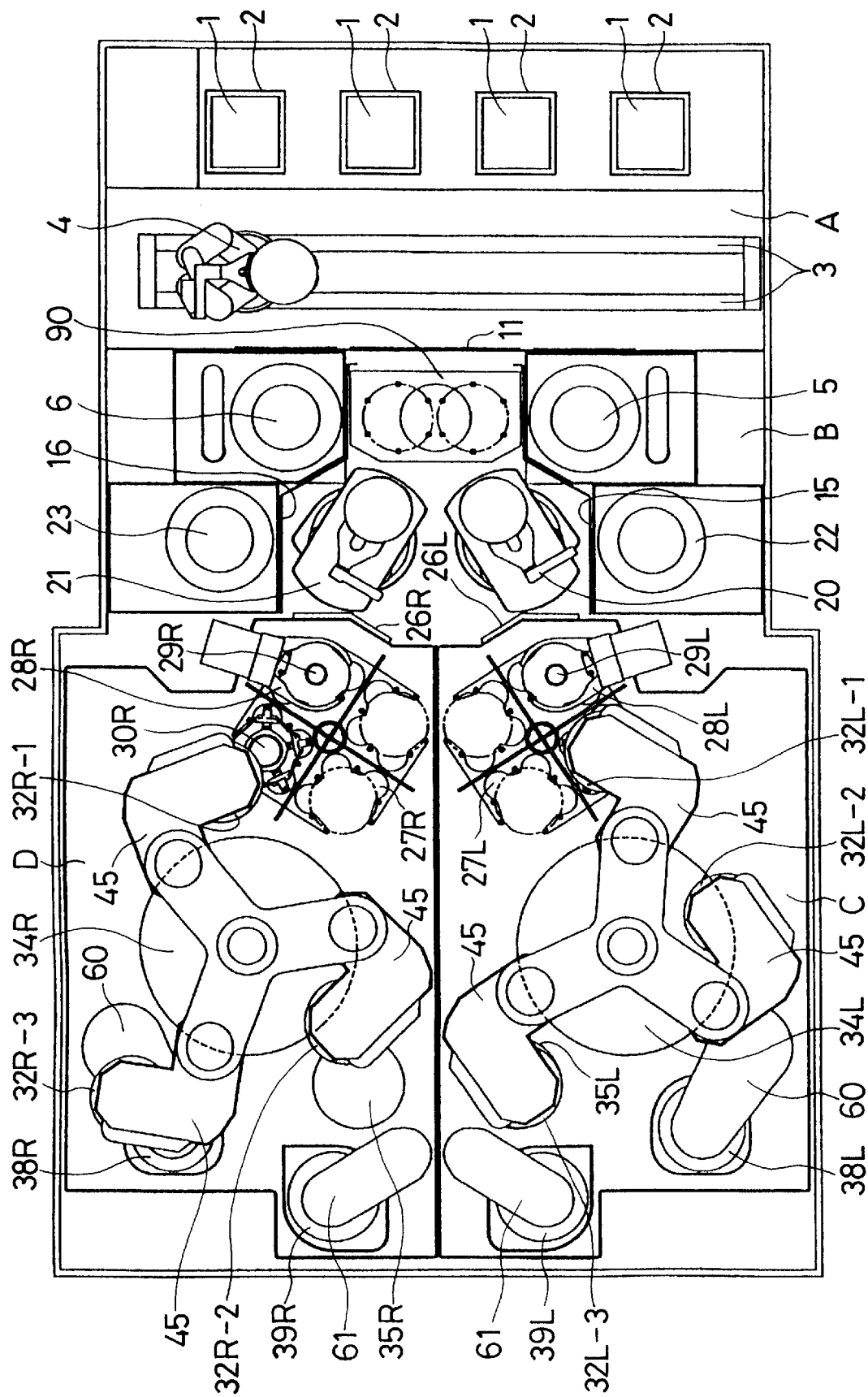
FIG. 2 is a plan view showing polishing units on the left and right sides in which three top rings perform different operations.

FIG. 2 shows the polishing units on the left and right sides in which the three top rings 32L, 32R perform different operations. Specifically, in the polishing unit on the left side, top ring 32L-1 is located in a loading and unloading position, top ring 32L-2 is located in an overhanging position with respect to the polishing table 34L, and top ring 32L-3 is located on the second polishing table 35L. In the polishing unit on the right side, top ring 32R-1 accesses a loading and unloading position, top ring 32R-2 accesses the polishing table 35R, and top ring 32R-3 is located away from the polishing table 34R. Other components or devices are in the same condition as those in FIG. 1.

Further, the dressers 38L and 38R are supported by respective dresser heads 60. The dresser heads 60 are supported by respective swing shafts which are capable of positionally being fixed, and the dressers 38L and 38R are movable between respective standby positions and respective dressing positions on the respective polishing tables 34L and 34R. Similarly, the dressers 39L and 39R are supported by respective dresser heads 61. The dresser heads 61 are supported by respective swing shafts which are capable of being positionally fixed, and the dressers 39L and 39R are movable between respective standby positions and respective dressing positions on the respective polishing tables 35L and 35R.

Figure 3:
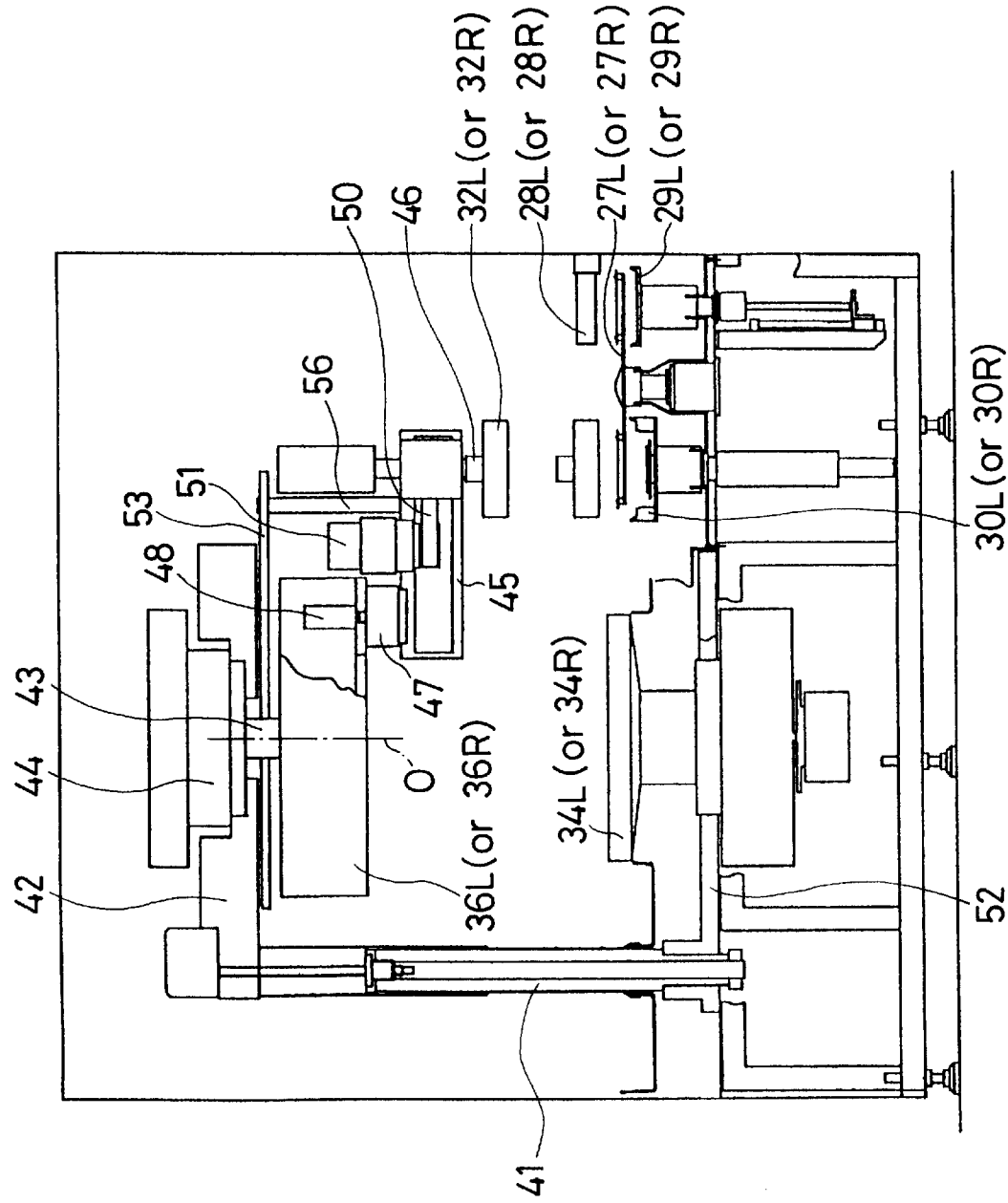
FIG. 3 is vertical cross-sectional view showing a relationship between multi-head type top rings supported by a carousel, and a polishing table.
Figure 4:
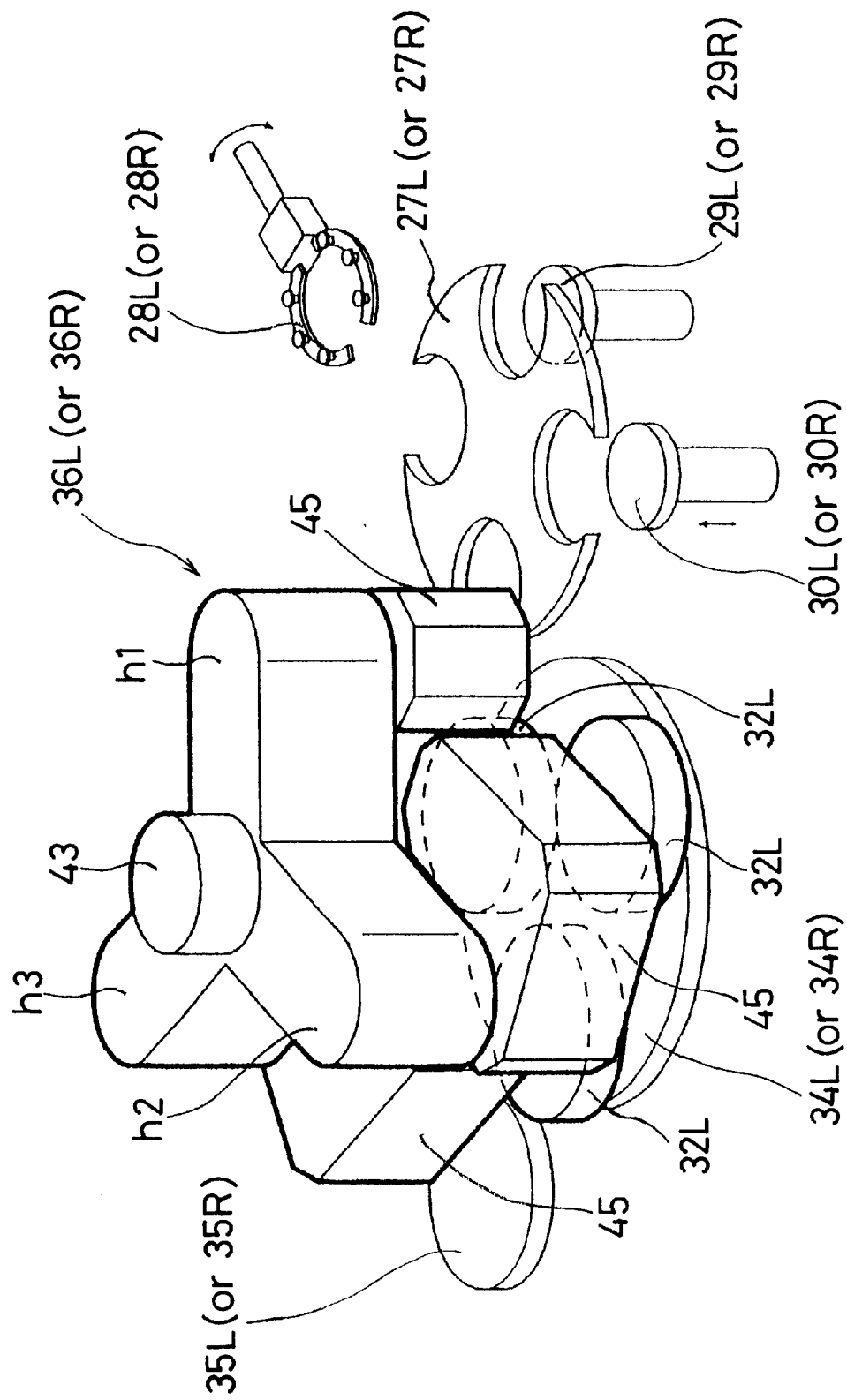
FIG. 4 is a perspective view showing a relationship between the carousel, the top ring swing arms and the top rings by removing a support member and posts.
Figure 5:
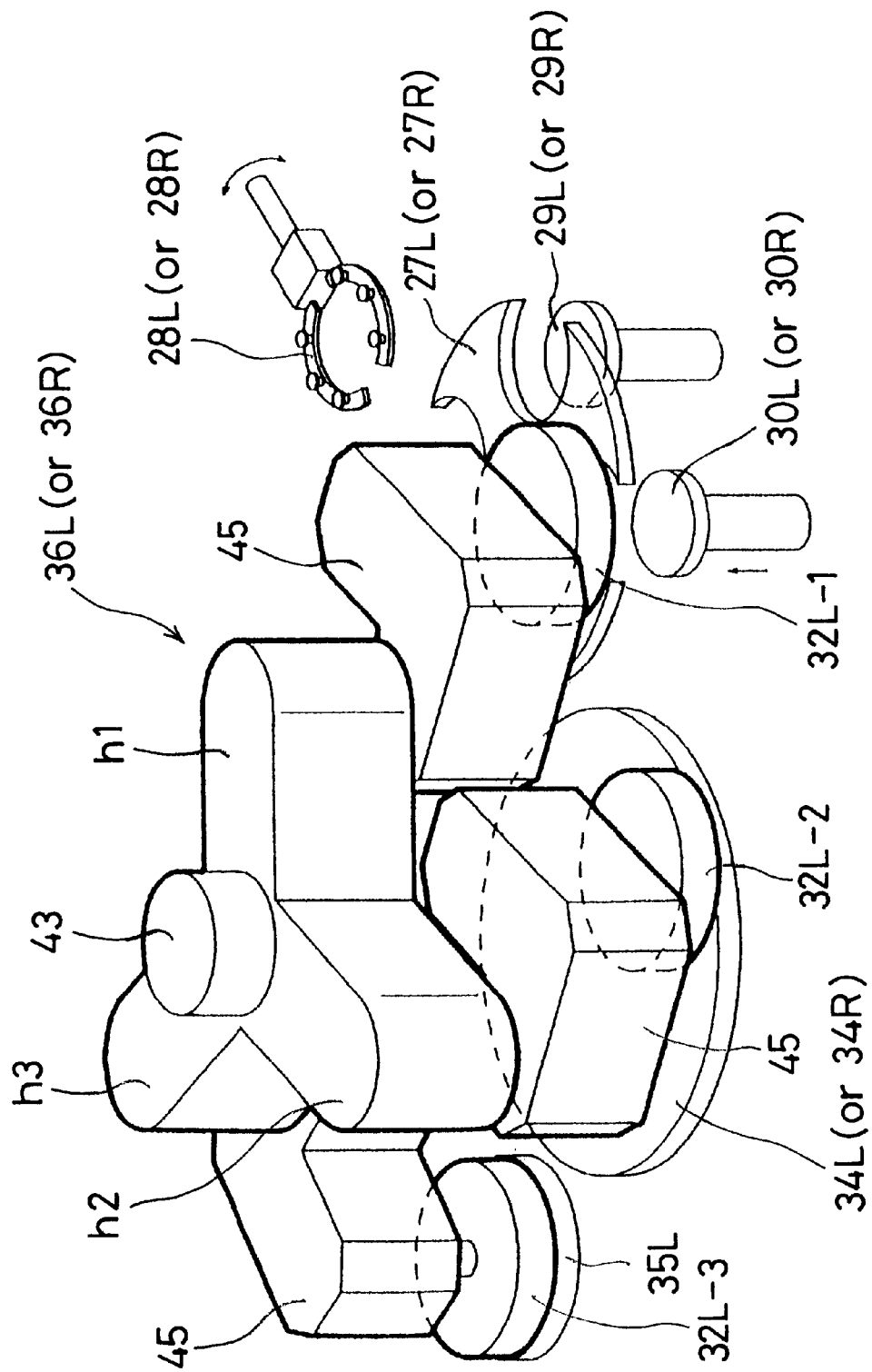
FIG. 5 is a perspective view showing a relationship between the carousel, the top ring swing arms and the multi-head type top rings by removing the support member and the posts.

FIGS. 3 through 5 show a relationship between multi-head type top rings 32L (or 32R), supported by the carousel 36L (or 36R), and the polishing table 34L (or 34R). FIG. 3 is a schematic side view and FIGS. 4 and 5 are schematic perspective views. The carousels 36L and 36R, the top rings 32L and 32R, and the polishing tables 34L and 34R on the left and right sides have the same structure, and hence only the carousel 36L, the top rings 32L and the polishing table 34L on the left side will be described.

As shown in FIG. 3, the carousel 36L is supported by a support member 42 which is supported by a plurality of posts 41 (in FIG. 3, only one post is shown). The carousel 36L is supported from the support member 42 by a main shaft 43 which is rotatable. The main shaft 43 is coupled to a motor 44 fixed to the support member 42. Therefore, the carousel 36L is rotatable about a vertical axis O by rotating the main shaft 43. The carousel 36L supports three top ring swing arms 45 (in FIG. 3, only one swing arm is shown). Each of the top ring swing arms 45 has an L shaped structure. Each of the top ring swing arms 45 is coupled to a motor 48 through a decelerator 47. By energizing the motor 48, the top ring swing arm 45 is swung with respect to the carousel 36L. The top ring swing arm 45 supports the top ring 32L at its forward end. The top ring 32L is coupled to an air cylinder (not shown) through a top ring shaft 46, and the top ring shaft 46 is coupled to a motor 51 through a timing belt 50. Therefore, the top ring 32L is vertically movable by the air cylinder (not shown), and rotatable about its own axis by the motor 51.

FIGS. 4 and 5 show a relationship between the carousel 36L, the top ring swing arms 45 and the top rings 32L by removing the support member 42 and the posts 41. As shown in FIGS. 4 and 5, the carousel 36L comprises three heads h1, h2 and h3 which extend radially outwardly from the main shaft 43 at angularly equal intervals of 120°. Further, the top ring swing arm 45 supported by each of the heads h1, h2 and h3 of the carousel 36L has an L shaped structure, and a base portion of the swing arm 45 is supported by the carousel 36L while a forward end of the swing arm 45 supports the top ring 32L.

On the right side in FIGS. 3 through 5, the rotary transporter 27L or 27R, the reversing device 28L or 28R, the lifter 29L or 29R, and the pusher 30L or 30R are shown. As shown in FIGS. 3 through 5, the reversing device 28L or 28R is located above the rotary transporter 27L or 27R, the lifter 29L or 29R is located below the rotary transporter 27L or 27R, and the pusher 30L or 30R is located below the rotary transporter 27L or 27R.

In FIG. 3, one of the top rings 32L is located above the rotary transporter 27L. In FIG. 4, the three top rings 32L are located on the polishing table 34L to polish three semiconductor wafers, simultaneously. At this time, the top ring swing arms 45 are swung radially inwardly so that the top ring swing arms 45 are located inside the carousel 36L. In FIG. 5, the top ring 32L-1 is located above a loading and unloading position where the top ring 32L-1 is located above the rotary transporter 27L, the top ring 32L-2 is in an overhanging position with respect to the polishing table 34L, and the top ring 32L-3 is located on the second polishing table 35L to perform a buffing polishing of the semiconductor wafer which has been polished on the polishing table 34L. In FIG. 5, the top ring swing arms 45 are swung so that the top ring swing arms 45 are radially outwardly opened from the carousel 36L. In FIG. 5, the top rings 32L are shown by adding reference numerals to distinguish the respective top rings.

Next, a function of the support member, the carousel and each top ring swing arm will be further described.

The support member 42 is securely supported by the three posts 41 vertically extending from a table base 52. A jack comprising a gear box composed of a worm gear, a servo motor and a ball screw is provided at each of the three posts 41. The three jacks are synchronously controlled, and simultaneously operated to raise the carousel 36L at a time of maintenance, such as replacement of a polishing cloth attached to the polishing table 34L (or 34R).

During normal operation, the support member 42 is supported by the three posts 41 vertically extending from the table base 52, and the support member 42 is stationary in such a state that a coupling projection provided on a top end of each post and a corresponding coupling recess provided on a bottom of the support member engage with each other. Further, in order to ensure coupling of the coupling projections and the coupling recesses, the motors of the, jacks are energized to generate torque which is then applied to the coupling, thus creating such a state like bolt tighting.

Further, in order to supply pressurized fluid, electric power and signals to the carousel 36L (or 36R), pipes and wires are spirally arranged on the support member 42 so that rotation of the carousel 36L (or 36R) does not cause breaking of wires or twisting of the pipes.

The carousel 36L (or 36R) is supported by the motor 44 which has a firm bearing therein and is fixed to the support member 42. The carousel 36L is controlled so as to be rotatable only when the top ring swing arms 45 are located at a polishing position. When the carousel 36L (or 36R) is not rotated, the carousel 36L (or 36R) is held, so as not to be rotated, by an air brake housed therein. The air brake is released only when the carousel 36L (or 36R) is rotated. The carousel 36L is rotatable in clockwise and counterclockwise directions, and rotation of the carousel 36L is limited to an angle of 240°. That is, the carousel 36L does not continue to be rotated in the same direction. The motor 44 for rotating the carousel 36L is thin, and large in diameter as is the motor for rotating the polishing table, and is rotatable at a low speed. The main shaft 43 for supporting the carousel 36L is a hollow shaft for allowing pressurized fluid, electric power and control signals to be supplied to the carousel 36L and the top ring swing arms 45.

Each of the top ring swing arms 45 is supported by the carousel 36L (or 36R) through a firm bearing, and is capable of swinging in a horizontal plane. Each top ring swing arm 45 is capable of swinging, rotating and moving, in combination with a rotating angle of the carousel, for thereby being located at the following positions: a polishing position on the polishing table 34L (or 34R); an overhanging position in which a polished semiconductor wafer projects from an outer periphery of the polishing table in order to allow the polished semiconductor wafer to be easily removed from the polishing surface; a buffing position in which a semiconductor wafer held by the top ring 32L (or 32R) is pressed against the polishing table 35L (or 35R); a loading and unloading position in which a semiconductor wafer is mounted on the top ring 32L (or 32R) or a semiconductor wafer is removed from the top ring 32L (or 32R); and a maintenance position in which the top ring 32L (or 32R) is detached from the top ring shaft (splined shaft) 46. Swinging, rotating and moving of each top ring swing arm 45 is controlled by a respective servomotor 48 attached to the carousel 36L (or 36R) through a firm bearing. A sensor and a mechanical stopper are provided at a swing end of the swinging and rotating of each top ring swing arm 45.

Further, when one of the top ring swing arms 45 is located at the polishing position on the polishing table 34L (or 34R), a part of this top ring swing arm 45 is located inside the carousel 36L (or 36R), and further another part of this top ring swing arm 45 is brought into contact with a plate attached to a bottom surface of the carousel so that the top ring swing arm 45 is prevented from moving upwardly. Further, an upper surface of this top ring swing arm 45 is pressed against the plate by an air cylinder attached to a bottom surface of the carousel. With this arrangement, the top ring swing arm 45 is prevented from being elastically deformed upwardly, for thereby stably keeping its posture.

From a fool proof standpoint, a guide plate 53 for guiding the top ring swing arms is provided on a bottom surface of the support member 42 so that the top ring swing arms 45 are not erroneously operated at positions other than the positions where the top ring swing arms 45 are allowed to be operated. Further, a guide pole 56 is fixed to an upper surface of each of the top ring swing arms 45, and is fitted into a groove formed in the guide plate 53 (described later). Thus, the guide pole 56 is configured such that the guide pole 56 is not movable along a route other than the route which is predetermined on the guide plate 53.

Next, the guide plate 53 will be described in detail. FIG. 6 is a plan view of the guide plate 53. As shown in FIG. 6, six arcuate grooves 54a to 54f are formed in the guide plate 53. The groove 54a is a groove for limiting the loading and unloading position, the groove 54b is a groove for limiting the maintenance position, the groove 54c is a groove for limiting a standby position, the groove 54d is a groove for limiting a top ring replacement position, the groove 54e is a groove for limiting the buffing position, and the groove 54f is a groove for limiting the maintenance position. The guide poles 56 vertically provided on the respective top ring swing arms 45 are fitted in these grooves 54a to 54f, and hence movements of the respective top ring swing arms 45 are limited. Further, sensors are provided at essential positions of the routes defined by the guide plate 53, and hence if the respective top ring swing arms 45 tend to be moved beyond the predetermined routes, interlocking is worked by a control circuit.

With the above structure, a batch processing of three semiconductor wafers will be described. In this case, operation of the polishing unit on the left side will be described.

A semiconductor wafer transferred to the reversing device 28L by the transfer robot 20 is transferred to the rotary transporter 27L by actuating the lifter 29L, disposed below the rotary transporter 27L, when the center of the stage of the rotary transporter 27L is aligned with the center of the semiconductor wafer held by the reversing device 28L. The semiconductor wafer placed on the stage of the rotary transporter 27L is transported to a position below one of the top rings 32L by an indexing motion of the rotary transporter 27L. At this time, this top ring 32L is located at the loading and unloading position of the rotary transporter 27L by a swing motion of a corresponding one of the top ring swing arms 45. The semiconductor wafer is transferred from the rotary transporter 27L to the top ring 32L by actuating the pusher 30L, disposed below the rotary transporter 27L, when the center of the top ring 32L is aligned with the center of the semiconductor wafer placed on the stage of the rotary transporter 27L.

By repeating the above operation, a semiconductor wafer is loaded onto each of the three top rings 32L supported by the carousel 36L.

After the semiconductor wafers are loaded on all of the top rings 32L, the three semiconductor wafers are simultaneously polished by pressing the semiconductor wafers against the polishing table 34L. In this case, the semiconductor wafers are pressed against a polishing cloth or a grinding stone, attached to rotating polishing table 34L by the air cylinder (not shown). At this time, abrasive liquid is supplied from the abrasive liquid nozzle, and the semiconductor wafers are polished in the presence of the abrasive liquid between the lower surfaces of the semiconductor wafers and a polishing surface of the polishing cloth or grinding stone. During this polishing, all of the semiconductor wafers are monitored by an optical sensor (described later) to detect a polished condition of the semiconductor wafers.

After a predetermined time of polishing, each top ring 32L holds its respective semiconductor wafer under vacuum. Thereafter, the semiconductor wafers held by the top rings 32L are moved toward an outer periphery of the polishing table 34L by a swing motion of the top ring swing arms 45 while the semiconductor wafers contact the polishing surface on the polishing table. Finally, the semiconductor wafers project from the outer periphery of the polishing table 34L in such a manner that a center of each of the semiconductor wafers is located on the polishing table 34L and near the periphery of the polishing table 34L as much as possible, and about 40% of a surface of each of the semiconductor wafers project from the polishing table 34L. Thereafter, the air cylinder (not shown) is actuated, and the top rings 32L holding the semiconductor wafers are raised. Depending on the polishing surface used, surface tension between slurry on the polishing surface and the semiconductor wafers may be stronger than an attractive force of the top rings, tending to leave the semiconductor wafers on the polishing surface. In order to reduce surface tension, the semiconductor wafers are allowed to project from the polishing table and then the top rings 32L are raised. If more than 40% of the surface area of the semiconductor wafers project from the polishing table, then the top rings would be tilted, causing the semiconductor wafers to hit an edge of the polishing table and hence crack. It is therefore preferable for each of the semiconductor wafers to project about 40% of its surface area from the polishing table. In other words, it is essential that the center of each of the semiconductor wafers is located on the polishing table 34L.

When lifting of the top rings 32L is completed, each sensor detects completion of the lifting action of the air cylinder (not shown). Thereafter, the top rings 32L start to be swung, and one is moved to a position above the pusher 30L and transfers the semiconductor wafer held thereby to the pusher 30L. After this semiconductor wafer is removed from its top ring 32L, a cleaning liquid is supplied to a lower surface of this top ring 32L from a nozzle or nozzles located below the top ring 32L, and a wafer holding surface of the top ring 32L and surrounding regions are cleaned. Supply of the cleaning liquid may continue to prevent the top ring from drying until a subsequent semiconductor wafer is transferred to this top ring 32L. The cleaning liquid may be intermittently supplied to the top ring in view of a running cost. During polishing, a polishing time may be divided into a plurality of steps, and a pressing force of the top ring, rotational speed of the top rings and a holding method of the semiconductor wafers may be changed for each of the steps. Further, the kind, amount, concentration, temperature, supply timing, and like of the abrasive liquid used may be varied. The above procedure is performed for each of the top rings 32L.

Next, the rotary transporter and associated devices thereof will be described with reference to FIGS. 7A through 12E.

Figure 7A:
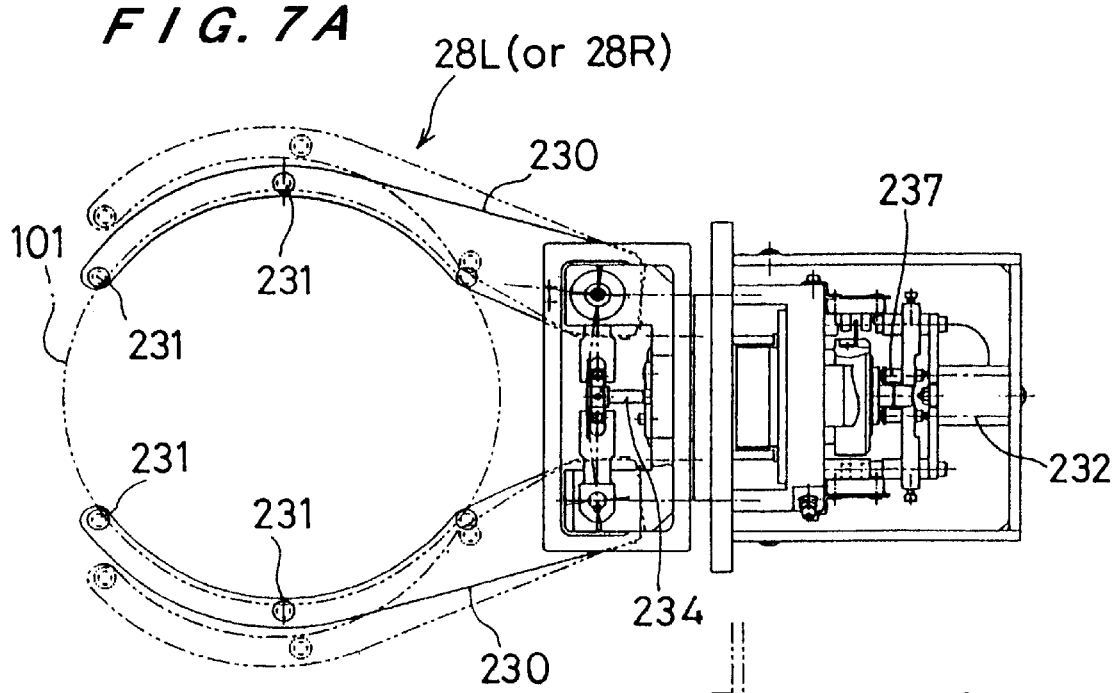
FIG. 7A is a plan view of a reversing device.
Figure 7B:
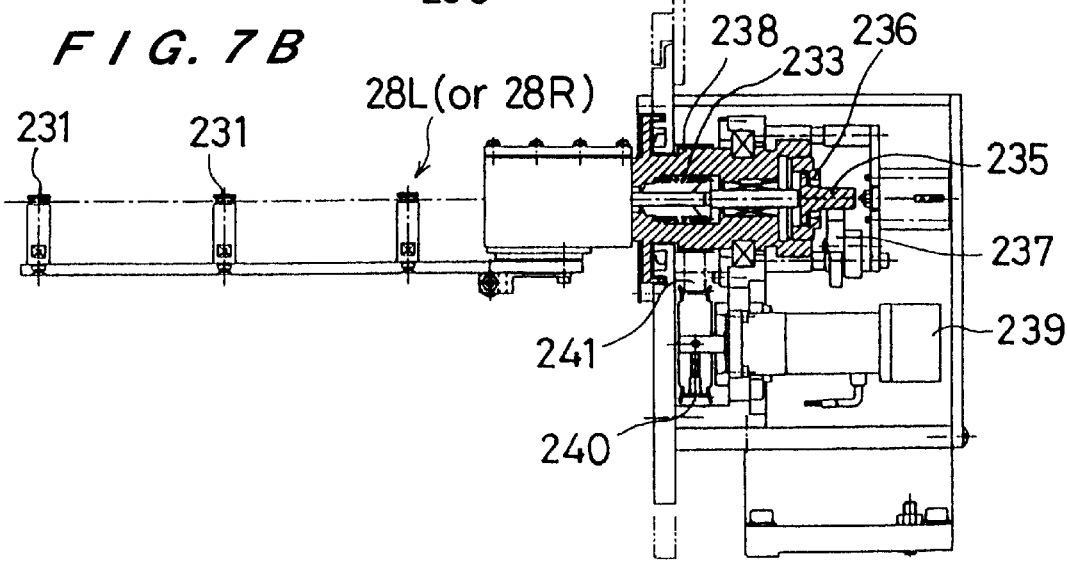
FIG. 7B is a side elevational view, partly in cross section, of the reversing device.

FIGS. 7A and 7B show the reversing device, wherein FIG. 7A is a plan view of a reversing device and FIG. 7B is a side elevational view, partly in cross section, of the reversing device. Since the reversing devices 28L and 28R are of an identical structure, only the reversing device 28L will be described below. As shown in FIGS. 7A and 7B, the reversing device 28L has a pair of arcuate arms 230 supporting a plurality of (e.g., six) pins 231 fixed thereto which have grooves for clamping a semiconductor wafer therein. The arms 230 can be opened and closed in response to movement of a shaft 234 that can be pushed and pulled by an air cylinder 232 and a compression spring 233. When the air cylinder 232 is extended, the arms 230 are opened thereby. When the air cylinder 232 is contracted, the arms 230 are closed under the force of the compression spring 233. The shaft 234 and a tip end of the air cylinder 232 are spaced from each other by a distance, and the shaft 234 is pulled back until a stopper 235 contacts an end block 236 under bias of the compression spring 233.

The end block 236 is adjusted such that when a semiconductor wafer 101 is chucked, a clearance of 1 mm is created between the stopper 235 and the end block 236. The stopper 235 has a slit defined therein, and a transmission type light sensor 237 is positioned to detect light that has passed through the slit when the semiconductor wafer 101 is clamped by the arms 230. Therefore, when the semiconductor wafer 101 is not clamped or cannot be clamped properly, the transmission type light sensor 237 does not detect light. Therefore, the transmission type light sensor 237 is capable of recognizing whether or not the semiconductor wafer 101 is present in the reversing device 28L.

A slide mechanism for the shaft 234 and a pulley 238 are connected to each other, and the pulley 238 is coupled to a pulley 240 fixed to a shaft end of a stepping motor 239 through a belt 241. When the stepping motor 239 is energized, the arms 230 are rotated about a horizontal axis.

As shown in FIG. 1, the shutters 26L and 26R are disposed between the reversing devices 28L and 28R and the transfer robots 20 and 21 for separating the polishing chambers, with the reversing devices disposed therein, from the cleaning chamber, with the transfer robots disposed therein. For transferring semiconductor wafers, the shutters 26L and 26R are opened, and the hands of the transfer robots 20 and 21 move in and out of the openings. When the hands of the transfer robots 20 and 21 do not move in and out of the openings, the shutters 26L and 26R are closed, providing a water-proof mechanism for allowing the semiconductor wafers and chuck fingers fixed to the hands to be cleaned.

Next, operation of the reversing device will be described with reference to FIGS. 7A and 7B.

The transfer robot 20 and the lifter 29L can access the reversing device 28L and transfer a semiconductor wafer to the reversing device 28L. The transfer robot 21 and the lifter 29R can access the reversing device 28R and transfer a semiconductor wafer to the reversing device 28R.

The reversing device 28L waits for a semiconductor wafer which is conveyed by the transfer robot 20 or the lifter 29L.in such a state that the arms 230 are opened. The arms 230 are closed when the semiconductor wafer conveyed by the lower hand of the transfer robot 20 or the lifter 29L is positioned at the same vertical height as wafer holding grooves of pins 231 fixed to the arms 230 and a center of the semiconductor wafer is substantially positioned at a center of the pin arrangement on the arms 230, and after a signal indicative of completion of movement from the transfer robot 20 or the lifter 29L is generated. After the presence of the semiconductor wafer 101 is confirmed by a sensor 237, the hand of the transfer robot 20 is lowered to a certain height and is then retracted. Alternatively, after the presence of the semiconductor wafer 101 is confirmed by the sensor 237, the lifter 29L is lowered. In this manner, the semiconductor wafer 101 is transferred from the transfer robot 20 or the lifter 29L to the reversing device 28L. The semiconductor wafer 101 transferred to the reversing device 28L is reversed by actuating the arms 230 with the stepping motor 239. A reversed semiconductor wafer 101 is kept in the same condition until the transfer robot 20 or the lifter 29L accesses the reversing device 28L to receive the semiconductor wafer therefrom.

A reversing operation of the semiconductor wafer is carried out before and after polishing of the semiconductor wafer. In case of reversing the semiconductor wafer 101 which has been polished, in order to prevent abrasive liquid or ground-off particles attached to the semiconductor wafer 101 during polishing from being dried on the semiconductor wafer 101, the semiconductor wafer 101 is rinsed by a cleaning liquid during or after reversing of the semiconductor wafer. The cleaning liquid used to rinse the semiconductor wafer 101 comprises pure water or a chemical liquid, and is applied from spray nozzles at a required rate under a required pressure at an optimum angle for a desired period of time. The rinsing process enables a subsequent cleaning process to be conducted for a sufficient cleaning performance. While the semiconductor wafer 101 is waiting on the reversing device 28L, the cleaning liquid continues to be supplied to the semiconductor wafer 101. However, in view of a running cost, the cleaning liquid may be supplied intermittently to reduce its amount used.

While the reversing device 28L is not clamping the semiconductor wafer 101, the grooves for clamping the semiconductor wafer 101 and surrounding areas thereof may be cleaned by the cleaning liquid to prevent the semiconductor wafer 101 from being contaminated by members that will contact the semiconductor wafer 101.

Figure 8:
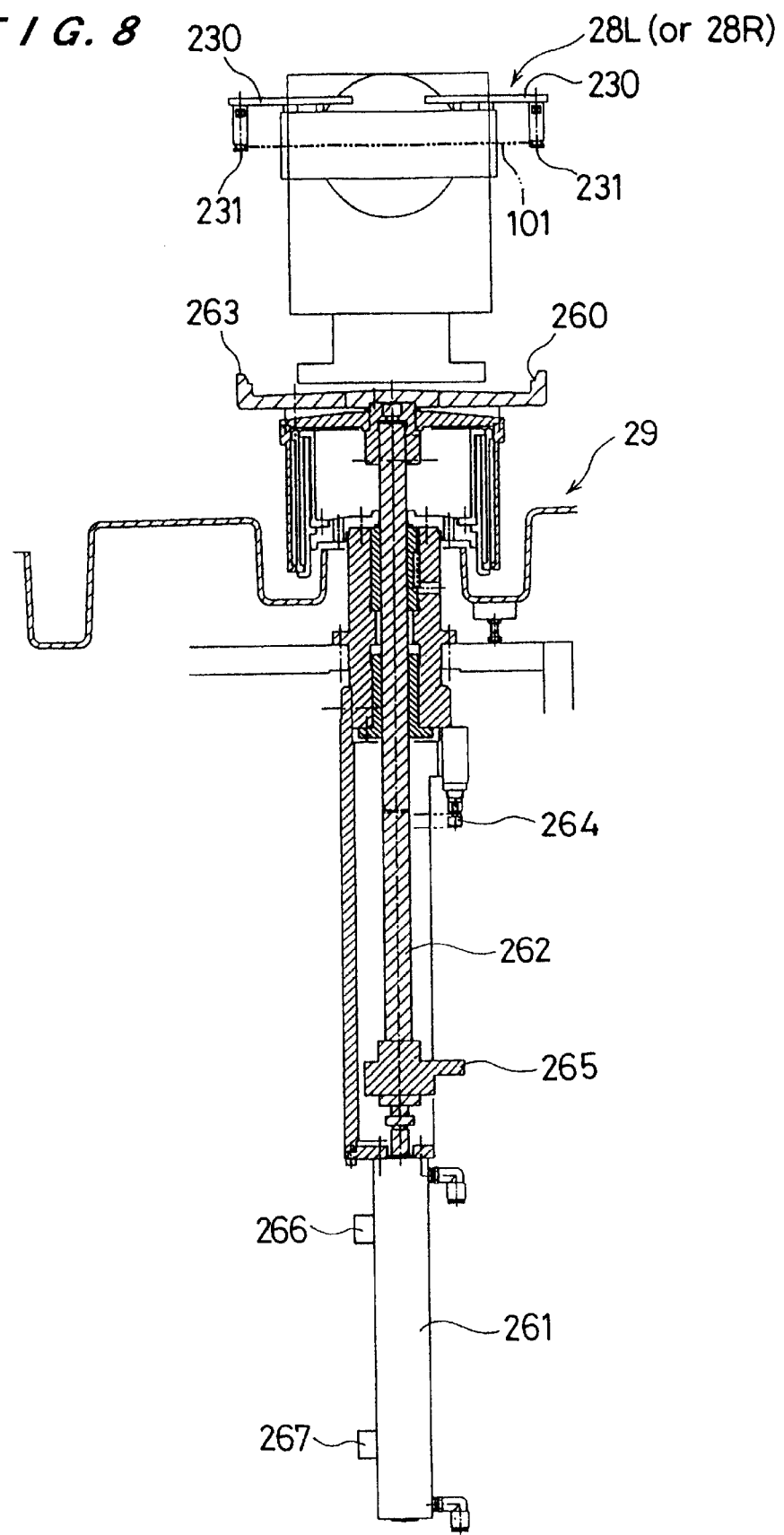
FIG. 8 is a vertical cross-sectional view of a lifter.

FIG. 8 is a vertical cross-sectional view of the lifter. The lifter 29L and 29R have the same structure, and hence only the lifter 29L will be described. The lifter 29L comprises a stage 260 for placing a semiconductor wafer thereon, and an air cylinder 261 for lifting and lowering the stage 260. The air cylinder 261 and the stage 260 are coupled by a shaft 262 which is vertically movable. The stage 260 has three support portions 263 disposed at angularly equal intervals in a circumferential direction and extending radially outwardly. The three support portions 263 are arranged in the angularly equal intervals so that a semiconductor wafer having a flat orientation can be held and are reliably transported. The three support portions 263 are disposed at positions where they are not aligned with the pins 231 for chucking the semiconductor wafer in the reversing device 28L. That is, a first peripheral edge of the semiconductor wafer held by the pins 231 does not correspond to a second peripheral edge of the semiconductor wafer held by the support portions 263 of the lifter 29L. The wafer support portions 263 of the lifter 29L which perform transfer of the semiconductor wafer to the reversing device 28L or the rotary transporter 27L have respective support surfaces for supporting the semiconductor wafer thereon, and respective tapered surfaces extending radially outwardly and upwardly from the support surfaces for centering the semiconductor wafer when the semiconductor wafer is placed on the support surfaces.

The wafer support surfaces of the stage 260 is raised by actuation of the air cylinder 261 to a position where the semiconductor wafer is held by the reversing device 28L. A stopper 264 having a shock absorbing function is provided to stop raising of the stage 260. When a stopper base 265 fixed to the shaft 262 contacts the stopper 264, further actuation of the air cylinder 261 is stopped, and the lifting of the stage 260 fixed to the shaft 262 is simultaneously stopped. By adjusting location of the stopper 264, a lifting height of the stage 260 can be adjusted to a transfer position of the semiconductor wafer between the lifter 29L and the reversing device 28L. Sensors 266 and 267 are provided on the air cylinder 261 to detect completion of lifting and lowering of the air cylinder 261, respectively.

Next, operation of the lifter having the above structure will be described. The lifter 29L constitutes a wafer transfer mechanism for transferring a semiconductor wafer between the reversing device 28L and the rotary transporter 27L. A semiconductor wafer to be polished is transferred from the transfer robot 20 to the reversing device 28L. Thereafter, the semiconductor wafer is reversed by the reversing device 28L to cause a pattern surface (the surface on which a semiconductor device is formed) of the semiconductor wafer to face downwardly. The stage 260 of the lifter 29L is raised toward the semiconductor wafer held by the reversing device 28L, and is stopped immediately below the semiconductor wafer. When the sensor 266 provided on the air cylinder 261 detects stoppage of the lifter 29L at a position where the stage 260 is located immediately below the semiconductor wafer, the reversing device 28L releases the semiconductor wafer by opening the arms 230 and the semiconductor wafer is placed on the stage 260 of the lifter 29L. Thereafter, the lifter 29L is lowered while holding the semiconductor wafer thereon. While the semiconductor wafer is lowered by the lifter 29L, the semiconductor wafer is transferred to the rotary transporter 27L. At this time, the semiconductor wafer is placed on pins of the rotary transporter 27L. After the semiconductor wafer is transferred to the rotary transporter 27L, the lifter 29L continues to be operated to lower the stage 260, and then is stopped when the stage 260 is lowered by a stroke of the air cylinder 261.

A semiconductor wafer which has been polished is transferred from the rotary transporter 27L to the reversing device 28L by the lifter 29L. That is, the semiconductor wafer which has been polished is transported by the rotary transporter 27L to the position above the lifter 29L. At this time, the stage 260 of the lifter 29L is located immediately below the rotary transporter 27L. After it is confirmed that the semiconductor wafer placed on the rotary transporter 27L is located at the position immediately above the stage 260 of the lifter 29L and movement of the semiconductor wafer is stopped, the stage 260 of the lifter 29L starts to be raised. The stage 260 of the lifter 29L receives the semiconductor wafer from the rotary transporter 27 while the stage 260 is lifted. Thereafter, the stage 260 of the lifter 29L continues to be lifted. At this time, the reversing device 28L waits for the semiconductor wafer in such a state that the arms 230 are opened to be ready for clamping the semiconductor wafer. The lifting of the semiconductor wafer is stopped at a position where the semiconductor wafer is horizontally aligned with the wafer holding grooves of the pins 231 on the arms 230. Completion of lifting of the stage 260 in the lifter 29L is detected by the sensor 266 provided on the air cylinder 261, and a detection signal by the sensor 266 is sent to a controller of the polishing apparatus to allow the controller to recognize the completion of lifting of the stage 260. When the controller of the polishing apparatus receives the detection signal, the reversing device 28L is operated to close the arms 230. By this operation, the semiconductor wafer is held by the reversing device 28L. After it is confirmed that the semiconductor wafer is held by the reversing device 28L, the stage 260 of the lifter 29L is lowered.

Figure 9:
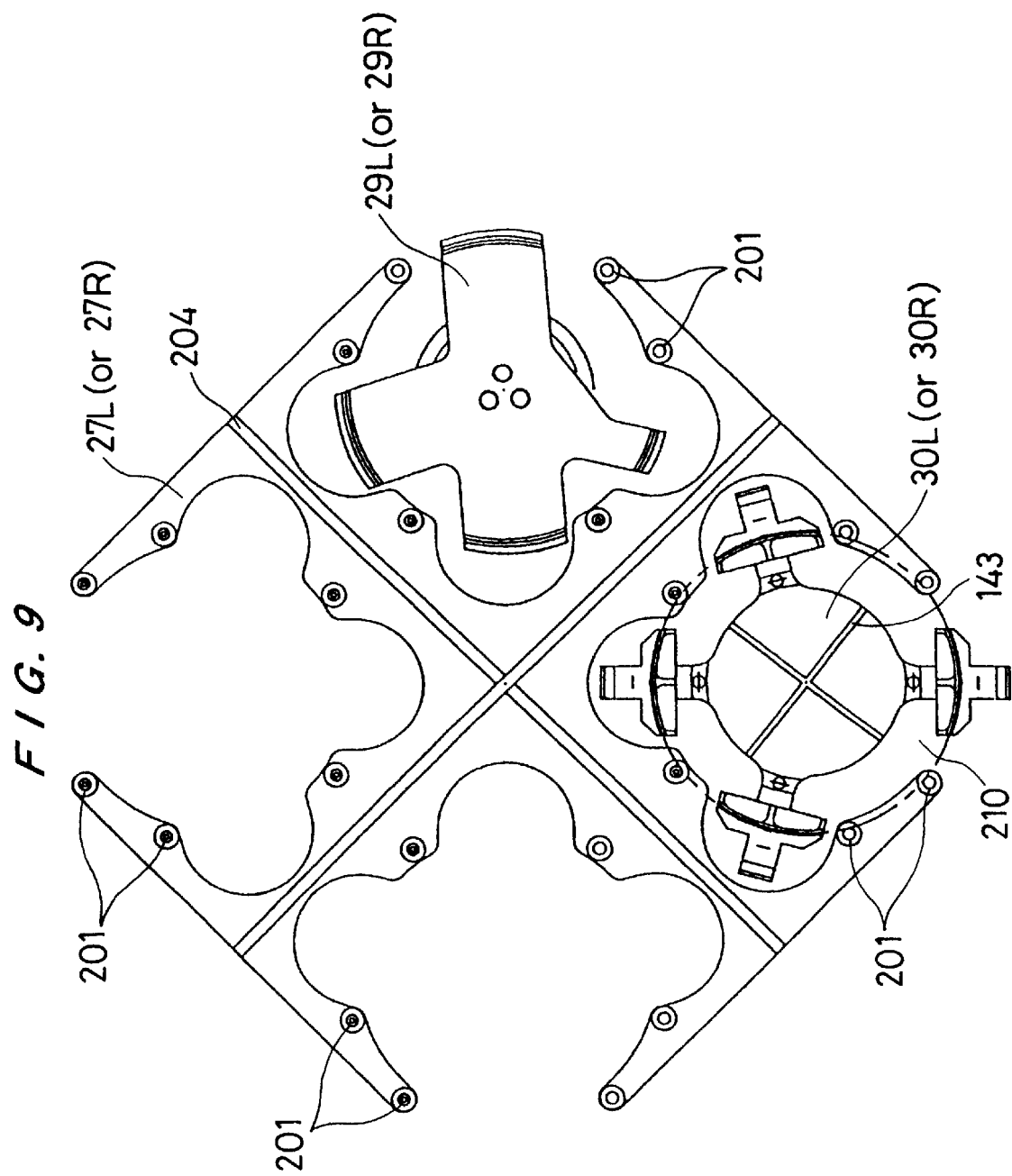
FIG. 9 is a plan view of a rotary transporter.
Figure 10:
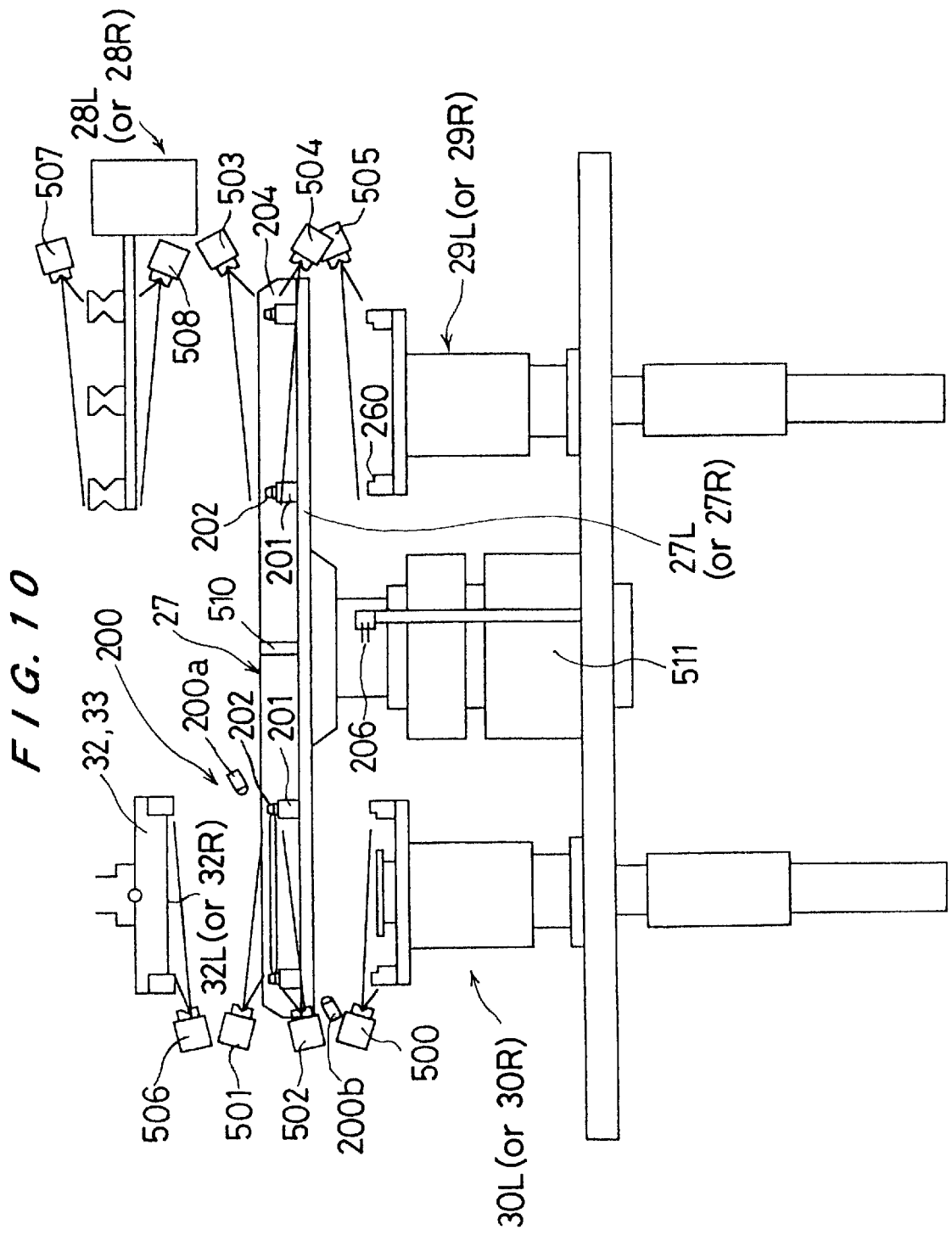
FIG. 10 is a vertical cross-sectional view of the rotary transporter.

FIGS. 9 and 10 show the rotary transporter, wherein FIG. 9 is a plan view of the rotary transporter and FIG. 10 is a vertical cross-sectional view of the rotary transporter. The rotary transporters 27L and 27R have the same structure, and hence only the rotary transporter 27L will be described. As shown in FIGS. 9 and 10, the rotary transporter 27L for transporting the semiconductor wafer 101 has four wafer support stages 210 at angularly equal intervals of 90°, and each of the four wafer support stages 210 has six pins 201 extending from the stage for supporting a semiconductor wafer at six points. The semiconductor wafer can be supported by at least three pins, but in this embodiment, six pins 201 are provided for supporting both a semiconductor wafer having a flat orientation and a semiconductor wafer having a notch. A tapered surface 202 having a taper angle of 15° to 25° from the vertical is formed at a forward end portion of the pin 201 to allow a semiconductor wafer to be centered when the semiconductor wafer is transferred.

Wafer detecting sensors 200 are provided at positions spaced from the rotary transporter 27L. Each sensor 200 is a photosensor comprising a light-emitting element 200a and a light-receiving element 200b, and is not moved with the stages of the rotary transporter 27L. A semiconductor wafer to be processed and a semiconductor wafer which has been processed are placed on each of the stages.

Rinsing nozzles 501, 502, 503 and 504 for supplying a cleaning liquid to a semiconductor wafer are provided above or below the rotary transporter 27L, and in positions spaced from the rotary transporter 27L. The rinsing nozzles 501 to 504 are stationary and are not rotated with the stages. Pure water or ionic water is mainly used as a cleaning liquid. A separator 510 is provided on the rotary transporter 27L so as to separate the wafer support stages 210 from one another for preventing slurry or a cleaning liquid, used for cleaning a semiconductor wafer or the top rings, from being scattered. The rotary transporter 27L is coupled to a servomotor 511, and semiconductor wafers on the rotary transporter 27L are transported by energizing the servomotor 511. A home position sensor 206 is provided on a lower portion of the rotary transporter 27L, and positioning of a wafer transfer position is controlled by the home position sensor 206 and the servomotor 511. Transfer positions which can be positioned are four positions at angular intervals of 90° with respect to the home position as a center.

Next, operation of the rotary transporter 27L having the above structure will be described. FIG. 9 shows a home position of the rotary transporter 27L. The rotary transporter 27L is rotated counterclockwise, and one of the stages 210 is located above the lifter 29L. The rotary transporter 27R is rotated clockwise, and one of its stages 210 is located above the lifter 29R.

A semiconductor wafer 101 to be transferred to one of the top rings 32L is transferred to the reversing device 28L by the transfer robot 20. The semiconductor wafer 101 is held by the reversing device 28L, and then is reversed, i.e. turned upside down. The reversed semiconductor wafer 101 is received by the lifter 29L, and then lowered. While the semiconductor wafer 101 is lowered by the lifter 29L, the semiconductor wafer 101 is centered by the tapered surfaces 202 of the pins 201 on the wafer support stage 210, and placed on shoulders of the pins 201. After the semiconductor wafer 101 is placed on the pins 201, the lifter 29L continues to be operated to cause the stage 260 to be lowered until the stage 260 does not interfere with the rotary transporter 27L even when the rotary transporter 27L is rotated. Thereafter, the rotary transporter 27L is rotated counterclockwise by an angle of 90°, and the semiconductor wafer 101 on the rotary transporter 27L is positioned above the pusher 30L. After positioning of the rotary transporter 27L is completed, the pusher 30L is operated to be raised, and the semiconductor wafer 101 is transferred to the top ring 32L located above the rotary transporter 27L.

A semiconductor wafer 101 which has been polished while being held by the top ring 32L is transferred to the wafer support stage 210 of the rotary transporter 27L, located in advance below the top ring 32L, by the pusher 30L. A semiconductor wafer 101 which has been received by the pusher 30L from the top ring 32L is placed on the shoulders of the pins 201 while the semiconductor wafer 101 is centered by the tapered surfaces 202 of the pins 201. The semiconductor wafer 101 is placed on the wafer support stage 210, and the pusher 30L is lowered until the pusher 30L does not interfere with the, rotary transporter 27L, and then the rotary transporter 27L is rotated couterclockwise by an angle of 90° to position the semiconductor wafer 101 above the lifter 29L. After positioning of the rotary transporter 27L is completed, the lifter 29L is raised to receive the semiconductor wafer 101 from the wafer support stage 210 and to transfer the semiconductor wafer 101 to the reversing device 28L.

Figure 11:
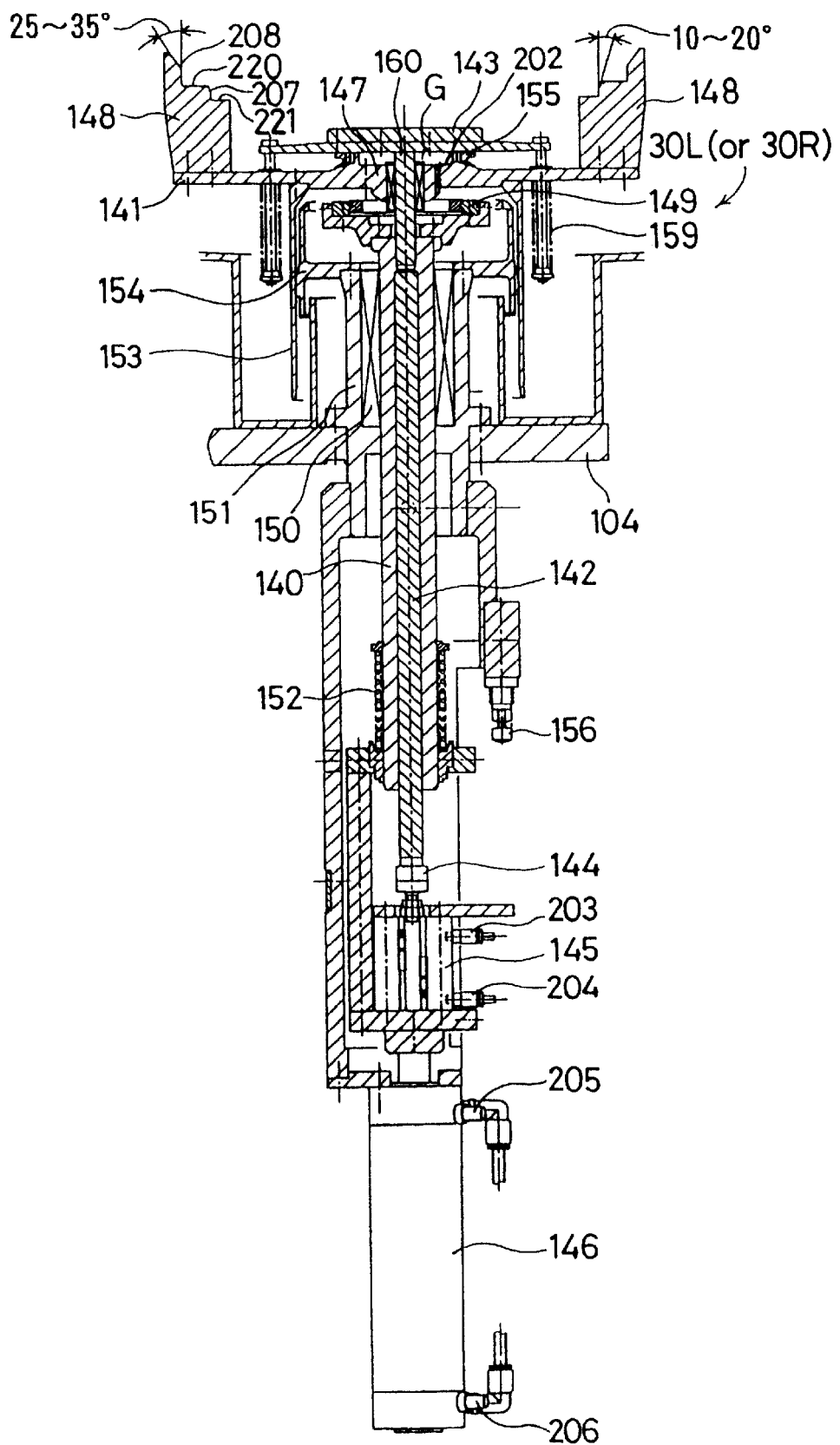
FIG. 11 is a vertical cross-sectional view of a pusher.
Figure 12:
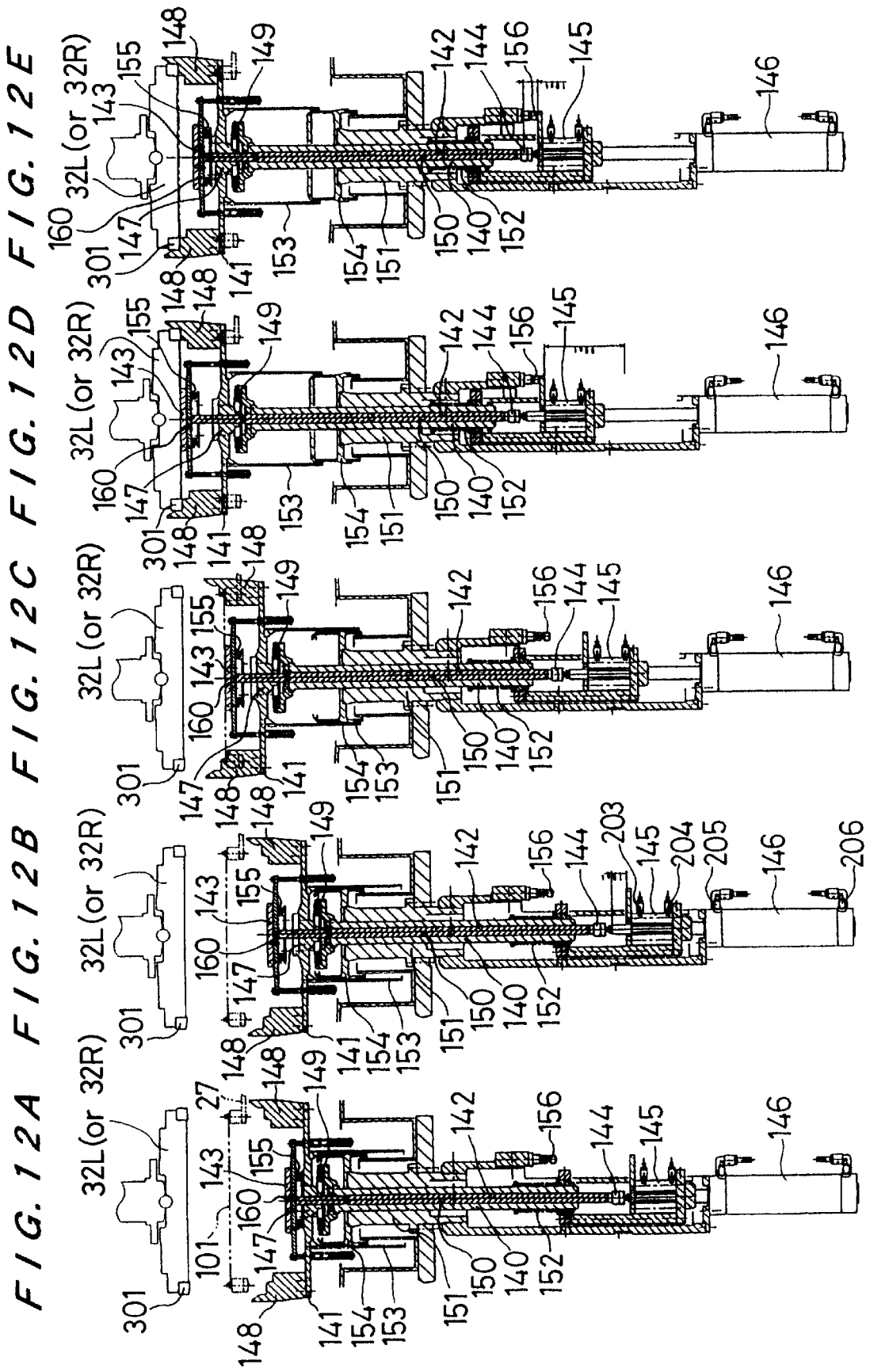
FIGS. 12A through 12E are vertical cross-sectional views illustrative of a manner in which the pusher operates.

FIG. 11, and FIGS. 12A through 12E show a pusher, wherein FIG. 11 is a vertical cross-sectional view of the pusher and FIGS. 12A through 12E are views for explaining operation of the pusher. The pusher 30L and 30R have the same structure, and hence only the pusher 30L will be described.

As shown in FIG. 11, a guide stage 141 for holding one of the top rings is provided above a hollow shaft 140, and a spline shaft 142 is provided in the hollow shaft 140. A push stage 143 is provided above the spline shaft 142. An air cylinder 145 is coupled to the spline shaft 142 through a flexible joint 144. Two air cylinders are disposed vertically in series. Lower air cylinder 146 serves to lift and lower the guide stage 141 and the push stage 143, and lifts and lowers the hollow shaft. 140 together with the air cylinder 145. The air cylinder 145 serves to lift and lower the push stage 143.

A linear way 149 movable in directions of an X-axis and a Y-axis is provided to allow a top ring guide 148 to have an alignment mechanism. The guide stage 141 is fixed to the linear way 149, and the linear way 149 is fixed to the hollow shaft 140. The hollow shaft 140 is held by a bearing case 151 through a slide bush 150. A stroke of the air cylinder 146 is transmitted to the hollow shaft 140 through a compression spring 152.

The push stage 143 is located above the guide stage 141, and a push rod 160 extending downwardly from a center of the push stage 143 passes through a slide bush 147 located at a center of the guide stage 141 to allow the push rod 160 to be centered. The push rod 160 contacts an upper end of the spline shaft 142. The push stage 143 is vertically moved by the air cylinder 145 through the spline shaft 142, so that a semiconductor wafer 101 is loaded on the top ring 32L. Compression springs 159 are provided at peripheral portions of the push stage 143.

Three top ring guides 148 are provided at outer circumferential portions of the guide stage 141. Each of the top ring guides 148 has a two-step structure, wherein an upper step 220 serves as a contact portion with a lower surface of a guide ring (retainer ring) 301, and a lower step 221 serves as a support portion for centering and supporting the semiconductor wafer 101. A tapered surface having an angle of 25° to 35° from the vertical is formed at the upper step 220 for guiding the guide- ring 301, and a tapered surface having an angle of 10° to 20° from the vertical is formed at the lower step 221 for guiding the semiconductor wafer 101. When the semiconductor wafer 101 is unloaded from the top ring, the top ring guides 148 receive a peripheral edge of the semiconductor wafer.

A guide sleeve 153 is fixed to the guide stage 141 to prevent water from entering a central part of the guide stage 141, and to guide the guide stage 141 so that the guide stage 141 is returned to its original position. A center sleeve 154 located inside of the guide sleeve 153 is fixed to the bearing case 151 for centering the guide stage 141. The pusher is fixed to a motor housing 104 in the polishing section through the bearing case 151.

A V-ring 155 is used to prevent water from entering between the push stage 143 and the guide stage 141, and has a lip held in contact with the guide stage 141 to prevent water from passing therethrough. When the guide stage 141 is elevated, a volume of a portion G increases, thus lowering pressure to thereby draw water. In order to prevent water from being drawn, the V-ring 155 has a hole 202 defined in an inner side thereof to prevent pressure from being lowered.

A shock absorber 156 is provided for positioning of the top ring guides 148 in a vertical direction and for absorbing shock when the top ring guides 148 contact the top ring 32L. In each of the air cylinders 145 and 146, upper and lower limit sensors are provided for detecting position of the pusher in a vertical direction. That is, sensors 203 and 204 are provided on the air cylinder 145, and sensors-205 and 206 are provided on the air cylinder 146. A cleaning nozzle or nozzles for cleaning the pusher is provided to prevent slurry attached to the pusher from contaminating a semiconductor wafer. A sensor for confirming presence or absence of a semiconductor wafer on the pusher may be provided. Control of the air cylinders 145 and 146 is performed by double solenoid valves, respectively.

Next, operation of the pusher having the above structure will be described below.

1) Loading a Semiconductor Wafer

As shown in FIG. 12A, a semiconductor wafer 101 is transported to a position above the pusher 30L by the rotary transporter 27L. When a top ring 32L is located in a loading position above the pusher 30L and does not hold a semiconductor wafer, as shown in FIG. 12B, the push stage 143 is raised by the air cylinder 145. When completion of raising of the push stage 143 is detected by the sensor 203, as shown in FIG. 12C, the guide stage 141 and components associated with the guide stage 141 are raised by the air cylinder 146. While the guide stage 141 is raised, the guide stage 141 passes through the wafer holding position of the rotary transporter 27L. At this time, the semiconductor-wafer 101 is centered by the tapered surfaces 207 of the top ring guides 148, and a pattern surface, except peripheral portions, of the semiconductor wafer is held by the push stage 143. The semiconductor wafer 101 is held by the push stage 143 at portions except for a peripheral edge thereof.

While the push stage 143 holds the semiconductor wafer, the top ring guides 148 are raised without being stopped, and the guide ring 301 is guided by the tapered surfaces 208 of the top ring guides 148. A center of the top ring guides 148 is aligned with a center of the top ring 32L by the linear way 149, movable in X and Y directions, and the upper steps 220 of the top ring guides 148 contact the lower surface of the guide ring 301, and lifting of the guide stage 141 is stopped.

When the upper steps 220 of the top ring guides 148 contact the lower surface of the guide ring 301, the guide stage 141 is fixed and is not raised anymore. However, the air cylinder 146 continues to be actuated until the stopper fixed to the rod of the air cylinder 146 contacts the shock absorber 156, and hence only the spline shaft 142 continues to be raised because the compression spring 152 is compressed, and the push stage 143 is further raised. At this time, as shown in FIG. 12D, the push stage 143 holds the semiconductor wafer 101 at portions except for the peripheral edge of the semiconductor wafer 101, and transports the semiconductor wafer 101 to the top ring 32L. After the semiconductor wafer 101 contacts the top ring 32L, a lifting stroke of the air cylinder 146 is absorbed by the compression springs 159 to thereby protect the semiconductor wafer 101.

After the top ring 32L completes attraction of the semiconductor wafer 101, the pusher starts to be operated and the guide stage 141 and the push stage 143 are lowered to the position shown in FIG. 12A. When the guide stage 141 is lowered, the guide stage 141 is centered by a tapered portion formed on the guide sleeve 153 and a tapered portion formed on the center sleeve 154. When lowering of the guide stage 141 is completed, loading of the semiconductor wafer is completed.

2) Unloading a Semiconductor Wafer

A semiconductor wafer 101 is transported by a top ring 32L to a wafer unload position located above the pusher 30L. When the wafer unload stage of the rotary transporter 27L is located above the pusher 30L and does not hold a semiconductor wafer, the guide stage 141 and components associated with the guide stage 141 are raised by the air cylinder 146, and the guide ring 301 of the top ring 32L is guided by the tapered surfaces 208 of the top ring guides 148. A center of the top ring guides 148 is aligned with a center of the top ring 32L by the linear way 149, and the upper steps 220 of the top ring guides 148 contact a lower surface of the guide ring 301 and lifting of the guide stage 141 is stopped. The air cylinder 146 continues to be actuated until the stopper fixed to the rod of the air cylinder 146 contacts the shock absorber 156. However, since the upper steps 220 of the top ring guides 148 contact the lower surface of the guide ring 301 to cause the guide stage 141 to be fixed at this position, the air cylinder 146 pushes the spline shaft 142 together with the air cylinder 145 against urging force of the compression spring 152, thus lifting the push stage 143. At this time, as shown in FIG. 12E, the push stage 143 is not raised to a position higher than the wafer holding portion of the lower steps 221 of the top ring guides 148. In this embodiment, the air cylinder 146 is arranged to be further actuated after the top ring guides 148 contact the guide ring 301. The shock at this time is absorbed by the spring 152.

After lifting actuation of the air cylinder 146 is completed, the semiconductor wafer 101 is removed from the top ring 32L. At this time, the semiconductor wafer 101 is centered by the lower tapered surfaces 207 of the top ring guides 148, and the semiconductor wafer 101 is held by the lower steps 221 of the top ring guides 148 at a peripheral edge of the semiconductor wafer 101. After the semiconductor wafer 101 is held by the pusher, the pusher starts to be operated to lower the guide stage 141. While the guide stage 141 is lowered, the guide stage 141 is centered by the guide sleeve 153 and the center sleeve 154. While the guide stage 141 is lowered, the semiconductor wafer 101 is transferred from the pusher 30L to the rotary transporter 27L. When lowering of the guide stage 141 is completed, unloading of the semiconductor wafer is completed.

According to the pusher having the structure shown in FIG. 11 and FIGS. 12A through 12E, since the pusher 30L has a centering mechanism for centering main components of the pusher with respect to a top ring 32L, adjustment of a positional relationship between the pusher 30L and the top ring 32L can be easily performed. A lifting stroke of the push stage 143 is set to a position higher than a lower surface of the top ring 32L by about 2 mm, and thus positioning in a vertical direction can be easily performed. At this time, shock resulting from contact in the vertical direction can be absorbed by the spring.

Next, a first polishing table and an optical sensor for monitoring a polished state of a semiconductor wafer will be described in detail.

Figure 13:
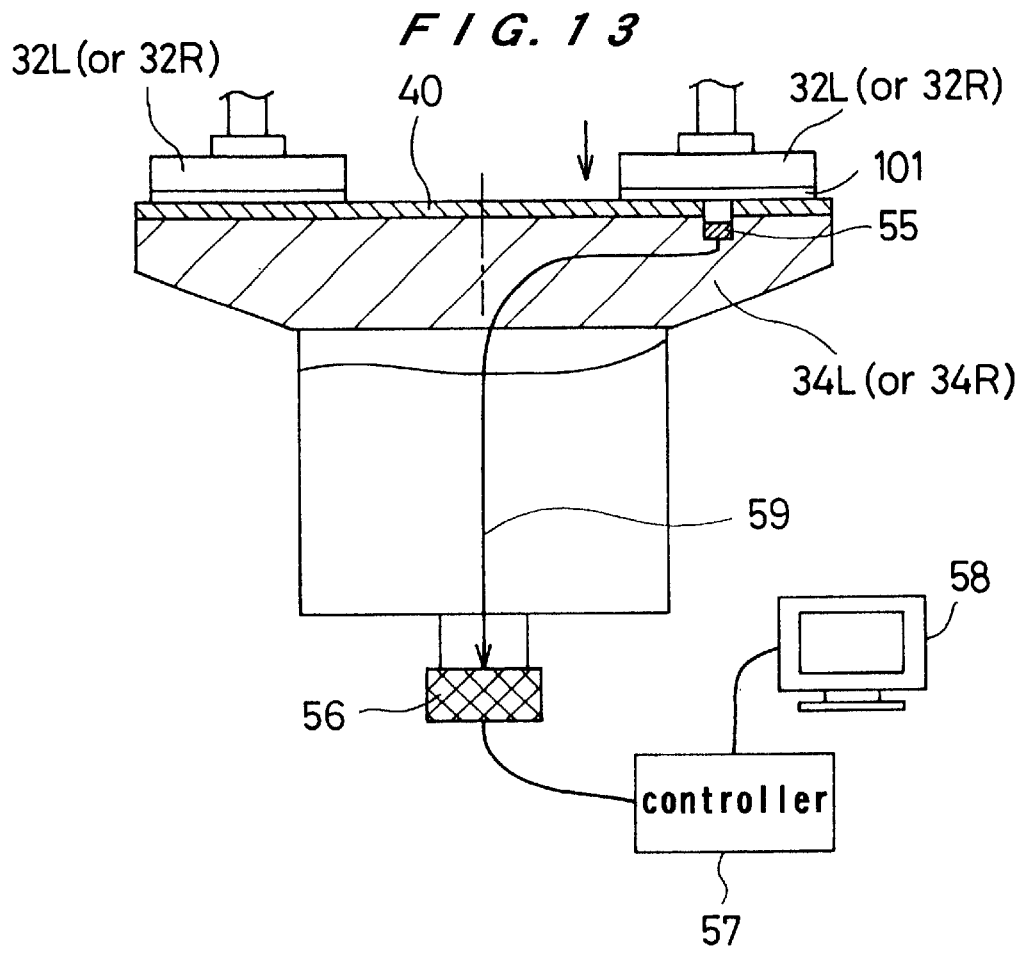
FIG. 13 is a schematic cross-sectional view showing a construction of a first polishing table and an arrangement of an optical sensor.

FIG. 13 is a schematic cross-sectional view showing structure of the first polishing table and an arrangement of the optical sensor. The polishing tables 34L and 34R have the same structure, and thus only the polishing table 34L will be described below.

As shown in FIG. 13, an optical sensor 55 is embedded in the polishing table 34L. The optical sensor 55 is electrically connected to a controller 57 by a wire 59 extending through the polishing table 34L, and a rotary connector (or slip ring) 56 mounted on an end of a polishing table support shaft. The controller 57 is connected to a display unit 58.

Figure 14:
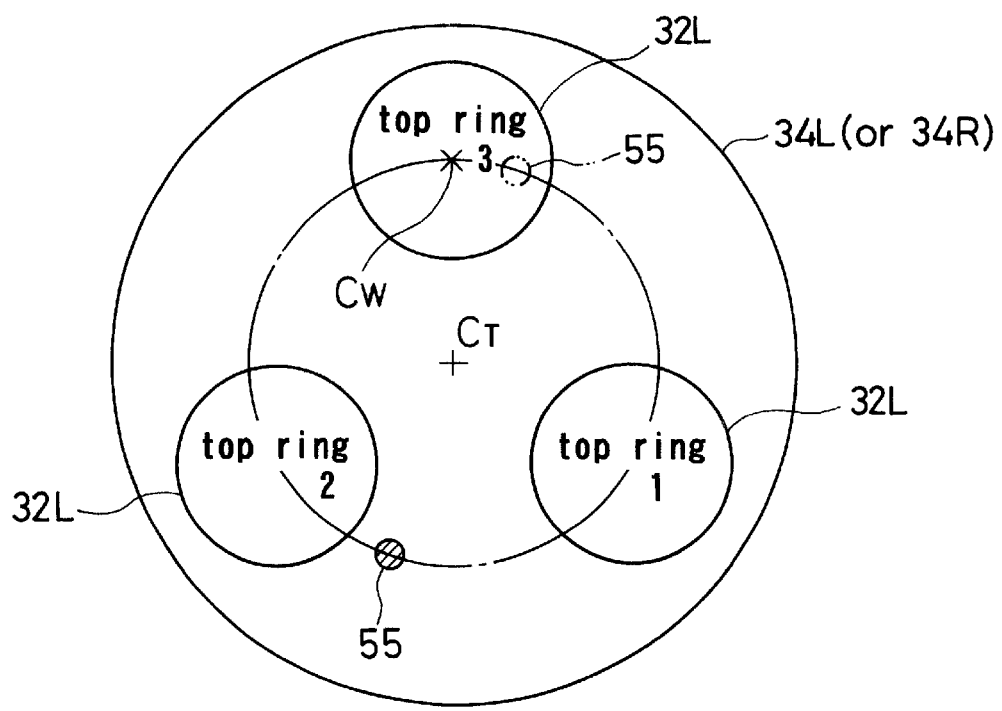
FIG. 14 is a plan view of the construction shown in FIG. 136

FIG. 14 is a plan view of the structure shown in FIG. 13. As shown in FIG. 14, the optical sensor 55 is positioned so as to pass through centers $C_W$ of semiconductor wafers 101 held by all of the top rings 32L while the semiconductor wafers 101 are being polished, when the polishing table 34L rotates about its own axis $C_T$. While the optical sensor 55 passes along an arcuate path beneath the semiconductor wafers 101, the optical sensor 55 continuously detects thickness of an insulating layer, or thickness of a conductive layer such as a copper layer, on the semiconductor wafer 101.

The optical sensor 55 comprises a light-emitting element and a light-detecting element. The light-emitting element applies light to a surface, being polished, of the semiconductor wafer, and the light-detecting element detects reflected light from the surface, being polished, of the semiconductor wafer. The light-emitting element comprises a laser beam source or an LED. In the optical sensor 55, a portion of the light applied from the light-emitting element to the surface, being polished, of the semiconductor wafer passes through an uppermost layer such as a conductive layer or an insulating layer, and is reflected from the surface of an underlayer under the uppermost layer. Therefore, the light-detecting element detects both the light reflected by the uppermost layer and the light reflected by the underlayer. A detected signal from the light-detecting element is processed by the controller 57 to accurately detect thickness of the uppermost layer, such as the conductive layer or the insulating layer.

Next, principles of detecting thickness of an insulating layer of $SiO_2$ or the like, or a metallic layer of copper or aluminum, by the optical sensor 55 will be briefly described.

The principles of detecting the thickness of the layer by the optical sensor utilizes interference of light caused by a top layer and a medium adjacent to the top layer. When light is applied to a thin layer on a substrate, a part of the light is reflected from a surface of the thin layer while the remaining part of the light is transmitted through the thin layer. A part of the transmitted light is then reflected from a surface of an underlayer or the substrate, while the remaining part of the transmitted light is transmitted through the underlayer or the substrate. In this case, when the underlayer is made of a metal, light is absorbed in the underlayer. A phase difference between the light reflected from the surface of the thin layer and the light reflected from the surface of the underlayer or the substrate creates the interference. When phases of the two lights are identical to each other, light intensity is increased, while when the phases of the two lights are opposite to each other, light intensity is decreased. That is, reflection intensity varies with wavelength of incident light, layer thickness, and refractive index of the layer. The light reflected from the substrate is separated by a diffraction grating or the like, and a profile depicted by plotting intensity of reflected light for each wavelength is analyzed to measure thickness of the layer on the substrate.

Therefore, light is applied by the light-emitting element to the surfaces, being polished, of the three semiconductor wafers held by the respective top rings 32L one after another, each time the polishing table 34L makes one revolution, and light reflected by the surfaces, being polished, of the semiconductor wafers is received by the light-detecting element. The light received by the light-detecting element is processed by the controller 57 to detect thickness of the layer on the surface being polished.

Therefore, thicknesses of insulating layers or metallic layers formed on the semiconductor wafers 101 held by all of the top rings 32L can be detected, as continuous measurements on a real-time basis, along a predetermined path extending from an outer circumferential edge to a center of each of the semiconductor wafers by the- optical sensor 55. Thus, the thicknesses of the insulating layers or the metallic layers on all of the semiconductor wafers can be monitored at all times, and an end point of a CMP process can be accurately detected by detecting the following: when a layer on the semiconductor wafer has been polished to a desired thickness; or when the layer on the semiconductor wafer has been removed until the layer thickness has become zero. In order to shorten an interval between detecting intervals, one or more optical sensors 55 may be added as indicated by an imaginary line in FIG. 14, so that at least two sensors are provided in the polishing table. Further, an eddy-current sensor or the like may be provided to detect thicknesses of the semiconductor wafers, in addition to the optical sensor, whereby the eddy-current sensor and the optical sensor may be selected depending on a measuring range of the thickness of the layer or the kind of layer to be measured.

In this manner, an end point of the CMP process can be detected for each of the semiconductor wafers held by the respective top rings 32L, and hence a polishing operation of only the semiconductor wafer in which the end point of the CMP process has been detected can be terminated. Therefore, according to the present invention, although the polishing apparatus is such a multi-head type polishing apparatus which can polish a plurality of semiconductor wafers simultaneously, an end point of the CMP process for all of the semiconductor wafers during polishing can be detected. Thus, all of the semiconductor wafers can be uniformly polished without any irregularities in a polished state.

In this case, if only the top ring 32L holding the semiconductor wafer in which the end point of the CMP process has been detected is raised, then an offset load is applied to the polishing table 34L to cause the polishing table 34L to be inclined. For example, in FIGS. 13 and 14, if the end point of the CMP process is detected for the semiconductor wafer held by top ring 2 and this top ring is raised as it is, load applied to the polishing table 34L by this top ring is lost, and hence an offset load is applied to the polishing table 34L to cause the polishing table 34L to be inclined. Further, since each of the top rings is connected to the carousel 36L which is a single structural body, there is a possibility that the carousel 36L per se is inclined by the offset load. Therefore, in the present invention, when a plurality of the top rings 32L finish a polishing operation individually, in order to reduce an offset load as much as possible, the following measures are taken: when a polishing operation is terminated, a pressing force applied to the semiconductor wafer is set to zero and a pressing force applied to a retainer ring is left as it is; or a pressing force applied to the retainer ring is changed to such a pressing force as to be equal to the pressing force applied to the wafer during polishing plus a pressing force applied to the retainer ring during polishing. Next, a mechanism of the top ring which can apply the above load to the retainer ring will be described below.

Figure 15:
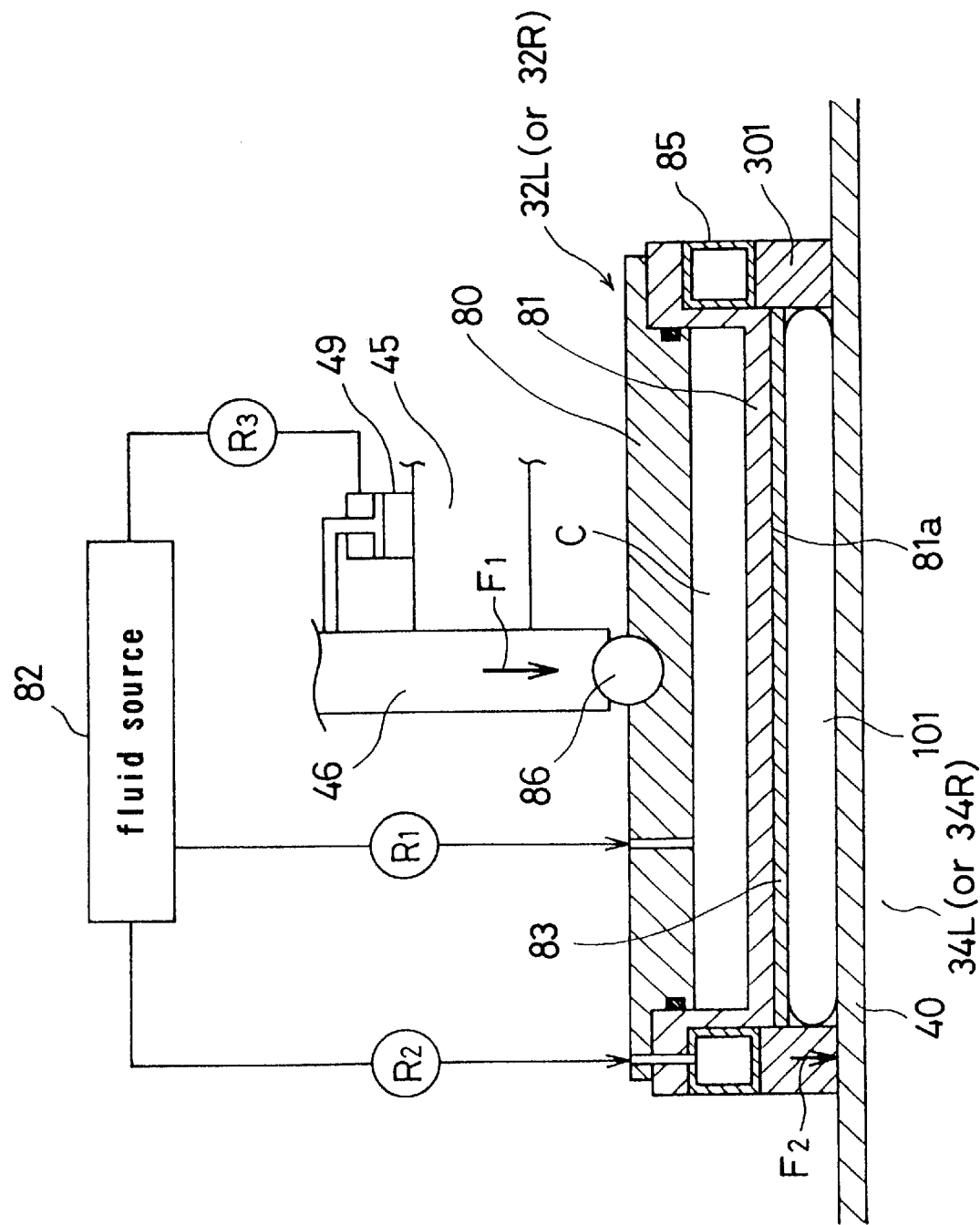
FIG. 15 is a schematic cross-sectional view showing structure of a top ring.

FIG. 15 is a schematic cross-sectional view showing construction of the top ring of the present invention. As shown in FIG. 15, the top ring 32L (or 32R) comprises a top ring body 80, and a holding plate 81 for holding a workpiece, to be polished, such as a semiconductor wafer 101. A chamber C is defined between the top ring body 80 and the holding plate 81, and is connected to a fluid source 82 through a regulator $R_1$. An elastic pad 83 of polyurethane or the like is attached to a lower surface of the holding plate 81. A retainer ring (guide ring) 301 for holding the semiconductor wafer 101 on the lower surface, i.e. a wafer holding surface 81a of the holding plate 81 is disposed around an outer peripheral portion of the top ring 32L. A fluid pressure bag 85 comprising an annular tube is provided between the retainer ring 301 and the holding plate 81. The fluid pressure bag 85 is connected to the fluid source 82 through a regulator $R_2$. A polishing table 34L (or 34R) having a polishing cloth 40 attached thereon is disposed below the top ring 32L. The polishing cloth 40 constitutes a polishing surface which is brought into sliding contact with the semiconductor wafer 101 for thereby polishing the semiconductor wafer 101.

The top ring 32L is connected to a top ring shaft 46 through a ball 86. The top ring shaft 46 is connected to a fluid pressure cylinder 49 fixedly mounted on a top ring head 45. The fluid pressure cylinder 49 serves as an actuator for moving the top ring 32L vertically, and is connected to the fluid source 82 through a regulator $R_3$.

In the above structure, by supplying a pressurized fluid such as a compressed air to the fluid pressure cylinder 49 from the fluid source 82, the top ring 32L presses the semiconductor wafer 101 to be polished against the polishing cloth 40 on the polishing table 34L under a certain pressing force $F_1$ for thereby polishing the semiconductor wafer 101. The pressing force $F_1$ is variable by regulating the regulator $R_3$.

FIG. 16 is a schematic view showing a configuration of the wafer holding surface 81a of the holding plate 81. In FIG. 16, the horizontal axis represents a distance (mm) from a center (O) of the holding plate 81, and the vertical axis represents a height of the wafer holding surface. In FIG. 16, alternate long and short dash line "d" shows a condition in which the wafer holding surface 81a is flat. In this condition, no pressurized fluid is supplied to the chamber C, and polishing pressure is not applied to the wafer holding surface 81a while polishing is not performed. During polishing, when a pressurized fluid such as compressed air is supplied to the chamber C from the fluid source 82, the wafer holding surface 81a of the holding plate 81 is curved, by a pressing force of the pressurized fluid, into a downwardly directed convex shape as shown by curve "a" in FIG. 16. That is, the wafer holding surface 81a defines a convex spherical surface. In this condition, a central portion of the semiconductor wafer 101 is pressed by the downwardly convex holding plate 81 against the polishing cloth 40 with a pressure higher than that applied onto an outer circumferential portion of the wafer. Thus, if an amount of material removed from the outer circumferential portion of the semiconductor wafer 101 is larger than an amount of material removed from the central portion of the semiconductor wafer 101, an insufficient polishing action at the central portion of the semiconductor wafer can be corrected by utilizing deformation of the holding plate 81 caused by the pressurized fluid.

On the other hand, if the amount of material removed from the central portion of the semiconductor wafer 101 is larger than the amount of a material removed from the outer circumferential portion of the semiconductor wafer 101 the regulator $R_1$ is controlled to reduce the pressure of the pressurized fluid supplied from the fluid source 82 to the chamber C, or to stop supply of the pressurized fluid to the chamber C, thereby making the wafer holding surface 81a of the holding plate 81 take on the shape of curve "b" or "c" shown in FIG. 16. Therefore, polishing pressure applied to the central portion of the semiconductor wafer 101 is decreased and polishing pressure applied to the outer circumferential portion of the semiconductor wafer 101 is increased, in comparison with the condition caused by curve "a". Thus, insufficient polishing action at the outer circumferential portion of the semiconductor wafer can be corrected, and the entire surface of the semiconductor wafer 101 can be uniformly polished.

When supply of pressurized fluid to the chamber C is stopped, the wafer holding surface 81a is curved, due to a polishing pressure, in an upwardly directed slightly convex shape as shown by curve "c". That is, the wafer holding surface 81a defines a concave spherical surface. If it is desirable to cause the wafer holding surface 81a of the holding plate 81 to curve upwardly to a greater extent than the condition shown by curve "c", the chamber C may be evacuated by the fluid source 82 comprising a vacuum pump. The shape or configuration of the wafer holding surface 81a can be, made downwardly convex. (convex spherical surface) or upwardly convex (concave spherical surface) or flat by developing positive pressure (pressure higher than atmospheric pressure) or negative pressure (pressure lower than atmospheric pressure) in the chamber C. The wafer holding surface 81a of the holding plate 81 can be deformed into a desired shape by selecting material and thickness of the holding plate 81. Preferred materials to be selected for the holding plate are, in consideration of environments in which the polishing apparatus is used, corrosion-resistant and elastic materials, for example, austenitic stainless steel (SUS 304, SUS 316, and the like), aluminium titan, or resin material such as polyphenylene sulfide (PPS) or polyethelethelketone (PEEK). Preferred thickness of the holding plate is, in consideration of protection against interior pressure of the chamber (preferably, not more than 0.1 MPa), in the range of 3 to 8 mm, and preferably about 5 mm in case of austenitic stainless steel. In case of other materials, the thickness should be selected on the basis of modulus of elasticity, while taking into consideration safety concerns.

In parallel with correcting the shape of the wafer holding surface 81a of the top ring 32L, the retainer ring 301 presses the polishing cloth 40 under a pressing force $F_2$ by supplying a pressurized fluid such as a compressed air to the fluid pressure bag 85 from the fluid source 82.

In the present invention, the pressing force $F_1$ exerted by the top ring 32L for pressing the semiconductor wafer 101 against the polishing cloth 40 on the polishing table 34L is variable, and the pressing force $F_2$ for pressing the retainer ring 301 against the polishing cloth 40 is also variable. These pressing forces $F_1$ and $F_2$ are variable independently of each other. Therefore, the pressing force $F_2$, which is applied to the polishing cloth 40 by the retainer ring 301, can be changed depending on the pressing force $F_1$, which is applied by the top ring 32L to press the semiconductor wafer 101 against the polishing cloth 40.

Theoretically, if the pressing force $F_1$, which is applied by the top ring 32L to press the semiconductor wafer 101 against the polishing cloth 40, is equal to the pressing force $F_2$, which is applied to the polishing cloth 40 by the retainer ring 301, then distribution of applied polishing pressures, which result from a combination of the pressing forces $F_1$, $F_2$, is continuous and uniform from the center of the semiconductor wafer 101 to its peripheral edge and further to an outer circumferential edge of the retainer ring 301 disposed around the semiconductor wafer 101. Accordingly, the peripheral portion of the semiconductor wafer 101 is prevented from being polished excessively or insufficiently.

Figure 17A:
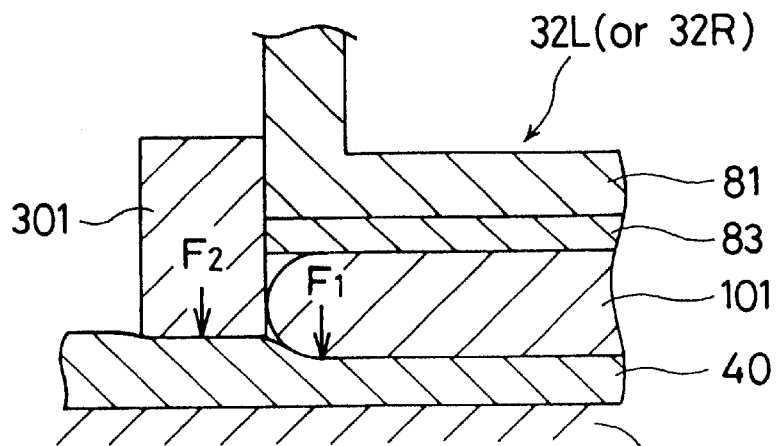
FIGS. 17A, 17B, and 17C are enlarged fragmentary vertical cross-sectional views showing behavior of a polishing cloth when relationship between a pressing force applied by a top ring and a pressing force applied by a retainer ring is varied.
Figure 17B:
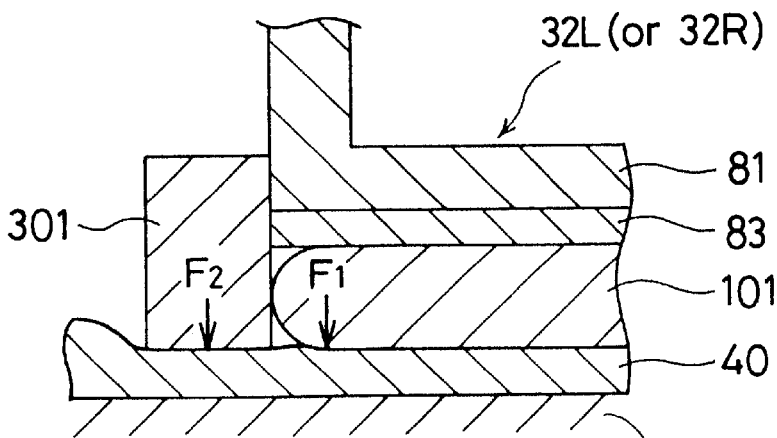
Figure 17C:
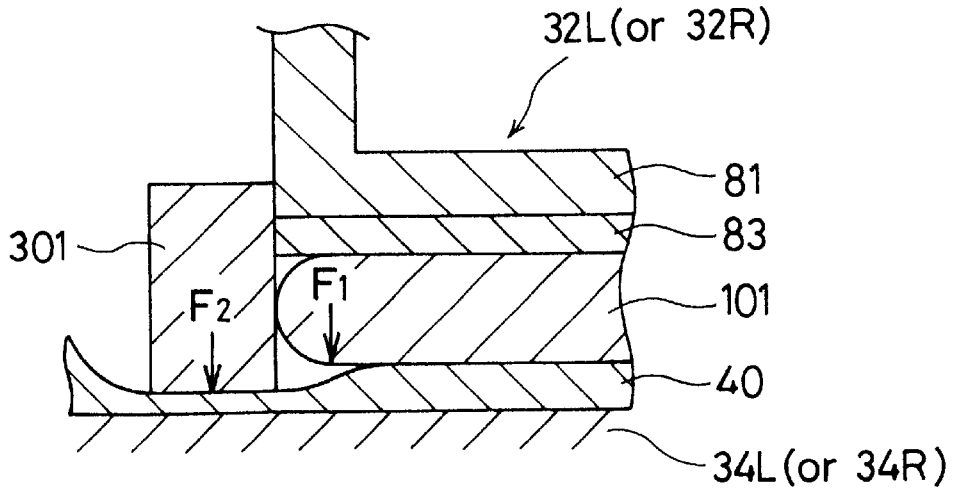

FIGS. 17A through 17C schematically show how the polishing cloth 40 behaves when a relationship between the pressing force $F_1$ and the pressing force $F_2$ is varied. In FIG. 17A, the pressing force $F_1$ is larger than the pressing force $F_2$ ($F_1 > F_2$). In FIG. 17B, the pressing force $F_1$ is nearly equal to the pressing force $F_2$ ($F_1 \approx F_2$). In FIG. 17C, the pressing force $F_1$ is smaller than the pressing force $F_2$ ($F_1 < F_2$).

As shown in FIGS. 17A through 17C, when the pressing force $F_2$ applied to the polishing cloth 40 by the retainer ring 301 is progressively increased, the polishing cloth 40 pressed by the retainer ring 301 is progressively compressed, thus progressively changing its state of contact with a peripheral portion of the semiconductor wafer 101, i.e., progressively reducing its area of contact with the peripheral portion of the semiconductor wafer 101. Therefore, when the relationship between the pressing force $F_1$ and the pressing force $F_2$ is changed in various patterns, the distribution of polishing pressures on the semiconductor wafer 101 over its peripheral portion and inner region is also changed in various patterns.

As shown in FIG. 17A, when the pressing force $F_1$ is larger than the pressing force $F_2$ ($F_1 > F_2$), polishing pressure applied to the peripheral portion of the semiconductor wafer 101 is larger than polishing pressure applied to the inner region of the semiconductor wafer 101, so that an amount of material removed from the peripheral portion of the semiconductor wafer 101 is larger than the amount of a material removed from the inner region of the semiconductor wafer 101 while the semiconductor wafer 101 is being polished.

As shown in FIG. 17B, when the pressing force $F_1$ is substantially equal to the pressing force $F_2$ ($F_1 \approx F_2$), the distribution of polishing pressures is continuous and uniform from the center of the semiconductor wafer 101 to its peripheral edge and further to the outer circumferential edge of the retainer ring 301, so that an amount of material removed from the semiconductor wafer 101 is uniform from the peripheral edge to the inner region of the semiconductor wafer 101 while the semiconductor wafer 110 is being polished.

As shown in FIG. 17C, when the pressing force $F_1$ is smaller than the pressing force $F_2$ ($F_1 < F_2$), polishing pressure applied to a peripheral portion of the semiconductor wafer 101 is smaller than the polishing pressure applied to the inner region of the semiconductor wafer 101, so that an amount of a material removed from a peripheral edge of the semiconductor wafer 101 is smaller than an amount of a material removed from the inner region of the semiconductor wafer 101 while the semiconductor wafer 101 is being polished.

As described above, according to the present invention, fluid is supplied to the upper surface opposite to the wafer holding surface 81a of the holding plate 81 of the top ring 32L, and, at this time, pressure of the fluid is properly selected within the range of positive pressure to negative pressure to thereby make the shape of the wafer holding surface 81a downwardly convex or upwardly convex. In this connection, the semiconductor wafer 101 can be polished differently by varying the pressing force for pressing the semiconductor wafer 101 against the polishing cloth 40 at the outer circumferential portion and the central portion thereof. In some cases, the semiconductor wafer 101 is polished under the condition that the wafer holding surface 81a of the holding plate 81 is made flat.

In parallel with the above process, the pressing force $F_2$ of the retainer ring 301 disposed around the wafer is determined on the basis of the pressing force $F_1$ of the top ring 32L, and polishing is performed while the retainer ring 301 presses the polishing cloth 40 under the determined pressing force $F_2$. That is, a polishing operation of the semiconductor wafer 101 is performed under a shape correcting effect of the wafer holding surface 81a by fluid having positive pressure or negative pressure, as well as a shape correcting effect of the polishing cloth 40 by the retainer ring 301. Thus, irregularities of a polishing action can be sufficiently corrected and a localized area (for example, a central portion, or an outer circumferential portion) of the-semiconductor wafer 101 is prevented from being polished excessively or insufficiently.

When an end point of a CMP process for a semiconductor wafer held by the top ring 32L having the structure shown in FIGS. 15 through 17(C) is detected, the pressing force $F_1$ for pressing the semiconductor wafer 101 against the polishing cloth 40 on the polishing table 34L by the top ring 34L becomes zero, and only the pressing force (retainer load) $F_2$ for pressing the polishing cloth 40 by the retainer ring 301 is applied. In this case, the pressing force of the retainer ring (retainer load) is equal to the pressing force $F_2$ which is applied during polishing, or the pressing force of the retainer ring is changed to such a pressing force as to be equal to the pressing force $F_1$ plus the pressing force $F_2$. Thus, an offset load can be prevented from being applied to the polishing table 34L (or 34R) and the carousel 36L (or 36R).

Next, a second polishing table will be described.

Figure 19A:
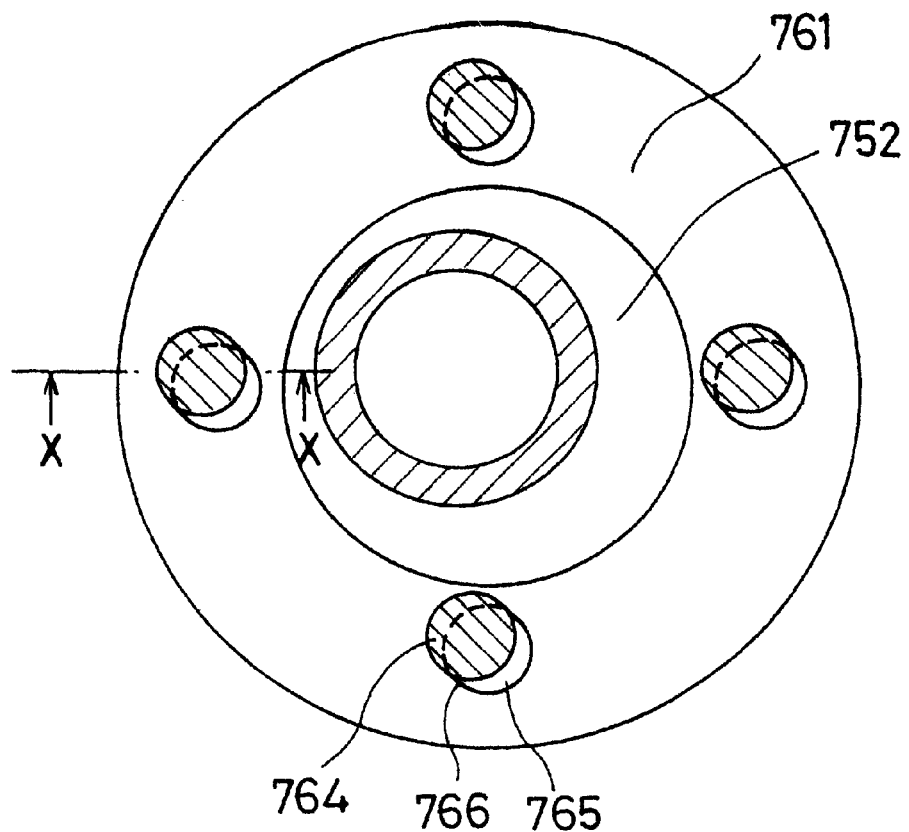
FIG. 19A is a cross-sectional view taken along line P—P of FIG. 18.
Figure 19B:
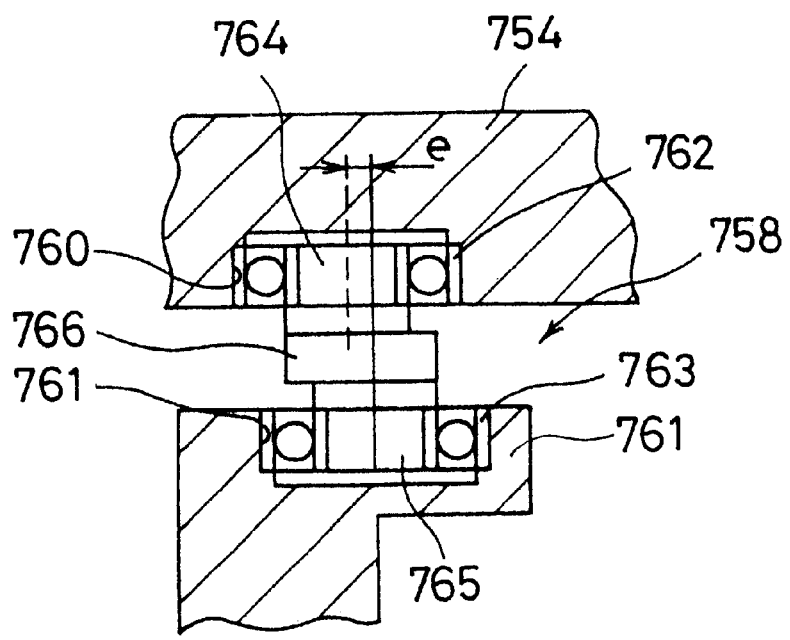
FIG. 19B is a cross-sectional view taken along line X—X of FIG. 19A.

FIG. 18 is a cross-sectional view showing a scroll-type second polishing table, FIG. 19A is a cross-sectional view taken along line P—P of FIG. 18, and FIG. 19B is a cross-sectional view taken along line X—X of FIG. 19A.

Second polishing tables 35L and 35R have the same structure, and hence only the polishing table 35L will be described.

The scroll-type second polishing table 35L has an upper flange 751 of a motor 750, and a hollow shaft 752 connected to the upper flange 751 by bolts. A set ring 754 is supported by an upper portion of the shaft 752 through a bearing 753. A table 759 is fixed to the set ring 754, and a polishing table 755 is fixed to the table 759 by bolts 790. The polishing table 755 may comprise a grinding stone (fixed abrasive plate) entirely, or may comprise a plate made of a corrosion-resistant metal such as stainless steel and a polishing cloth attached to the plate. In case of using the grinding stone or the polishing cloth, the polishing table 755 may have a flat upper surface or a slightly convex or concave upper surface. The shape of the upper surface of the polishing table 755 is selected depending on the kind of the semiconductor wafer 101 to be polished. An outer diameter of the polishing table 755 is set to a diameter at least equal to a diameter of the semiconductor wafer plus a distance 2e (described below). That is, the diameter of the polishing table 755 is arranged such that when the polishing table 755 makes a translational motion, the semiconductor wafer does not project from an outer periphery of the polishing table 755. Translational motion may be called scroll motion or orbital motion.

The set ring 754 has three or more supporting portions 758 in a circumferential direction, and the table 759 is supported by the supporting portions 758. A plurality of recesses 760, 761 are formed at positions corresponding to upper surfaces of the supporting portions 758 and upper ends of cylindrical members 795 at angularly equal intervals in a circumferential direction, and bearings 762 and 763 are mounted in the recesses 760 and 761. As shown in FIGS. 18 and 19(A)–19(B), a support member 766 having two shafts 764 and 765, whose central axes are spaced by "e" is supported by the bearings 762 and 763. Specifically, the two shafts 764 and 765 are inserted into the bearings 762 and 763, respectively. Thus, the polishing table 755 makes a translational motion along a circle having a radius "e" through operation of the motor 750.

Further, a center of the shaft 752 is off-centered by "e" from a center of the motor 750. A balancer 767 is fixed to the shaft 752 for balancing a load caused by eccentricity. Supply of abrasive liquid onto the polishing table 755 is conducted through an interior of the motor 750 and the shaft 752, a through-hole 757 provided at a central portion of the table 759, and a coupling 791. The supplied abrasive liquid is once stored in a space 756 defined between the polishing table 755 and the table 759, and then supplied to an upper surface of the polishing table 755 through a plurality of through-holes 768 formed in the polishing table 755. The number and position of the through-holes 768 can be selected depending on a type of process to be performed. In the case where the polishing cloth is attached to the polishing table 755, the polishing cloth has through-holes at positions corresponding to the positions of the through-holes 768. In the case where the polishing table 755 is made of a grinding stone in entirety, an upper surface of the polishing table 755 has grid-like, spiral, or radial grooves, and the through-holes 768 may communicate with such grooves.

The supplied abrasive liquid may be selected from pure water, chemicals, or slurry, and, if necessary, more than one kind of abrasive liquid can be supplied simultaneously, alternatively, or sequentially. In order to protect a mechanism for performing a translational motion from the abrasive liquid during polishing, a flinger or a thrower 769 is attached to the table 759, and forms a labyrinth mechanism together with a trough 770.

In the polishing table having the above structure, the upper and lower bearings 762, 763 are axially interconnected by a support member 766 comprising a cranked joint having the upper and lower shafts 764, 765 that are fitted respectively in the upper and lower bearings 762, 763. The shafts 764, 765, and hence the upper and lower bearings 762, 763, have respective axes horizontally spaced from each other by a distance "e". The cylindrical member 795 for supporting the lower bearing 763 is fixed to the frame, and hence is stationary. When the motor 750 is energized, the shaft 752 is rotated by a radius of gyration (e) about a central axis of the motor 750, and thus the polishing table 755 makes a circulatory translational motion (scroll motion) through the cranked joint, and the semiconductor wafer 101 attached to the top ring 32L is pressed against a polishing surface of the polishing table 755. The semiconductor wafer 101 is polished by the abrasive liquid supplied through the through-hole 757, the space 756 and the through-holes 768. The semiconductor wafer 101 is polished by relative circulatory translational motion, having a radius "e", between the polishing surface of the polishing table 755 and the semiconductor wafer 101, and the semiconductor wafer 101 is uniformly polished over its entire surface. If a surface to be polished of the semiconductor wafer 101, and the polishing surface have the same positional relationship, then the polished semiconductor wafer is affected by a local difference in the polishing surface. In order to eliminate this influence, the top ring 32L is rotated at a low speed to prevent the semiconductor wafer from being polished at the same area on the polishing surface.

Next, a dresser for dressing the polishing table 34L or 34R will be described with reference to FIG. 20. The dressers 38L and 38R have the same structure, and hence only the dresser 38L will be described below.

Figure 20:
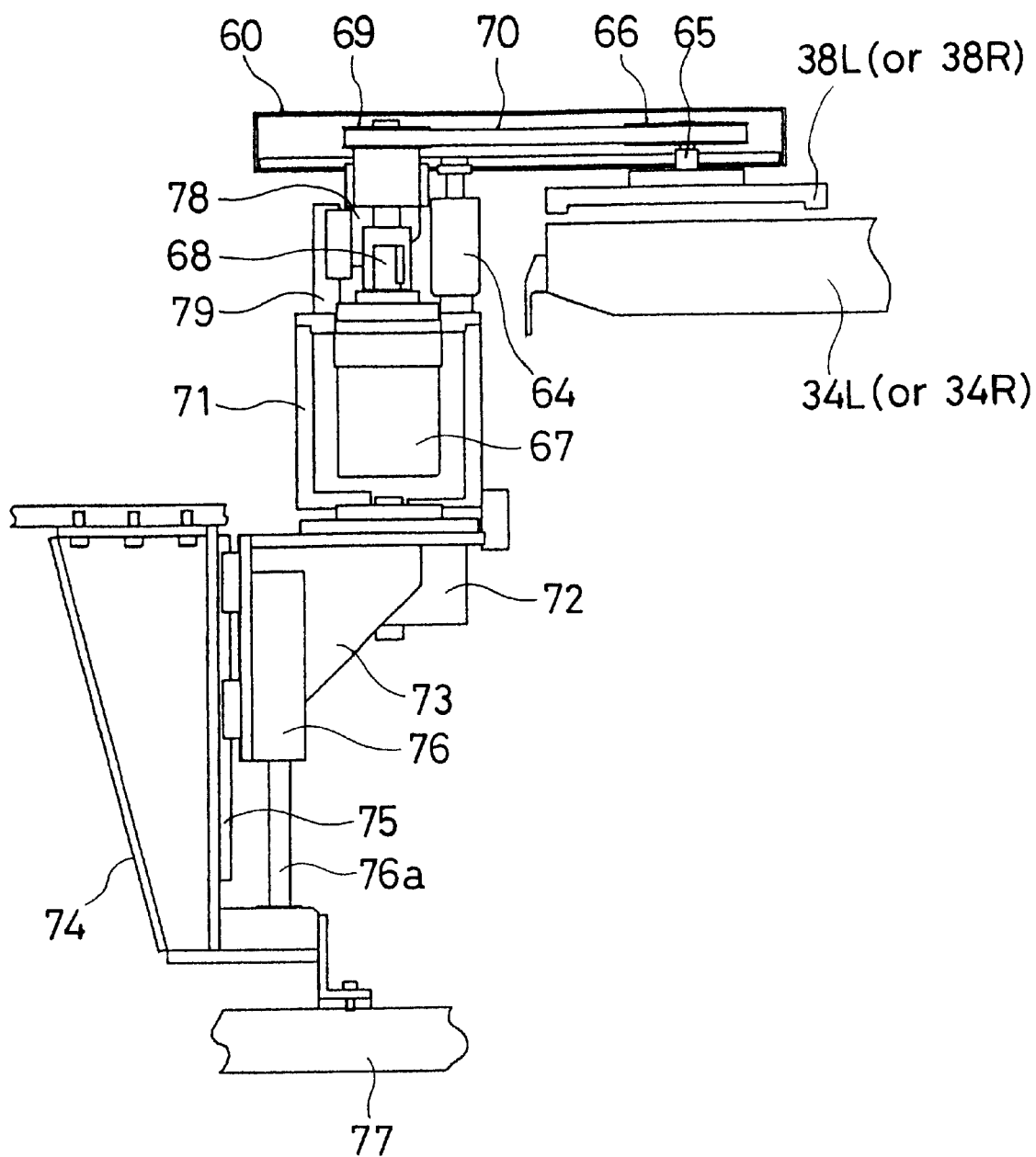
FIG. 20 is a front view of a dresser for dressing the first polishing table.

As shown in FIG. 20, the dresser 38L is supported by a dresser head 60. The dresser head 60 is vertically movable by a dresser lifting/lowering air cylinder 64, and the dresser 38L is brought into contact with or removed from the polishing surface on the polishing table 34L. A pulley 66 is fixed to an upper end of a rotating shaft 65 of the dresser 38L, and the pulley 66 is coupled to a pulley 69 connected to a rotating shaft 68 of a dresser motor 67 through a timing belt 70. The rotating shaft 68 of the dresser motor 67 and the pulley 69 are coupled by a key and a keyway so that the rotating shaft 68 and the pulley 69 are integrally rotated, but are vertically movable with respect to each other. Vertical movement of a supporting portion 78 for supporting the pulley 69 and the dresser head 60 is guided by a guide rail 79.

The air cylinder 64 and the dresser motor 67 are supported by a housing 71, and the housing 71 is rotated by a swing motor 72. The swing motor 72 is fixed to a bracket 73. The bracket 73 engages with a guide rail 75 fixed to a base 74, and the bracket 73 is vertically slidable on the guide rail 75. A lifting/lowering air cylinder 76 is fixed to the bracket 73, and a forward end of a rod 76a of the lifting/lowering air cylinder 76 is fixed to the base 74. The base 74 is supported by a frame 77.

In the above structure, by actuating the lifting/lowering air cylinder 76, the dresser 38L, the dresser head 60, the dresser motor 67 and the swing motor 72 are integrally moved in a vertical direction. Therefore, in this dressing apparatus, when the dresser 38L is not used, the dresser 38L can retreat to a position below the polishing table 34L (or 34R). By energizing the swing motor 72, the dresser head 60 is swung to cause the dresser 38L to be positioned at a standby position and a dressing position on the polishing table.

When dressing is carried out by the dresser 38L, the lifting/lowering air cylinder 76 is actuated to cause the dresser 38L and the dresser head 60 to be raised. Then, the dresser 38L is moved to the dressing position on the polishing table by the swing motor 72. At this position, the dresser lifting/lowering air cylinder 64 is actuated, and the dresser 38L and the dresser head 60 are lowered for thereby pressing the dresser 38L against a polishing surface on the polishing table. At this time, the dresser 38L is rotated at a predetermined speed by the dresser motor 67. Further, the polishing table 34L (or 34R) is also rotated at a predetermined speed. The dresser for dressing the second polishing tables 35L, 35R comprises a conventional brush-type dresser.

Next, the wafer station 90 disposed at the position which can be accessed by the transfer robot 4, the transfer robot 20 and the transfer robot 21 will be described with reference to FIGS. 21(A) through 23(C).

Figure 21A:
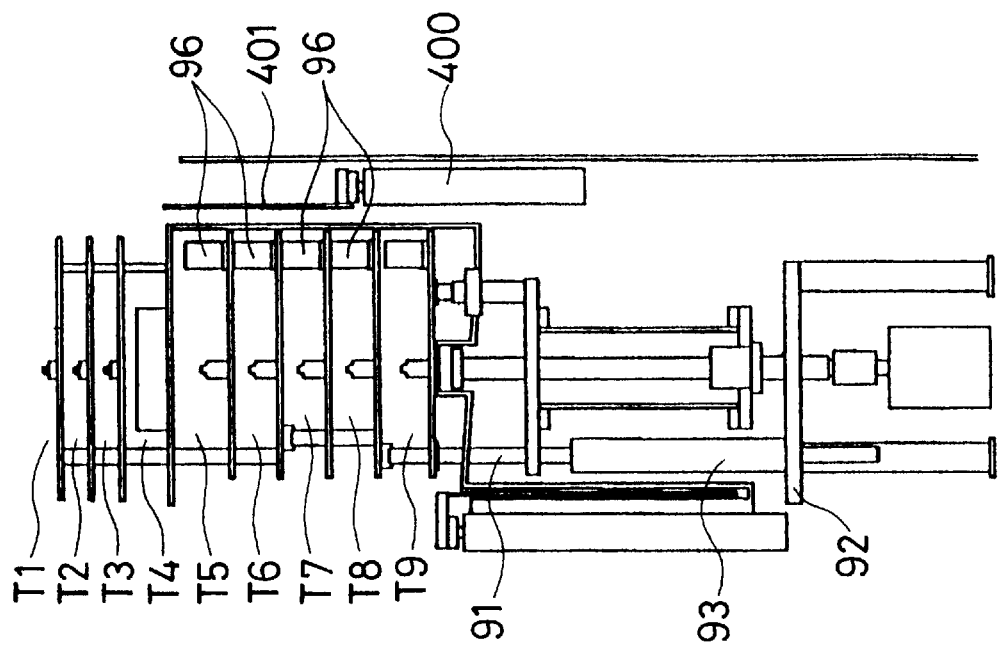
FIG. 21A is a front view of a wafer station.
Figure 21B:
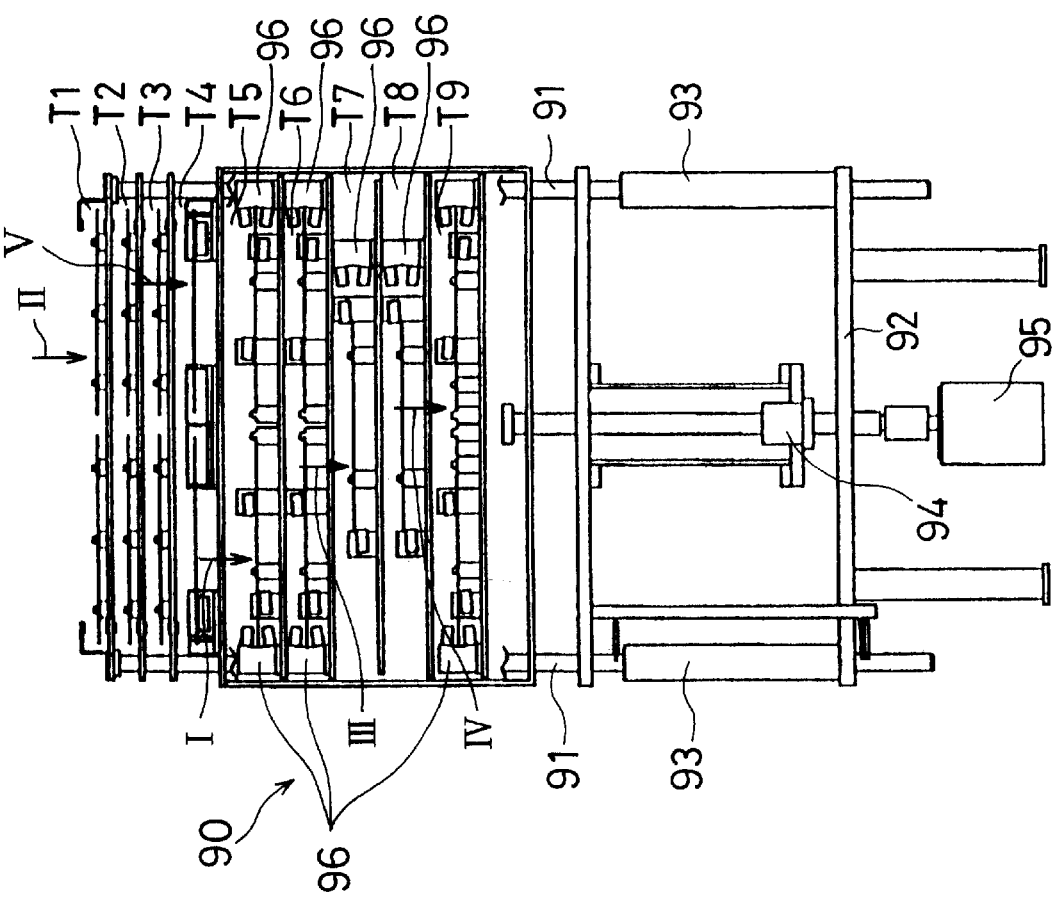
FIG. 21B is a side view of the wafer station.
Figure 25:
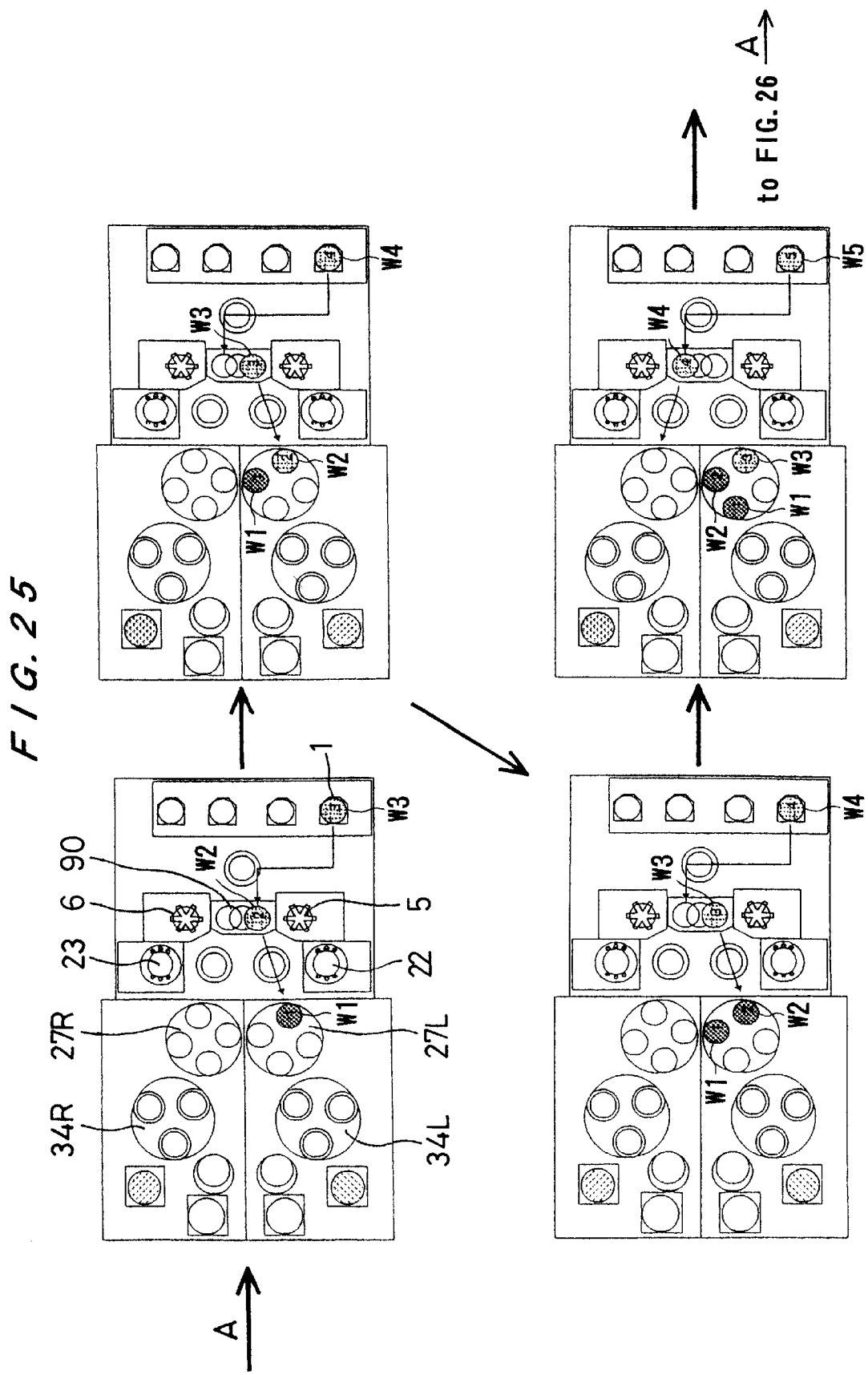
FIG. 25 is a diagram illustrative of the wafer processing route in the polishing apparatus shown in FIGS. 1 though 23.
Figure 26:
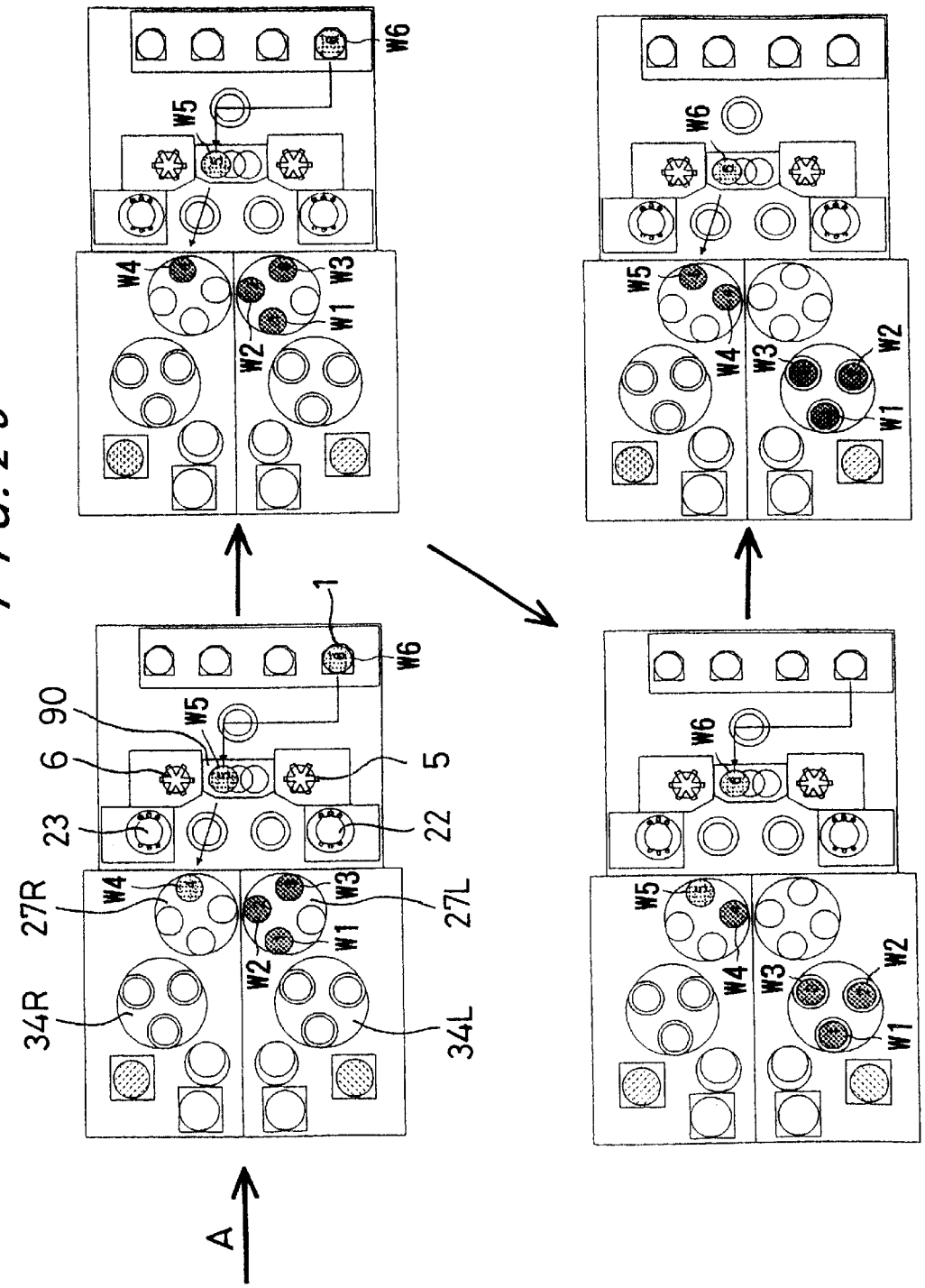
FIG. 26 is a diagram illustrative of the wafer processing route in the polishing apparatus shown in FIGS. 1 though 23.
Figure 27:
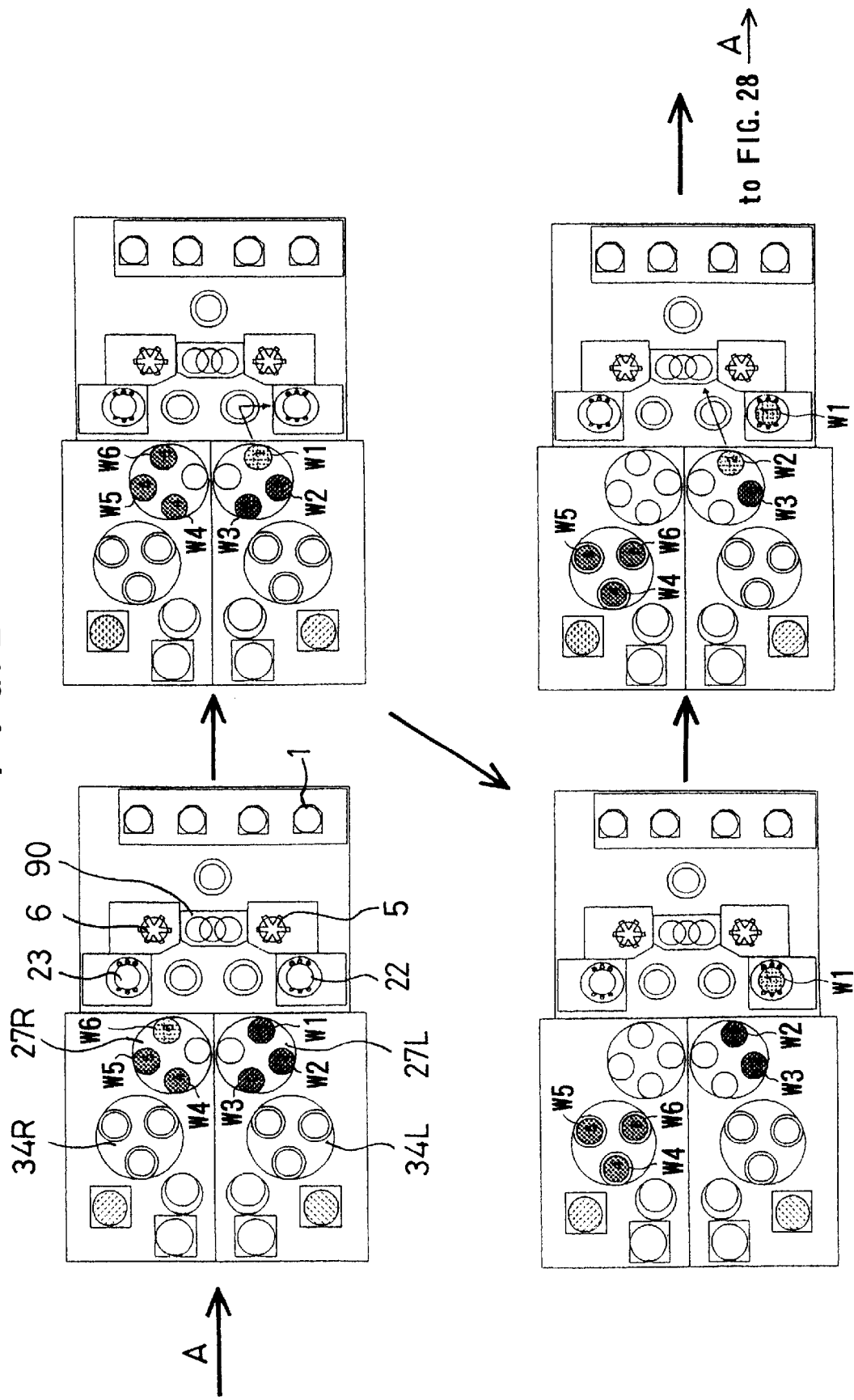
FIG. 27 is a diagram illustrative of the wafer processing route in the polishing apparatus shown in FIGS. 1 though 23.
Figure 28:
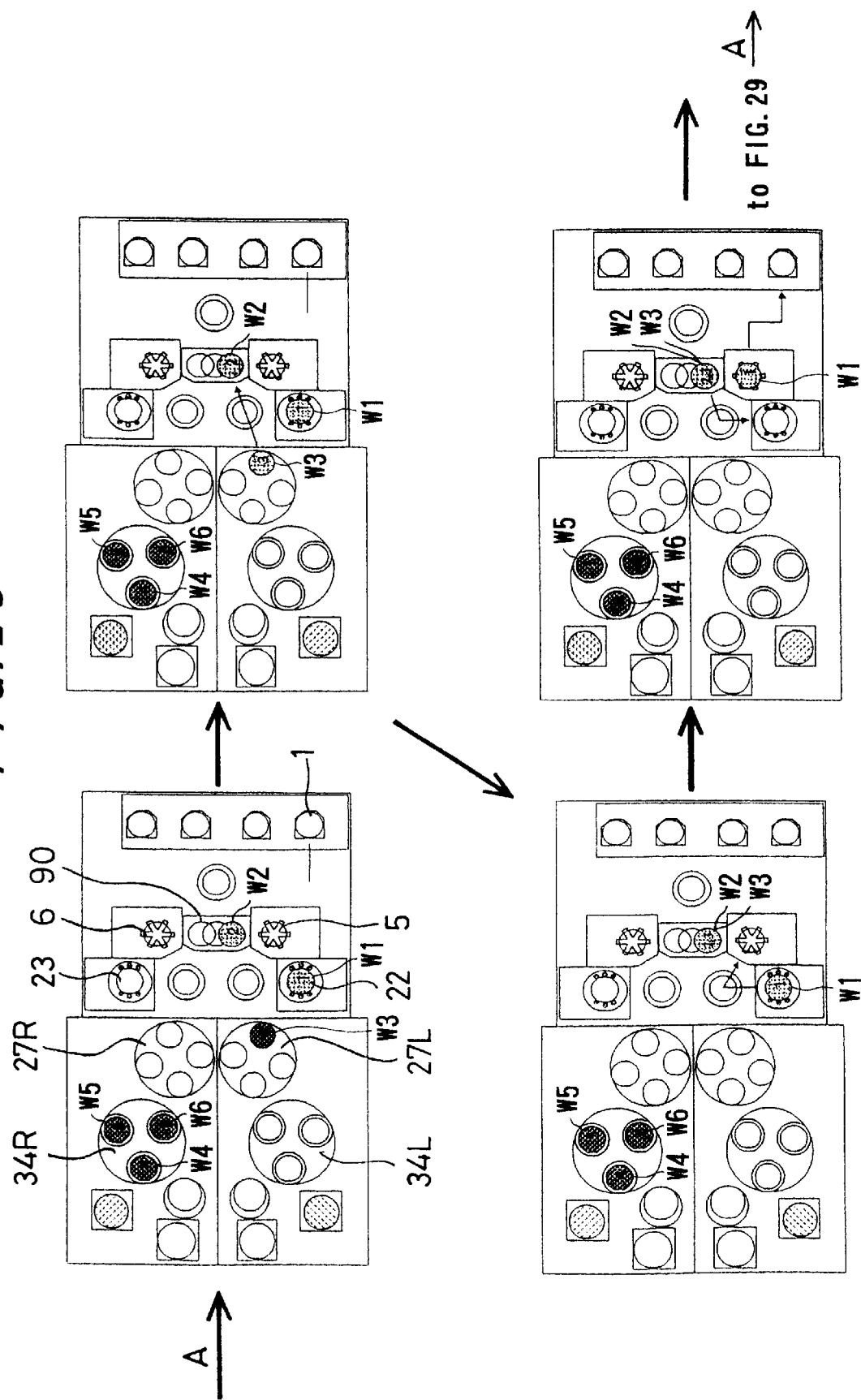
FIG. 28 is a diagram illustrative of the wafer processing route in the polishing apparatus shown in FIGS. 1 though 23.
Figure 30:
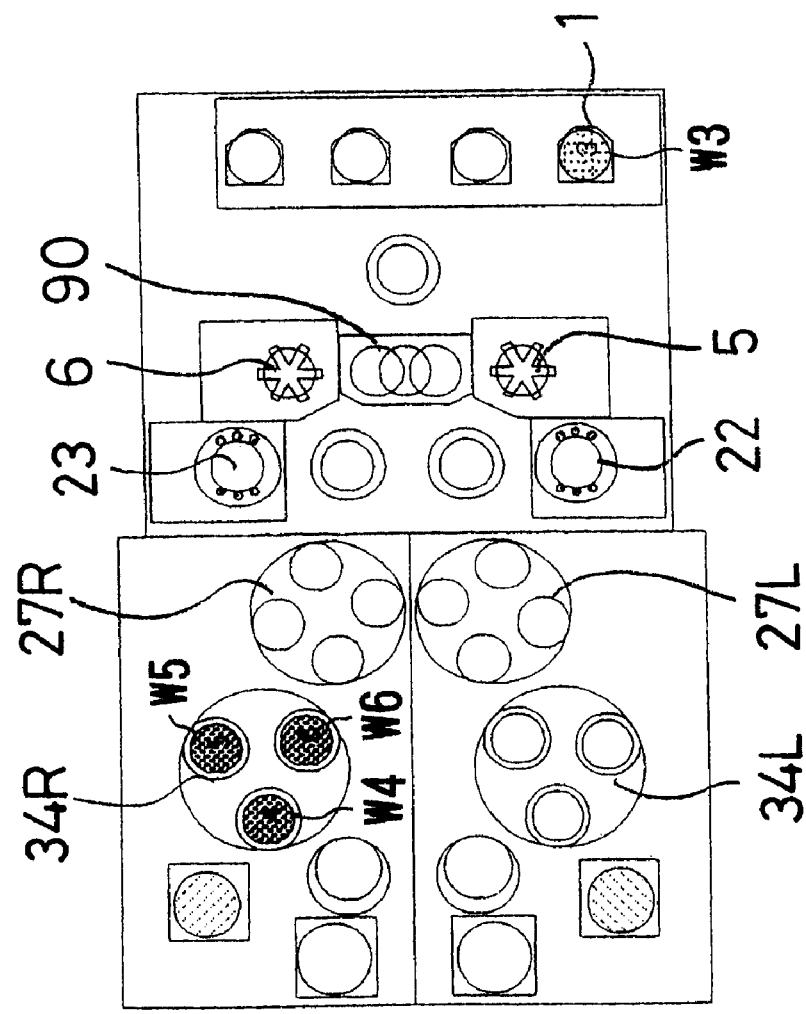
FIG. 30 is a diagram illustrative of the wafer processing route in the polishing apparatus shown in FIGS. 1 though 23.
Figure 31:
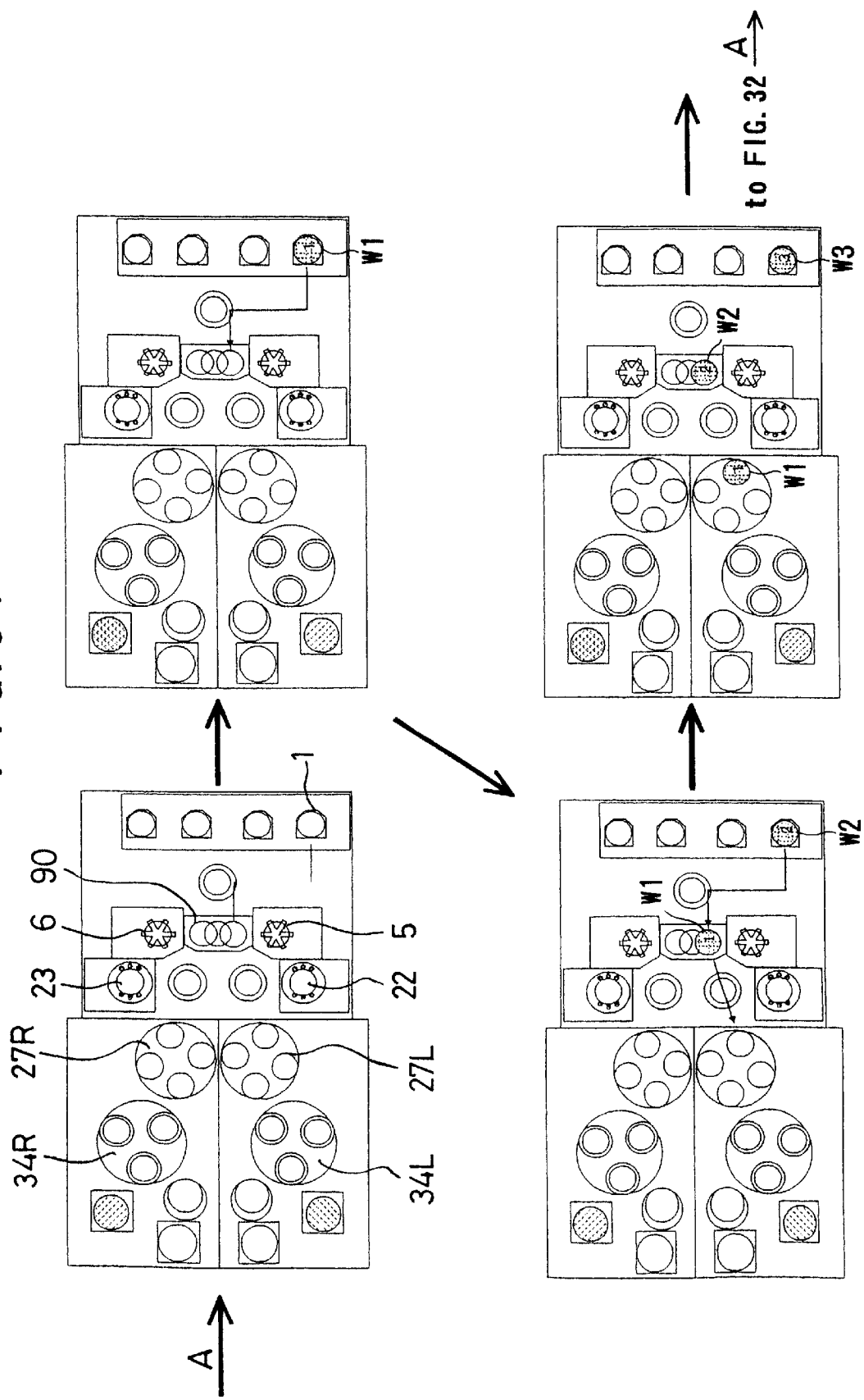
FIG. 31 is a schematic diagram illustrative of an example of a process of parallel polishing and three-stage cleaning.
Figure 32:
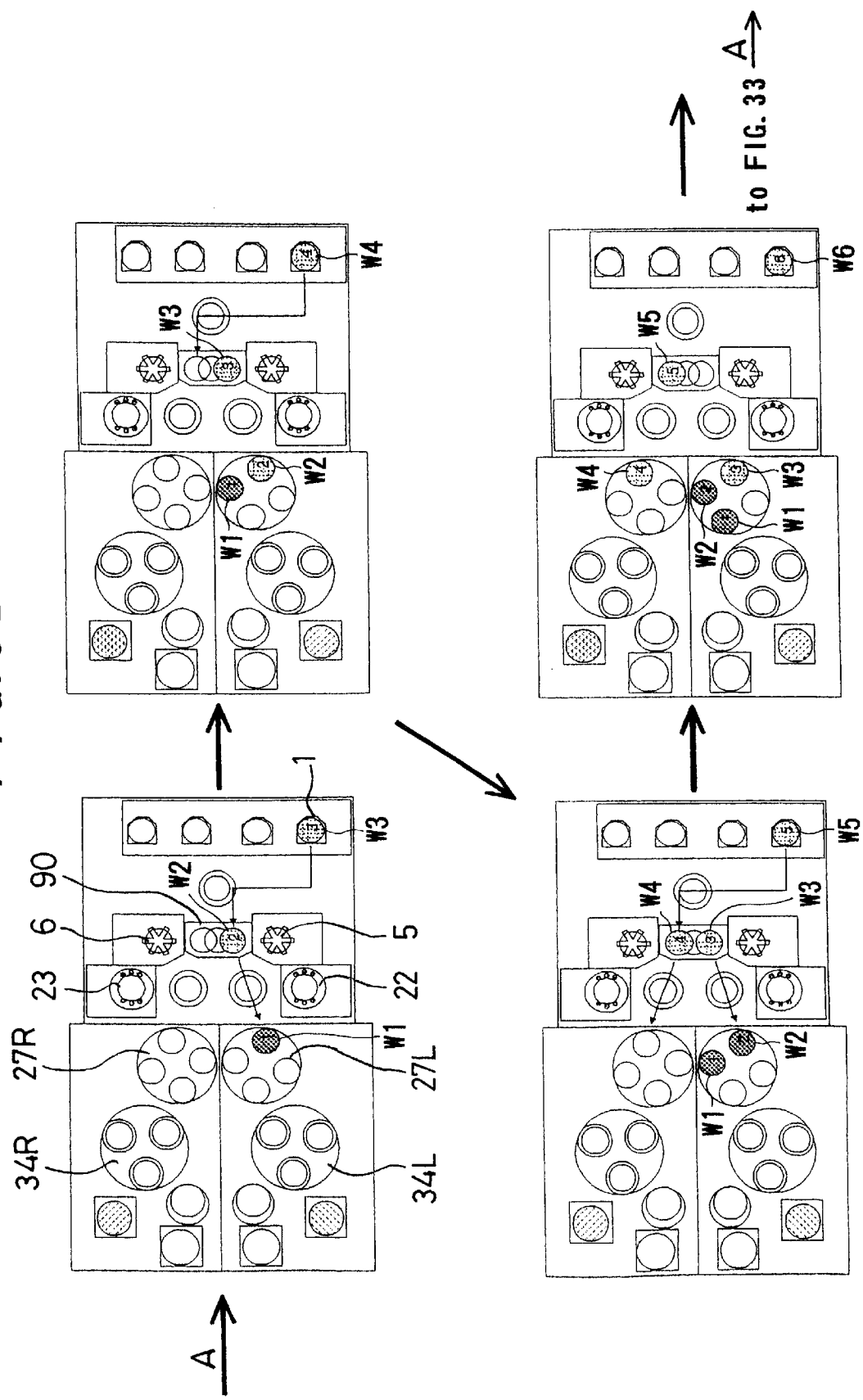
FIG. 32 is a schematic diagram illustrative of the example of the process of parallel polishing and three-stage cleaning.
Figure 33:
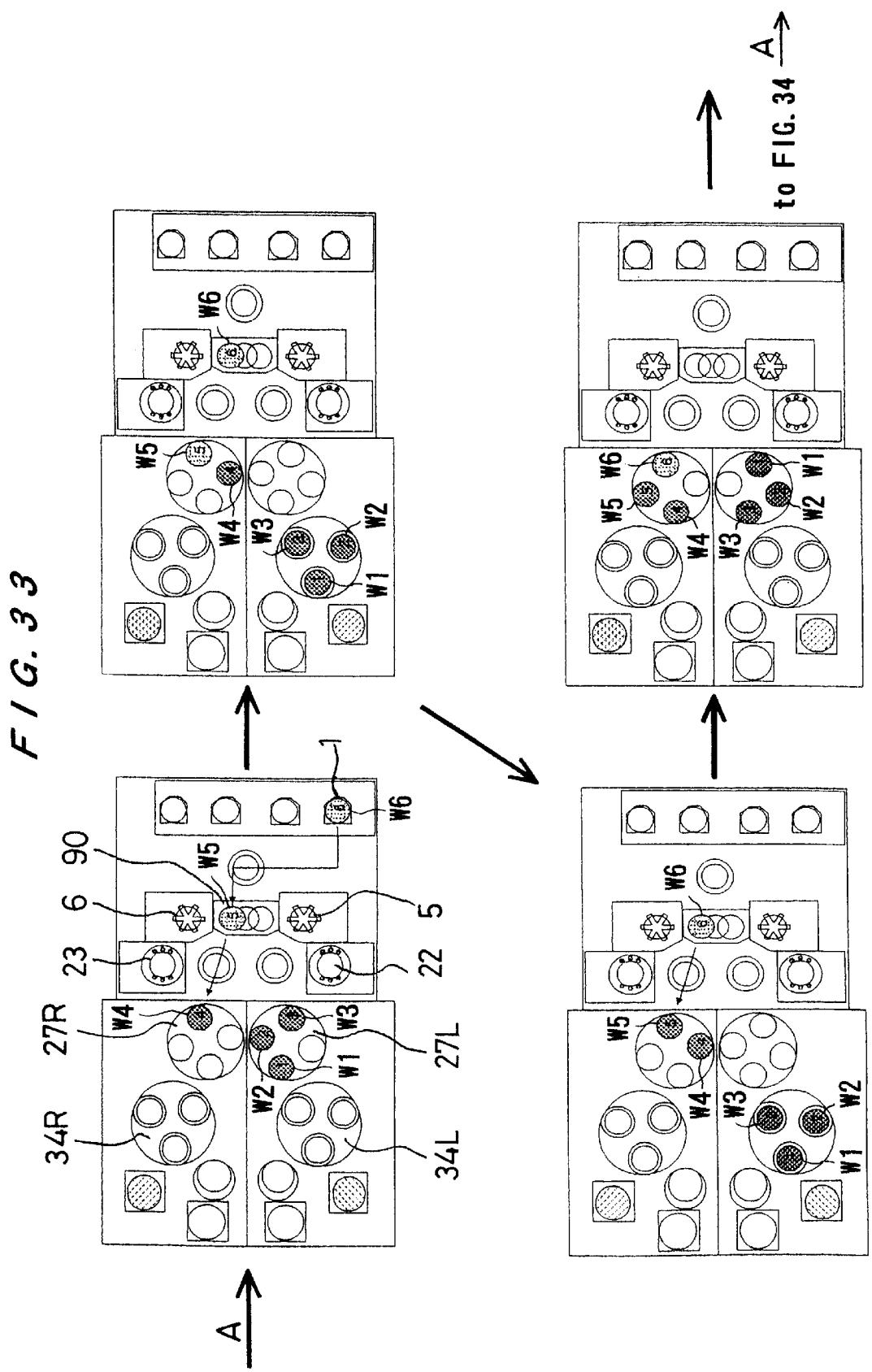
FIG. 33 is a schematic diagram illustrative of the example of the process of parallel polishing and three-stage cleaning.
Figure 36:
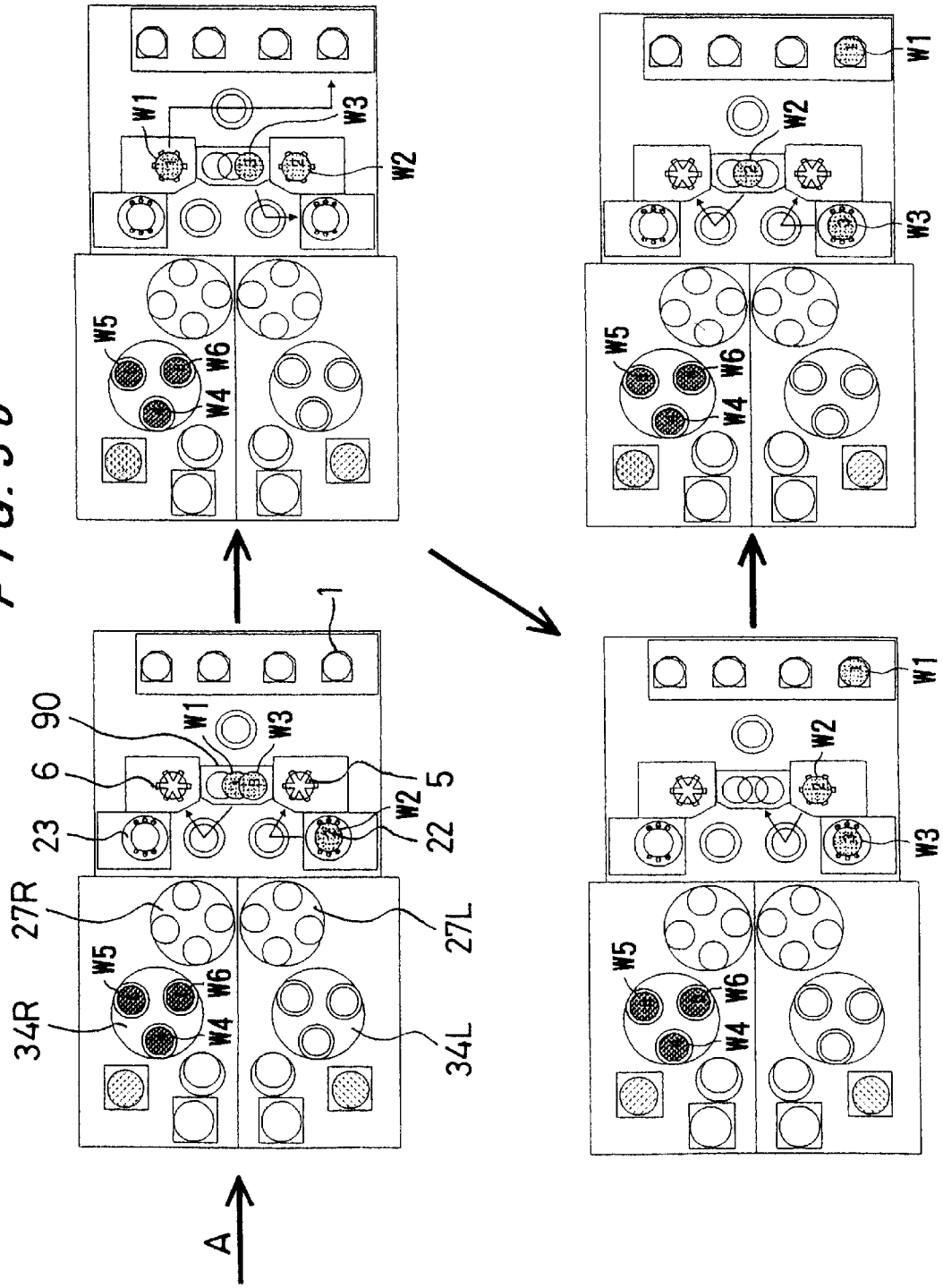
FIG. 36 is a schematic diagram illustrative of the example of the process of parallel polishing and three-stage cleaning.
Figure 37:
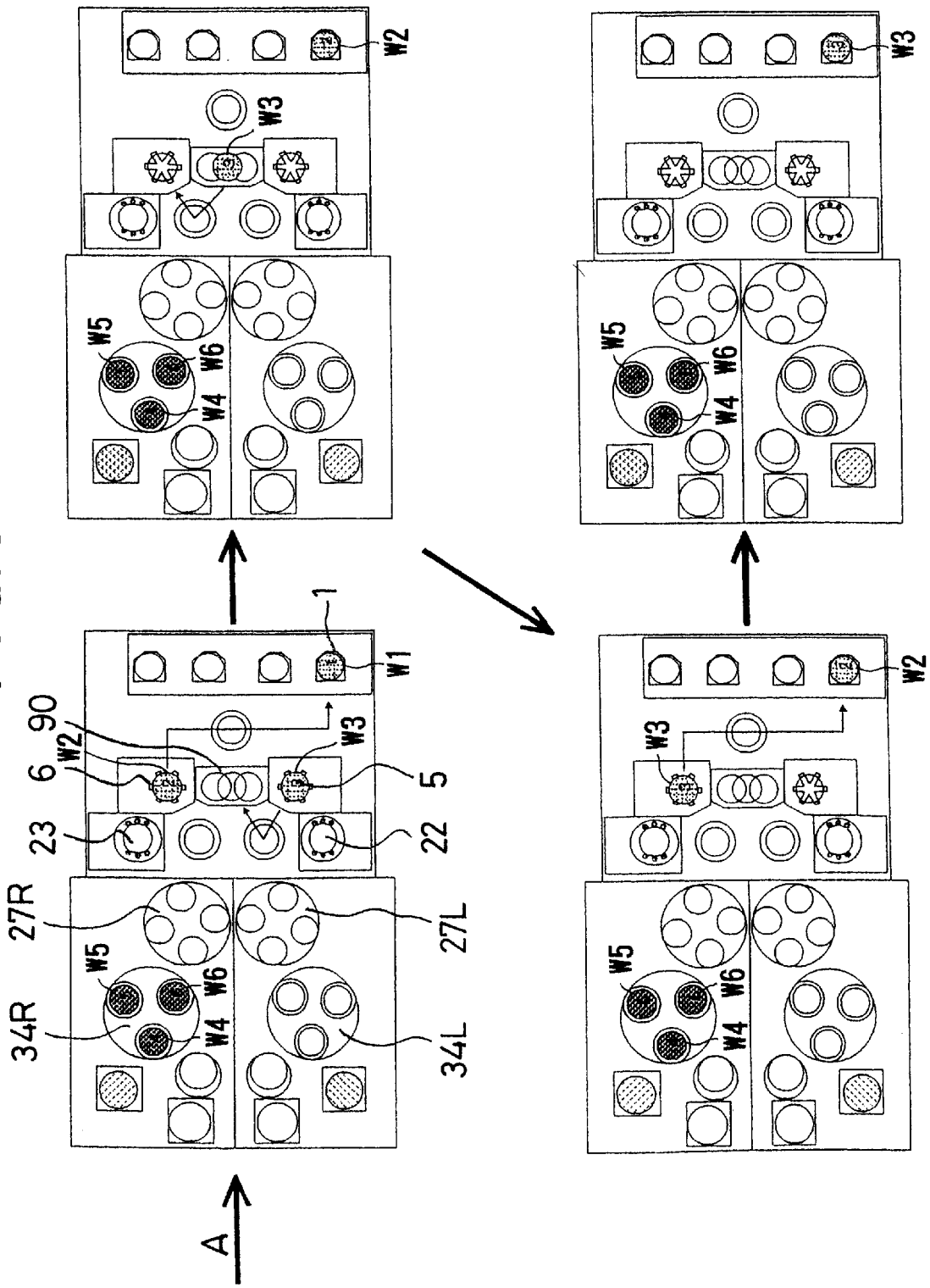
FIG. 37 is a schematic diagram illustrative of the example of the process of parallel polishing and three-stage cleaning.
Figure 38:
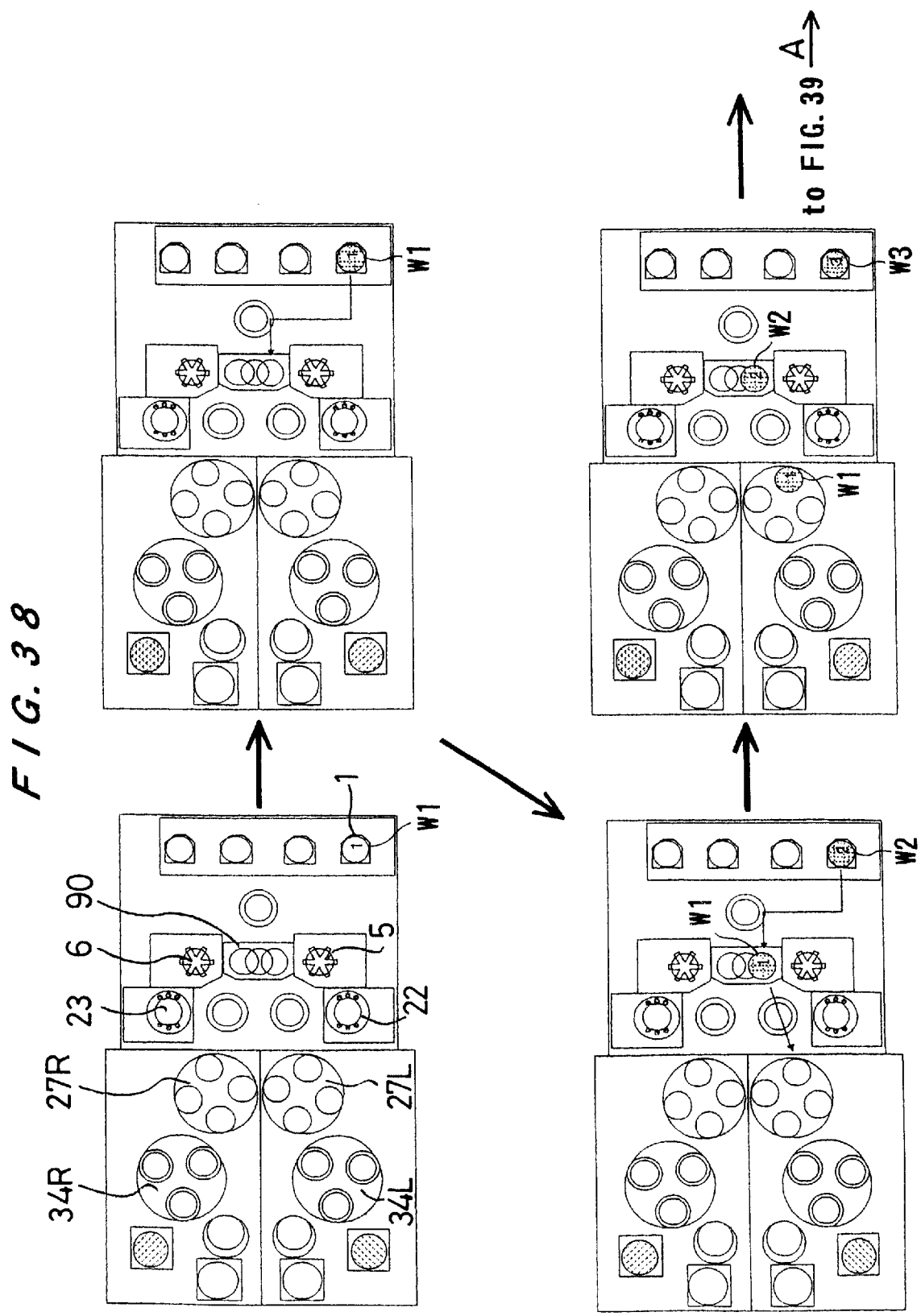
FIG. 38 is a schematic diagram illustrative of an example of a process of serial polishing and two-stage cleaning.
Figure 39:
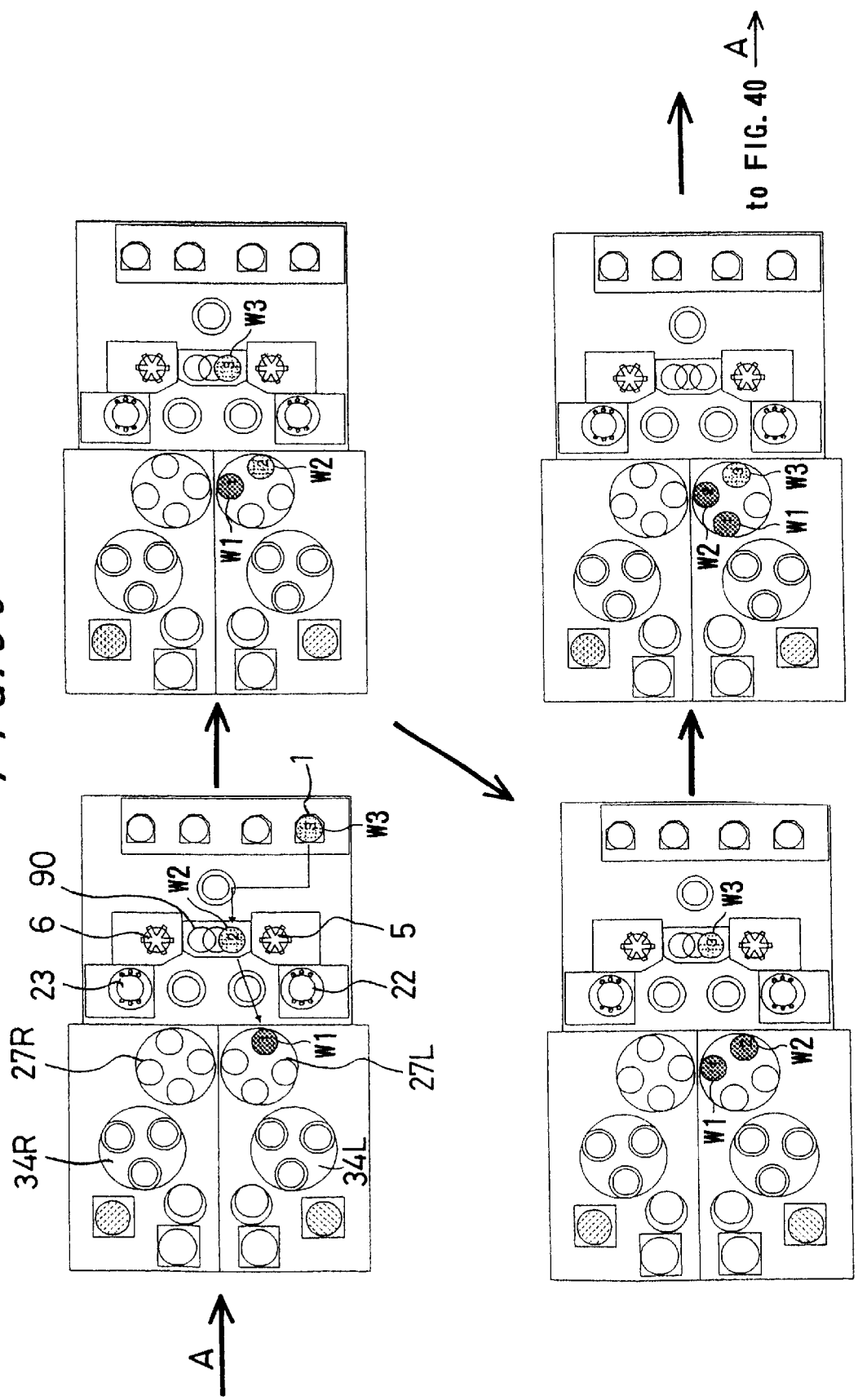
FIG. 39 is a schematic diagram illustrative of the example of the process of serial polishing and two-stage cleaning.
Figure 43:
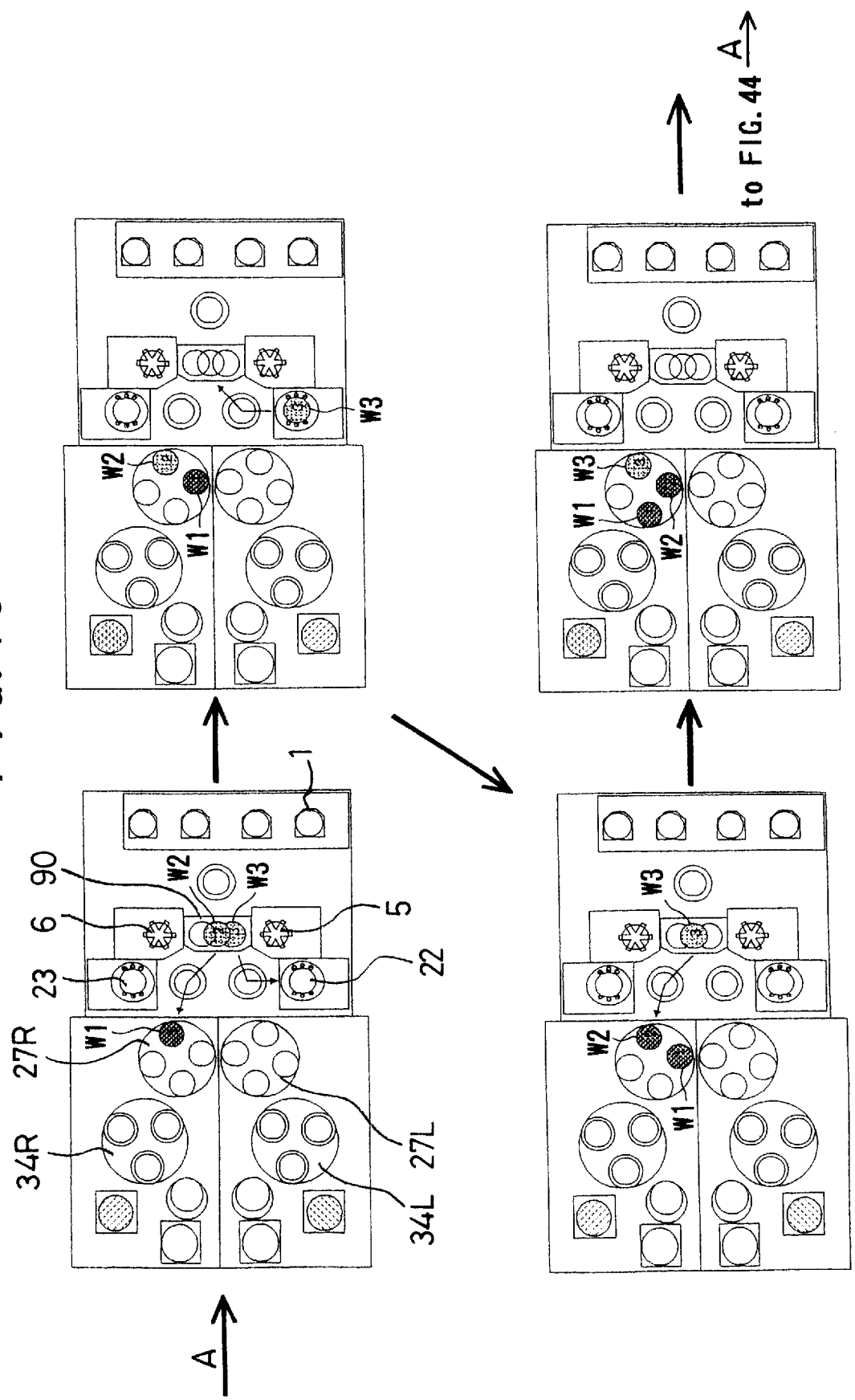
FIG. 43 is a schematic diagram illustrative of the example of the process of serial polishing and two-stage cleaning.
Figure 44:
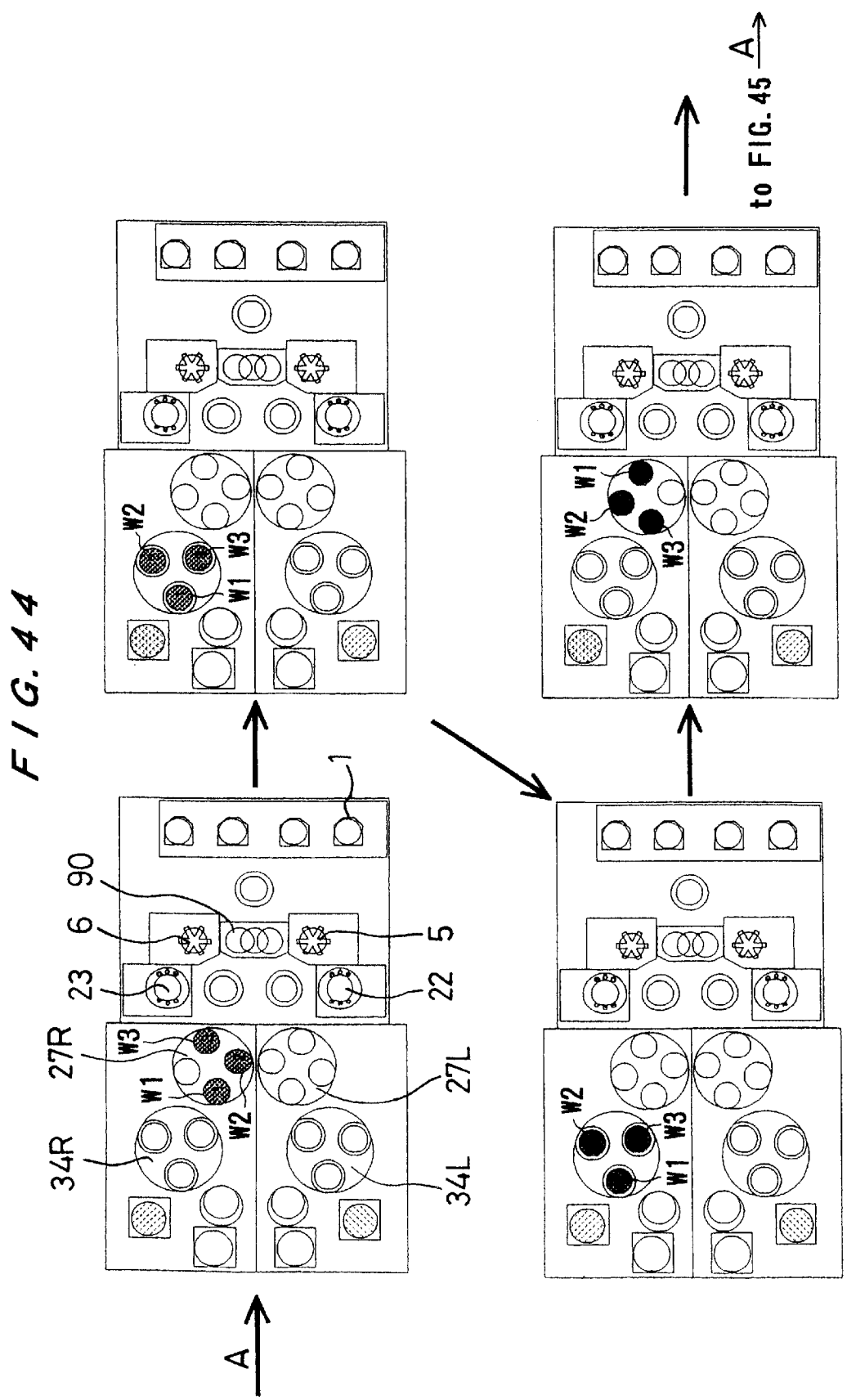
FIG. 44 is a schematic diagram illustrative of the example of the process of serial polishing and two-stage cleaning.
Figure 46:
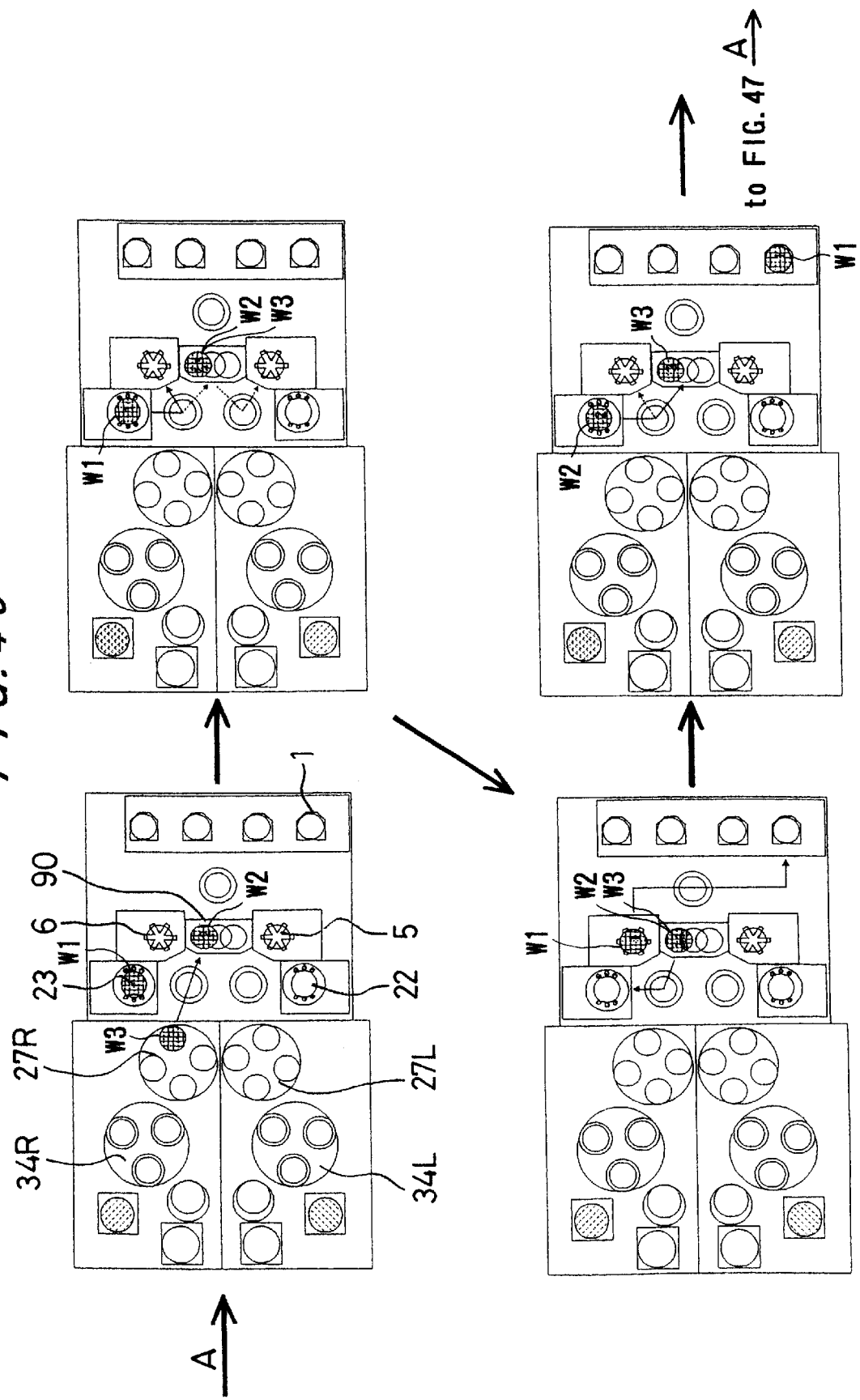
FIG. 46 is a schematic diagram illustrative of the example of the process of serial polishing and two-stage cleaning.
Figure 47:
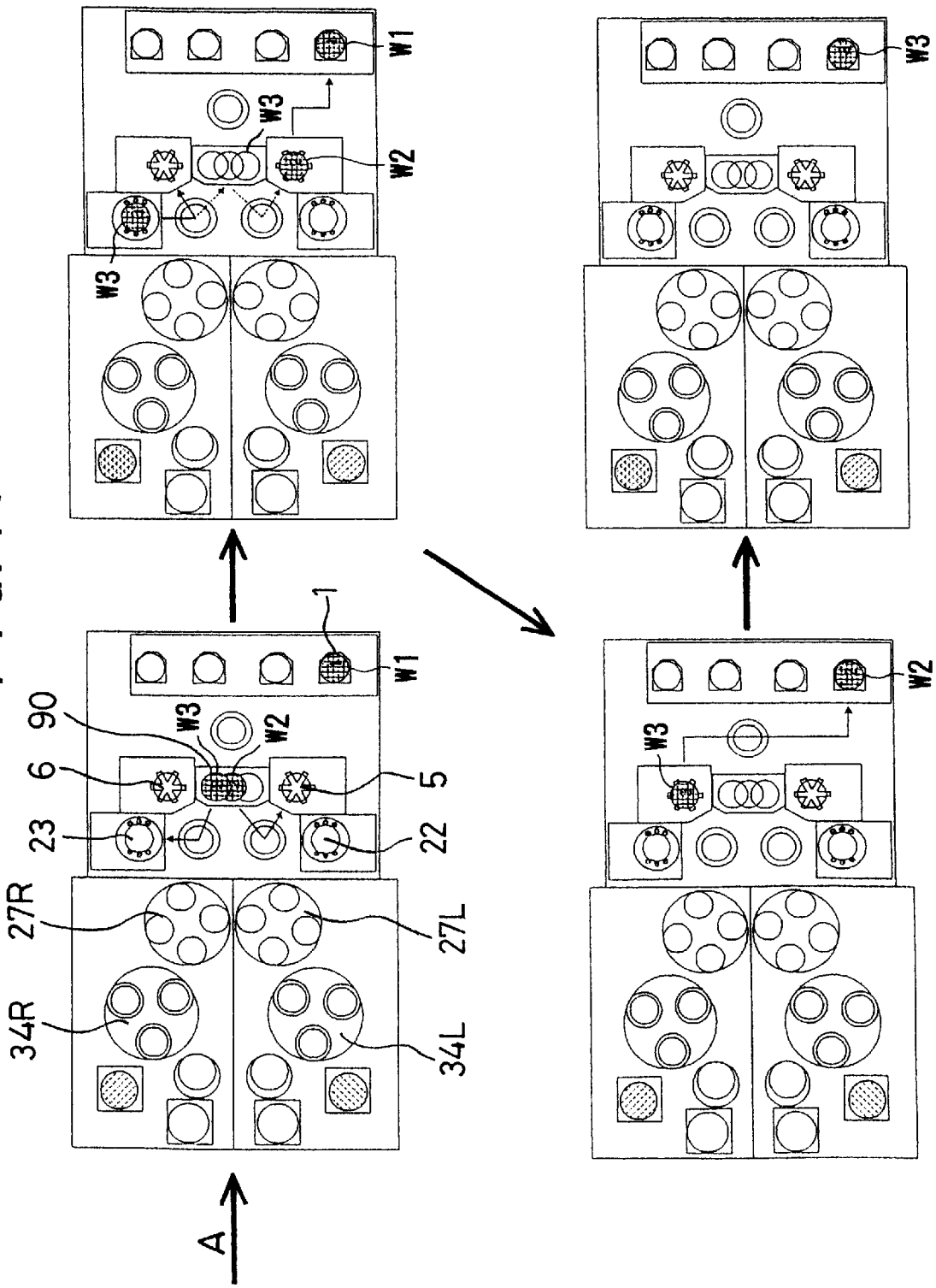
FIG. 47 is a schematic diagram illustrative of the example of the process of serial polishing and two-stage cleaning.
Figure 49:
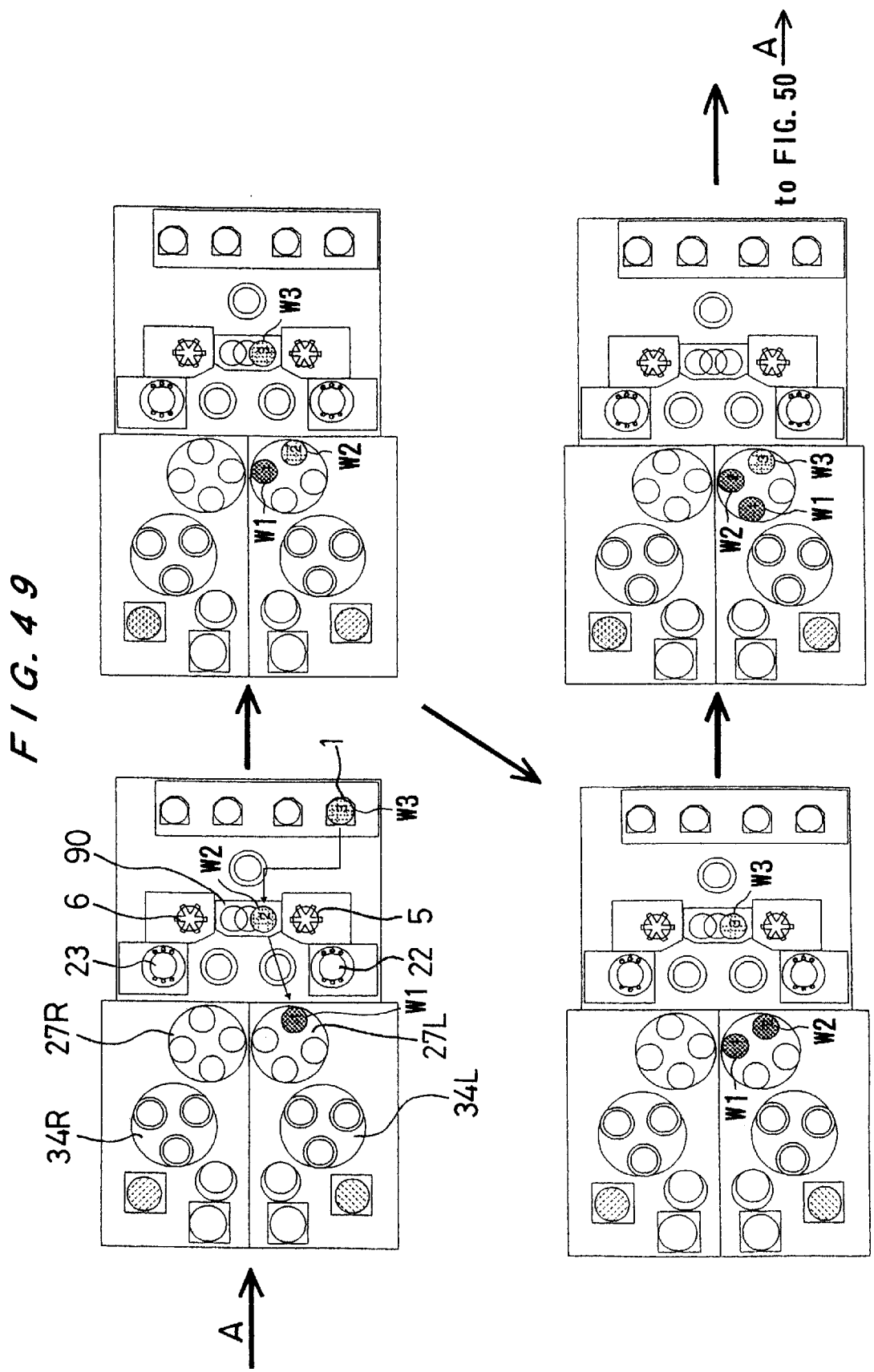
FIG. 49 is a schematic diagram illustrative of the example of the process of serial polishing and three-stage cleaning.
Figure 50:
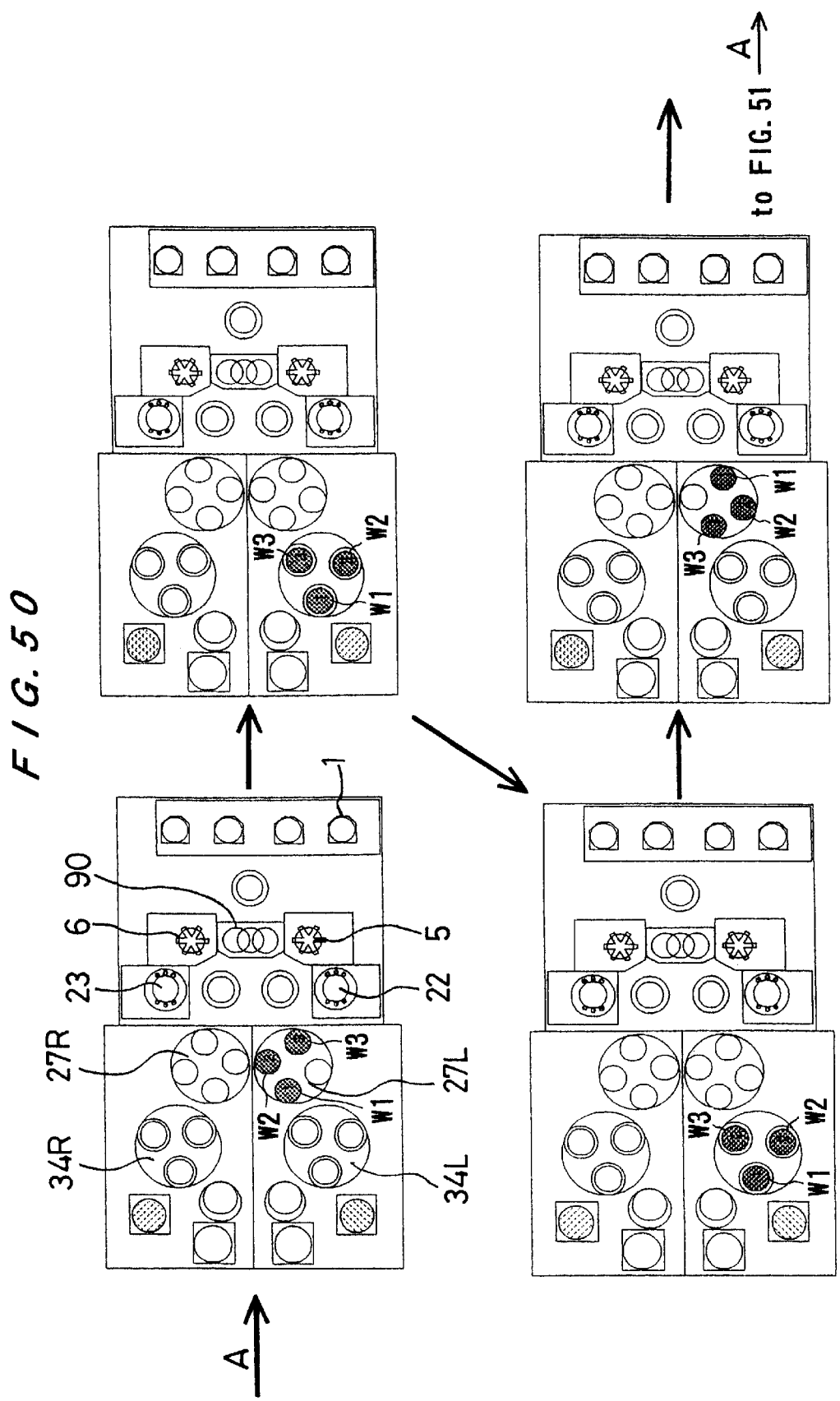
FIG. 50 is a schematic diagram illustrative of the example of the process of serial polishing and three-stage cleaning.
Figure 52:
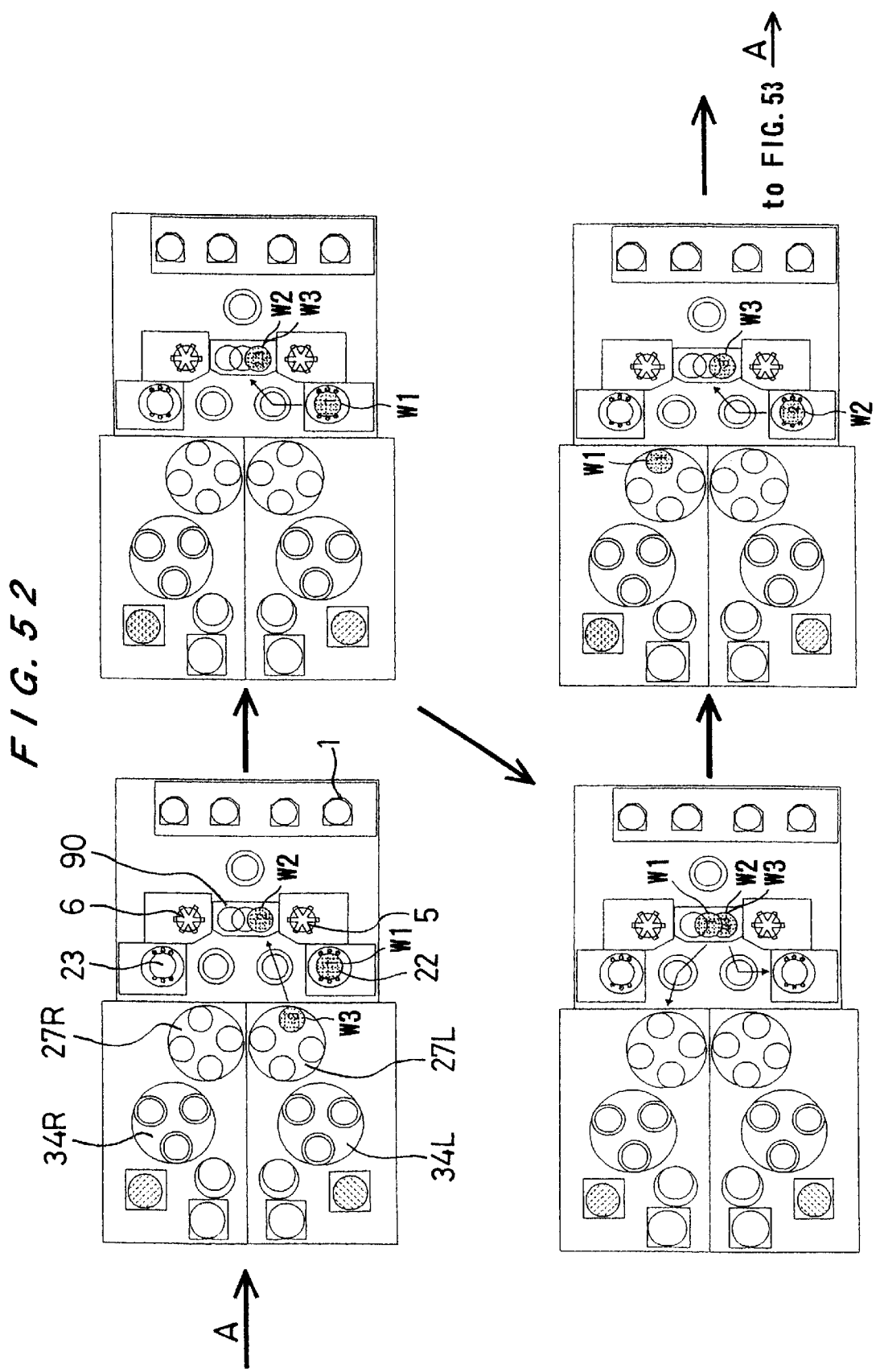
FIG. 52 is a schematic diagram illustrative of the example of the process of serial polishing and three-stage cleaning.
Figure 54:
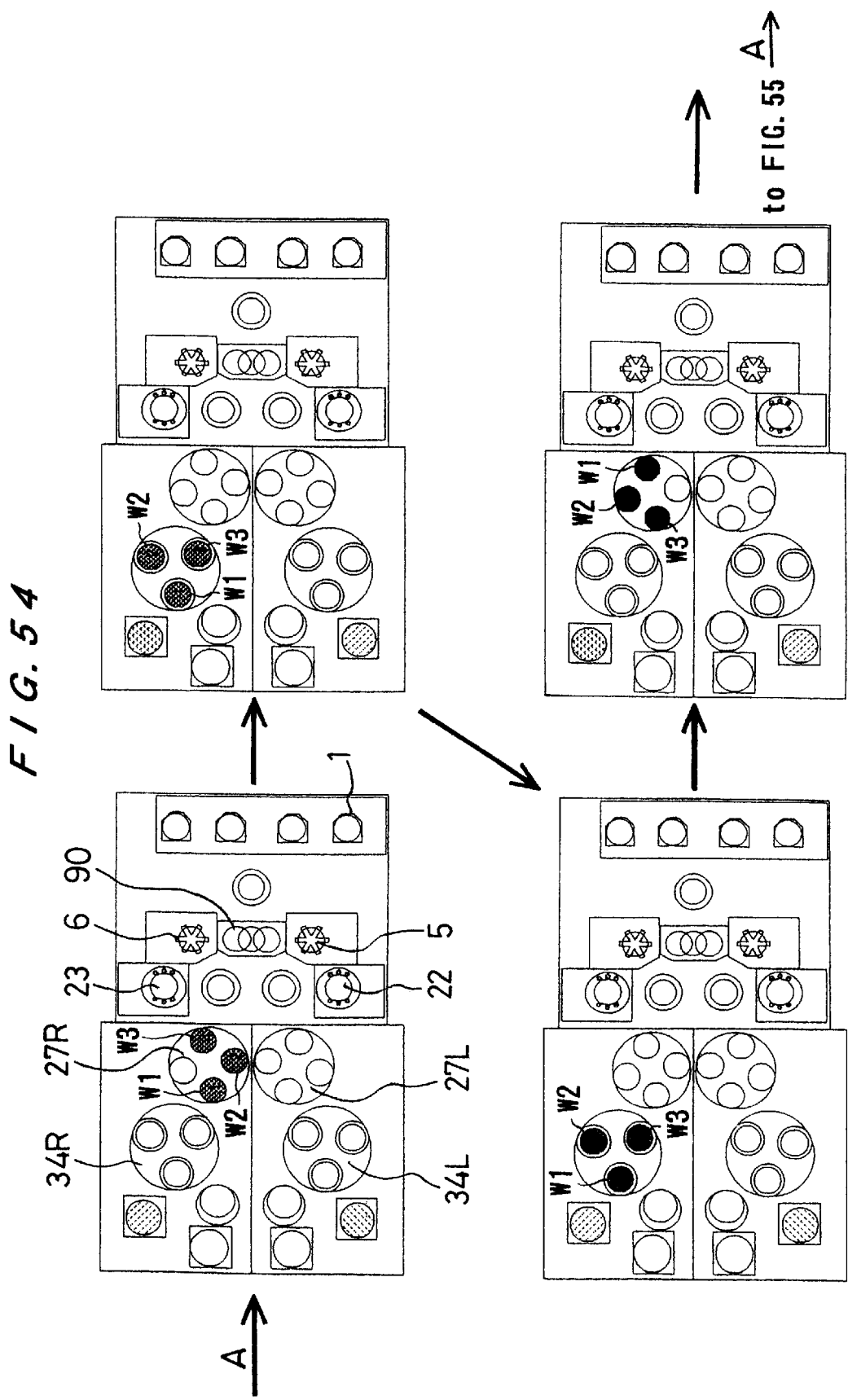
FIG. 54 is a schematic diagram illustrative of the example of the process of serial polishing and three-stage cleaning.
Figure 55:
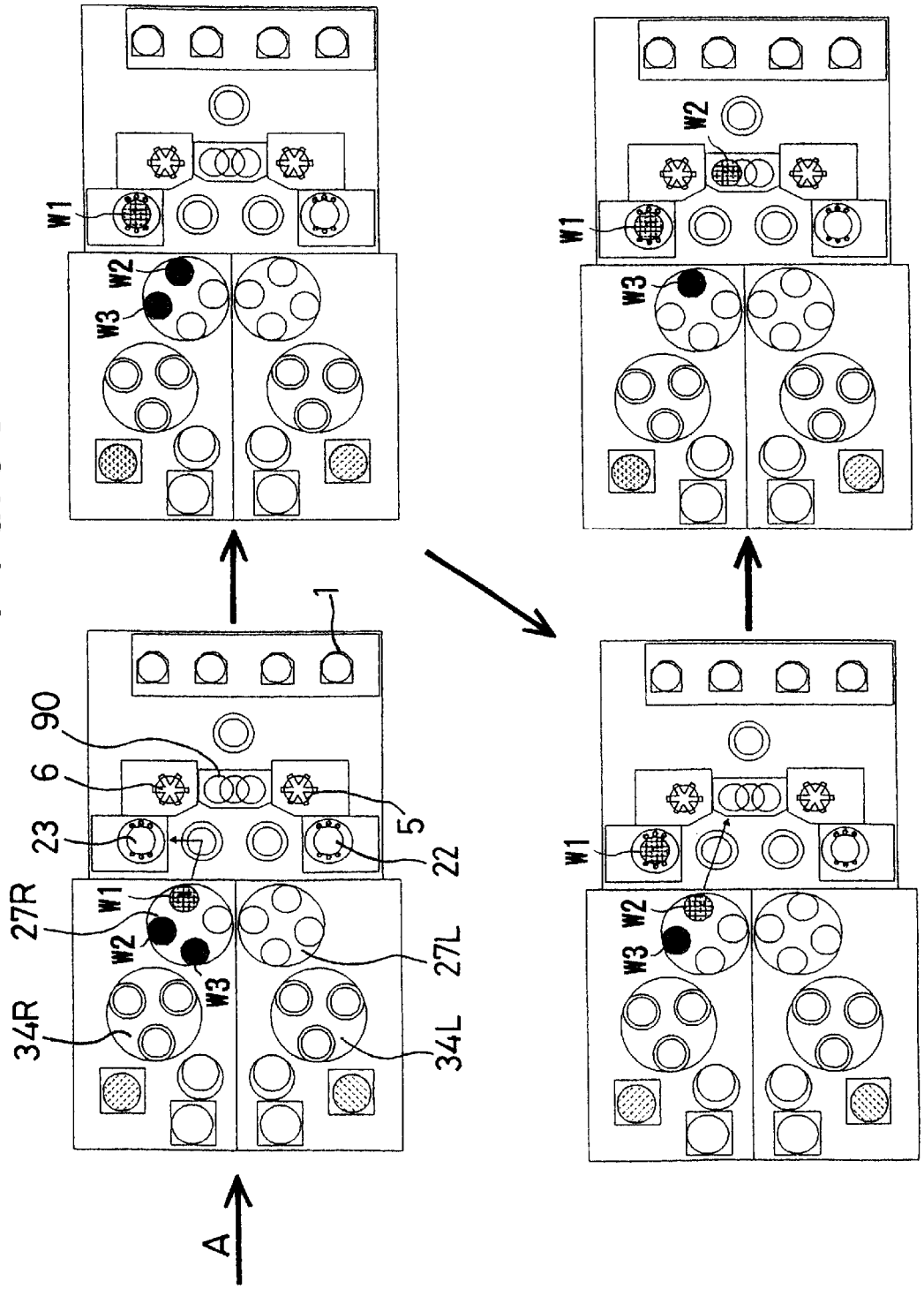
FIG. 55 is a schematic diagram illustrative of the example of the process of serial polishing and three-stage cleaning.
Figure 57:
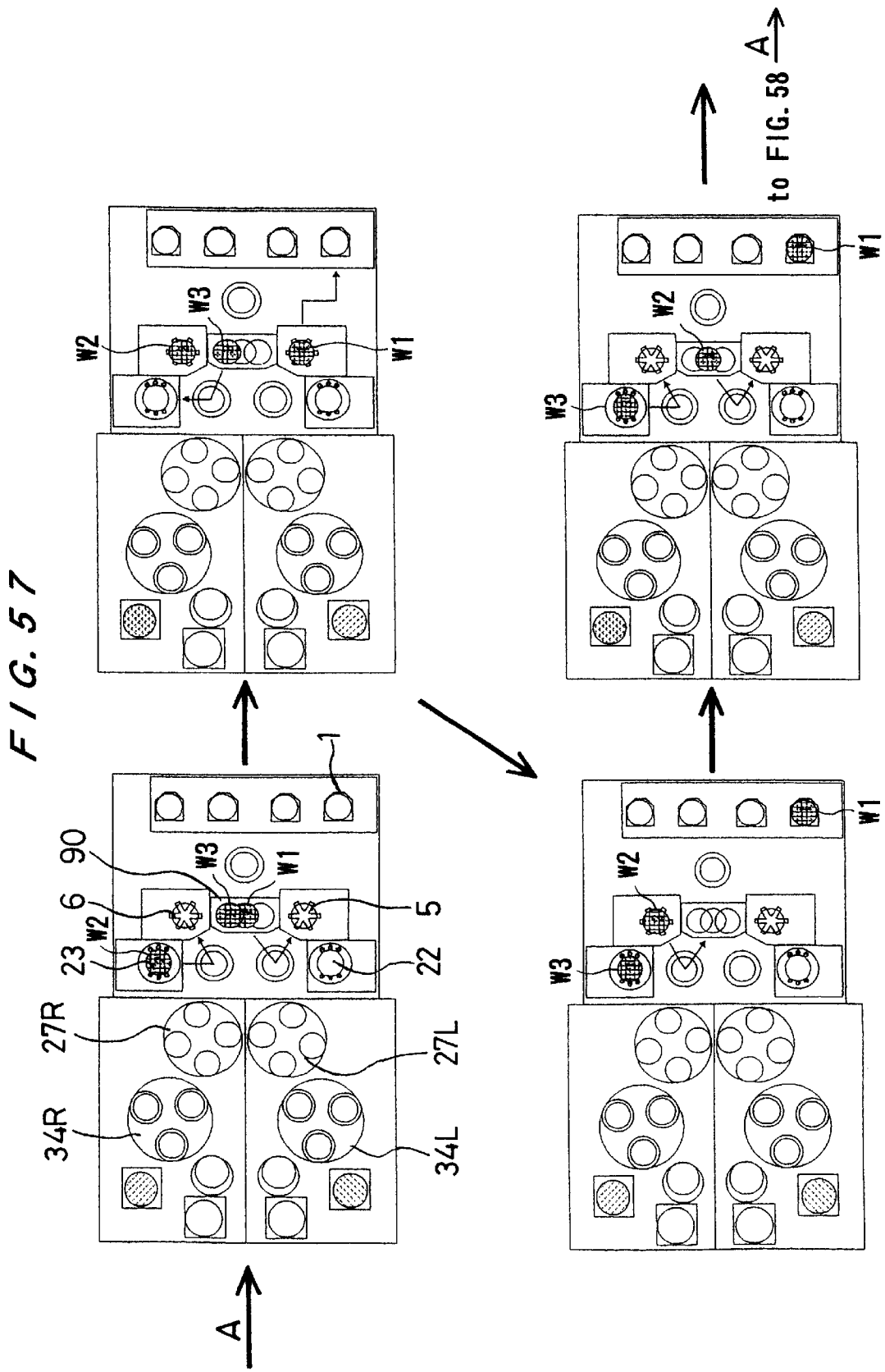
FIG. 57 is a schematic diagram illustrative of the example of the process of serial polishing and three-stage cleaning.
Figure 58:
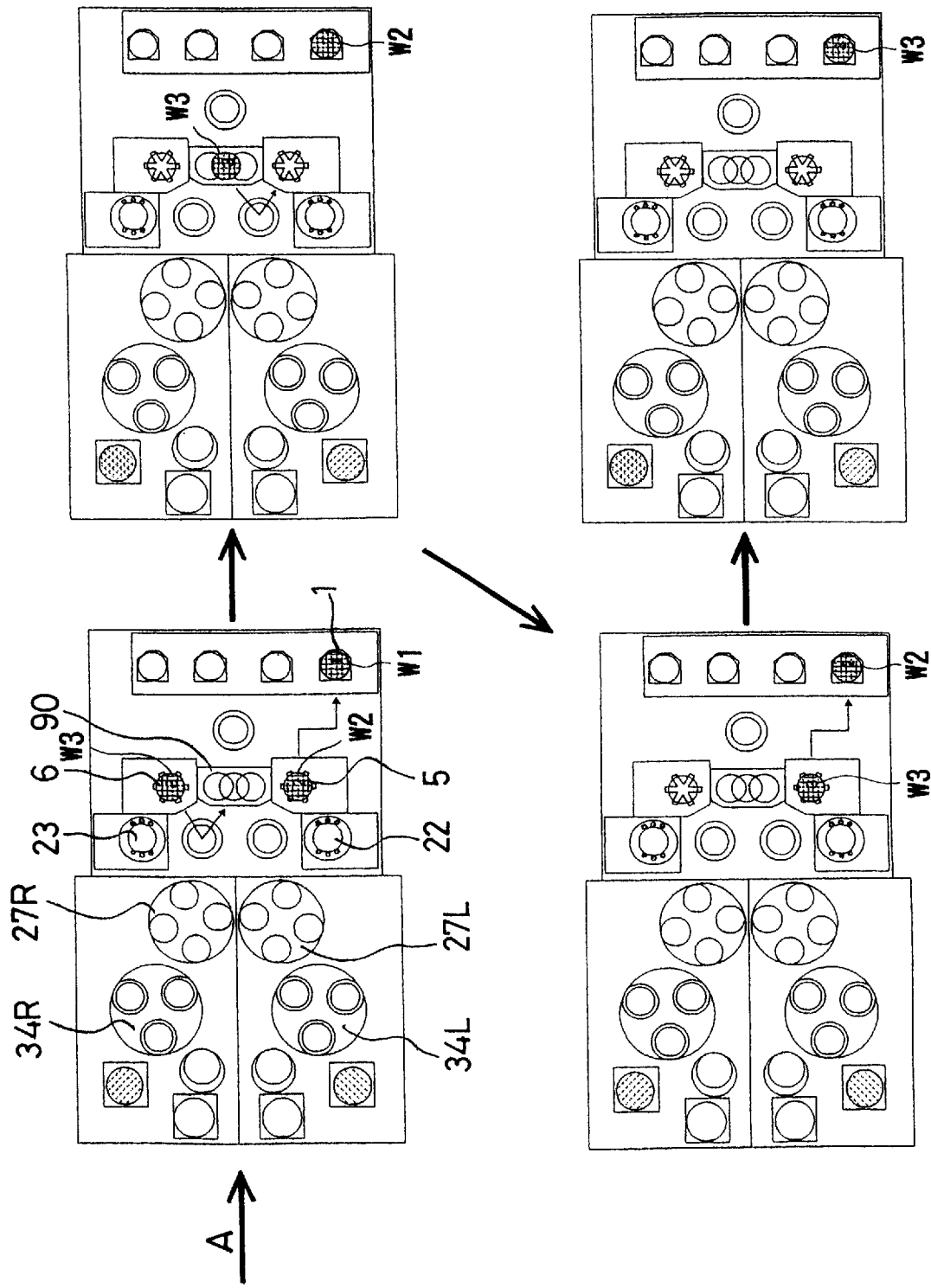
FIG. 58 is a schematic diagram illustrative of the example of the process of serial polishing and three-stage cleaning.

FIGS. 21A and 21B show the wafer station, wherein FIG. 21A is a front elevational view of the wafer station and FIG. 21B is a side elevational view of the wafer station. FIG. 22A is a view of the wafer station as viewed in the direction indicated by the arrow I of FIG. 21A, FIG. 22B is a view of the wafer station as viewed in the direction indicated by the arrow II of FIG. 21A, FIG. 22C is a view of the wafer station as viewed in the direction indicated by the arrow III of FIG. 21A, FIG. 22D is a view of the wafer station as viewed in the direction indicated by the arrow IV of FIG. 21A, and FIG. 22E is a view of the wafer station as viewed in the direction indicated by the arrow V of FIG. 21A. Further, FIGS. 23A through FIG. 23C are views showing a manner in which the wafer station operates.

As shown in FIGS. 21A and 21 B, the wafer station 90 comprises nine stages of wafer trays T1 through T9 which are arranged in descending order. The nine stages of the wafer trays T1 to T9 are integrated into a single tray unit, and a plurality of posts (guide posts) 91 extending downwardly are provided at a lower portion of the single tray unit.

A plurality of the posts 91 are vertically movably supported, through guides 93 each having a plain bearing therein, by a wafer station base 92 fixed to a cleaning base. The lower part of the tray unit and an upper surface of the wafer station base are coupled by a ball screw 94, and the ball screw 94 is rotated by a servomotor 95. By energizing the servomotor 95, the wafer tray is positionally fixed at a predetermined height.

The nine stages of the wafer trays T1 to T9 are arranged in descending order as follows:

T1: dummy wafers R1 and L1 (two wafers on the right and left sides)

T2: dummy wafers R2 and L2 (two wafers on the right and left sides)

T3: dummy wafers R3 and L3 (two wafers on the right and left sides)

T4: wafers R and L to be polished (two wafers on the right and left sides)

T5: wafers R1 and L1 after polishing and before cleaning (two wafers on the right and left sides)

T6: wafers R2 and L2 after polishing and before cleaning (two wafers on the right and left sides)

T7: a wafer after a primary cleaning in a three-stage cleaning, R side→L side (one wafer)

T8: a wafer after a primary cleaning in a three-stage cleaning, L side→R side (one wafer)

T9: for reservation

The function of the respective wafer trays are as follows:

The wafer trays T1, T2 and T3 accommodate dummy wafers which are used for running-in of a polishing pad on the polishing table. As described above, the three top rings 32L and the three top rings 32R correspond to the two polishing tables 34L and 34R, respectively.

The dummy wafers R1 to R3 and L1 to L3 in the wafer trays T1, T2 and T3 are assigned to the respective three top rings 32L and 32R. Although it is not necessary to supply a new wafer each time running-in of the apparatus is conducted, a new dummy wafer should be replaced at a certain interval. At this time, new dummy wafers for replacement are accommodated in any one of four wafer cassettes, and such wafer cassette containing the dummy wafers therein is placed on the load-unload stage 2. Then, the transfer robot 4 takes out a new dummy wafer for replacement from the wafer cassette, and a used dummy wafer in the wafer station 90 is replaced with the new dummy wafer.

Further, the transfer robot 4 takes out the dummy wafer placed in the wafer station 90 and places the dummy wafers on the wafer tray T4 one by one (in this case, the dummy wafer tray of the wafer station 90 is regarded just like a kind of wafer cassette). Thereafter, the transfer robot 20 and the transfer robot 21 transfer the respective dummy wafers from the wafer tray T4 to the respective rotary transporters 27L and 27R. After polishing of the dummy wafers, the dummy wafers are transferred to the cleaning apparatus 22 or 23, and to the cleaning apparatus 5 or 6, and then returned to the original positions of the wafer trays T1 to T3 by the transfer robots 20 and 21.

The tray T4 serves as temporary placing positions, one of which is for placement of the wafer R or L before polishing to be transferred from the transfer robot 4 to the transfer robot 20 (or 21), and the other of which is for placement of the wafer R or L before polishing to be transferred from the transfer robot 21 (or 20) to the transfer robot 4.

The wafer tray T5 for placement of the wafers R1 and L1 after polishing and before cleaning (two wafers on the right and left side), the wafer tray T6 for placement of the wafers R2 and L2 after polishing and before cleaning (two wafers on the right and left side), the wafer tray T7 for placement of the wafer after a primary cleaning in the three-stage cleaning, R side→L side (one wafer), and the wafer tray T8 for placement of the wafer after a primary cleaning in the three-stage cleaning, L side→R side (one wafer) will be described in the wafer processing routes (described later).

Predetermined heights of the wafer trays T1 to T9 which are positionally fixed are set to three positions. As shown in FIG. 23A, a first position is a lowermost position of the tray unit. In the first position, the transfer robot 4 can access four stages of the wafer trays, i.e. the wafer trays T1, T2 and T3 for dummy wafers and the wafer tray T4 for the wafers to be polished, and the transfer robots 20 and 21 can access the wafer tray T4 for the wafers to be polished.

As shown in FIG. 23B, a second position is an intermediate height position of the tray unit. In the second position, the transfer robots 20 and 21 can access three stages of wafer trays, i.e. the wafer tray T4 for the wafers to be polished and the wafer trays T5 and T6 for the wafers after polishing and before cleaning.

As shown in FIG. 23C, a third position is an uppermost position of the tray unit. In the third position, the transfer robots 20 and 21 can access three stages of wafer trays, i.e. the wafer trays T7 and T8 for the wafers after a primary cleaning in the three-stage cleaning, and the wafer tray T9 for reservation.

In the second and third positions, the transfer robot 4 cannot access the wafer trays of the wafer station 90 (there is no need to access). In the wafer trays T5 to T8 (or T9), five faces are surrounded by a resin plate, except for a face through which the transfer robots 20 and 21 access the wafers. In the face through which the robot accesses the wafers, there is provided a shutter 401 which is vertically closable and openable by an air cylinder 400, and is opened only when the robot accesses the wafers.

Since the wafer trays T5 to T8 (T9) are temporary placing positions for placement of the wafers until the wafers which have been polished are transferred to a subsequent process, there are provided nozzles 96 for spraying pure water or chemical liquid on front and back surfaces of the wafers so that the wafers are prevented from being dried, oxide films are prevented from being formed on these surfaces of the wafers by surrounding air, and these surfaces of the wafers are prevented from being etched by polishing liquid or cleaning liquid. In all of the wafer trays, there are provided sensors for detecting whether or not there is a semiconductor wafer in each of the wafer trays. Three drain pipes are provided in the wafer tray unit for draining pure water and chemical liquid which have been sprayed on the front and back surfaces of the semiconductor wafers. A first drain pipe is connected to the wafer tray T9 located at the lowermost position to serve as a draining pan for the entire wafer tray unit. A second drain pipe is attached to a lower portion of the wafer tray T8 to drain waste water from the wafer trays T7 and T8. A third drain pipe is connected to a lower portion of the wafer tray T6 to drain waste water from the wafer trays T5 and T6. The wafer trays T1 to T4 have no draining function because they are used in a dry atmosphere.

The reason why draining systems are separated in the manner described above is that if pure water or chemical liquid, which is used with the wafer trays T7 and T8 for placement of the wafers for the three stage cleaning, and with the wafer trays T5 and T6 for placement of the wafers after polishing and before cleaning, is different from each other, two kinds of chemical liquids are prevented from being mixed with each other, or pure water and a chemical liquid are prevented from being mixed with each other. The three drain pipes may be connected to a main drain pipe. Alternatively, depending on the kind of chemical liquid, the three drain pipes are separately connected to discrete plant drain utilities. Further, regarding chemical liquid treatment, the drain pipes may be connected to chemical liquid regeneration equipment or chemical liquid drain pipes in view of chemical properties. At this time, the same pipe may be used for chemical liquids having identical or similar chemical properties.

Next, cleaning apparatuses in the cleaning chamber will be described below.

Of the cleaning apparatuses incorporated in the polishing apparatus, the cleaning apparatuses 22 and 23 each have a roll-shaped sponge rotatable about its own axis and pressed against a semiconductor wafer to clean a reverse side of the semiconductor wafer. For cleaning a face side (polished surface) of the semiconductor wafer, the cleaning apparatuses 22 and 23 each may have a roll type cleaning mechanism for rotating and pressing a roll-shaped sponge against the semiconductor wafer, or a pencil type cleaning mechanism for rotating and pressing a hemispherical sponge against the semiconductor wafer. Either one of the two types can be selected. Further, a megasonic type cleaning mechanism for cleaning the semiconductor wafer with a cleaning liquid to which ultrasonic vibration is applied may be added. The cleaning apparatuses 22 and 23 serve mainly to remove particles from the semiconductor wafers. Regardless of the type of the cleaning apparatus, each of the cleaning apparatuses can supply three or more kinds of cleaning liquid to the face (polished surface) and reverse sides of the semiconductor wafer. The cleaning liquid may comprise pure water.

Each of the cleaning apparatuses 5 and 6 is capable of rinsing the reverse side of a semiconductor wafer. For cleaning the face side of the semiconductor wafer, the cleaning apparatuses 5 and 6 may simultaneously conduct cleaning by virtue of a pencil type cleaning mechanism that rotates and presses a hemispherical sponge against the semiconductor wafer, and cleaning by a megasonic type cleaning mechanism which cleans the semiconductor wafer with a cleaning liquid to which ultrasonic vibration is applied. Each of the cleaning apparatuses 5 and 6 can supply three or more kinds of cleaning liquid to the face (polished surface) and reverse sides of the semiconductor wafer. The cleaning liquid may comprise pure water. A stage for chucking a semiconductor wafer may be rotated at a high speed, and has a function for drying a cleaned wafer.

Instead of the megasonic type cleaning mechanism, each of the cleaning apparatuses may have a cavitation jet type cleaning mechanism that utilizes a cavitation effect in which cavitation is applied to a cleaning liquid, because such a cavitation jet type cleaning mechanism is as effective as the megasonic type.

As shown in FIG. 1, the cleaning apparatuses 5, 6, 22 and 23 have respective openings associated with respective shutters which can be opened only when semiconductor wafers are to be introduced therein or removed therefrom. Each of the cleaning apparatuses 5, 6, 22 and 23 has a plurality of cleaning liquid supply lines associated with constant-rate flow valves that can be controlled by air pressure. With the constant-rate flow valves combined with electropneumatic regulators for controlling air pressure, flow rates in the cleaning liquid supply lines can freely be established from a control panel. Cleaning liquids supplied to the cleaning apparatuses, and cleaning processes and cleaning times therefor can be set from the control panel.

Guides are mounted on a base of the cleaning chamber (area B), and the cleaning apparatuses are mounted in the guides, so that the cleaning apparatuses can easily be replaced with different type cleaning apparatuses. There are provided positioning mechanisms for placing replaced cleaning apparatuses in the same position.

Next, wafer processing routes in the polishing apparatus shown in FIGS. 1 through 23 will be described with reference to FIGS. 24 through 58.

Software is incorporated so that all units or devices can be freely combined and set in processing routes of semiconductor wafers in the polishing apparatus. For example, there are the following four routes:

(1) Parallel Polishing and Two-stage Cleaning

Three wafers are sequentially removed from a wafer cassette and transferred to the polishing table 34L for polishing thereof. In parallel, a subsequent three wafers are sequentially removed from the wafer cassette and transferred to the polishing table 34R for polishing thereof. After two sets of the three wafers are polished, they are transferred to two cleaning apparatuses successively to conduct two-stage cleaning.

(2) Parallel Polishing and Three-stage Cleaning

Three wafers are sequentially removed from a wafer cassette and transferred to the polishing table 34L for polishing thereof. In parallel, a subsequent three wafers are sequentially removed from the wafer cassette and transferred to the polishing table 34R for polishing thereof. After two sets of the three wafers are polished, they are transferred to three cleaning apparatuses successively to conduct three-stage cleaning.

(3) Serial Polishing and Two-stage Cleaning

Three wafers are sequentially removed from a wafer cassette and transferred to the polishing table 34L to conduct a primary polishing of the three wafers. After the primary polishing of the three wafers, the three wafers are transferred to the polishing table 34R to conduct a secondary polishing of the three wafers, and then the three wafers are transferred to two cleaning apparatuses successively to conduct two-stage cleaning.

(4) Serial Polishing and Three-stage Cleaning

Three wafers are sequentially removed from a wafer cassette and transferred to the polishing table 34L to conduct a primary polishing of the three wafers. After the primary polishing of the three wafers, the three wafers are transferred to the polishing table 34R to conduct a secondary polishing of the three wafers, and then the three wafers are transferred to three cleaning apparatuses successively to conduct three-stage cleaning.

FIGS. 24 through 30 are schematic diagrams showing processes of the above parallel polishing and two-stage cleaning.

As shown in FIGS. 24 through 30, three semiconductor wafers W1, W2 and W3 are processed successively in the following route: the wafer cassette 1→the wafer station 90 (wafer tray T4)→the rotary transporter 27L→the polishing table 34L→the rotary transporter 27L. Thereafter, the wafer W1 is processed in the following route: the cleaning apparatus 22→the cleaning apparatus 5→the wafer cassette 1. And, the wafers W2 and W3 are processed in the following route: the wafer station 90 (wafer trays T5, T6)→the cleaning apparatus 22→the cleaning apparatus 5→the wafer cassette 1.

Further, the three wafers W4, W5 and W6 are processed in the following route: the wafer cassette 1→the wafer station 90 (wafer tray T4)→the rotary transporter 27R→the polishing table 34R→the rotary transporter 27R. Thereafter, the wafer W4 is processed in the following route: the cleaning apparatus 23→the cleaning apparatus 6→the wafer cassette 1. And, the wafers W5 and W6 are processed in the following route: the wafer station 90 (wafer trays T5, T6)→the cleaning apparatus 23→the cleaning apparatus 6→the wafer cassette 1.

FIGS. 31 through 37 are schematic diagrams showing processes of the above parallel polishing and three-stage cleaning.

As shown in FIGS. 31 through 37, three semiconductor wafers W1, W2 and W3 are processed successively in the following route: the wafer cassette 1→the wafer station 90 (wafer tray T4)→the rotary transporter 27L→the polishing table 34L→the rotary transporter 27L. Thereafter, the wafer W1 is processed in the following route: the cleaning apparatus 22→the cleaning apparatus 5→the wafer station 90 (wafer tray T8)→the cleaning apparatus 6→the wafer cassette 1. And, the wafers W2 and W3 are processed in the following route: the wafer station 90 (wafer trays T5, T6)→the cleaning apparatus 22 the cleaning apparatus 5→the wafer station 90 (wafer trays T8)→the cleaning apparatus 6→the wafer cassette 1. [0244] Further, the three wafers W4, W5 and W6 are processed in the following route: the wafer cassette 1→the wafer station 90 (wafer tray T4)→the rotary transporter 27R→the polishing table 34R→the rotary transporter 27R. Thereafter, the wafer W4 is processed in the following route: the cleaning apparatus 23→the cleaning apparatus 6 the wafer station 90 (wafer tray T7)→the cleaning apparatus 5→the wafer cassette 1. And, the wafers W5 and W6 are processed in the following route: the wafer station 90 (wafer tray T4)→the cleaning apparatus 23→the cleaning apparatus 6→the wafer station 90 (wafer tray T7)→the cleaning apparatus 5→the wafer cassette 1.

FIGS. 38 through 47 are schematic diagrams showing processes of the above serial polishing and two-stage cleaning.

As shown in FIGS. 38 through 47, three semiconductor wafers W1, W2 and W3 are processed successively in the following route: the wafer cassette 1 the wafer station 90 (wafer tray T4)→the rotary transporter 27L→the polishing table 34L→the rotary transporter 27L. Thereafter, the wafer W1 is processed in the following route: the cleaning apparatus 22→the wafer station 90 (wafer tray T8)→the rotary transporter 27R→the polishing table 34R→the rotary transporter 27R→the cleaning apparatus 23→the cleaning apparatus 6→the wafer cassette 1. The wafer W2 is processed in the following route: the wafer station 90 (wafer tray T5)→the cleaning apparatus 22→the wafer station 90 (wafer tray T8)→the rotary transporter 27R→the polishing table 34R→the rotary transporter 27R→the wafer station 90 (wafer tray T5)→the cleaning apparatus 23→the wafer station 90 (wafer tray T7)→the cleaning apparatus 5→the wafer cassette 1. And, the wafer W3 is processed in the following route: the wafer station 90 (wafer tray T6)→the cleaning apparatus 22→the wafer station 90 (wafer tray T8)→the rotary transporter 27R→the polishing table 34R→the rotary transporter 27R→the wafer station 90 (wafer tray T6)→the cleaning apparatus 23→the cleaning apparatus 6→the wafer cassette 1.

FIGS. 48 through 58 are schematic diagrams showing processes of the above serial polishing and three-stage cleaning.

As shown in FIGS. 48 through 58, three semiconductor wafers W1, W2 and W3 are processed successively in the following route: the wafer cassette 1→the wafer station 90 (wafer tray T4)→the rotary transporter 27L→the polishing table 34L→the rotary transporter 27L. Thereafter, the wafer WI is processed in the following route: the cleaning apparatus 22→the wafer station 90 (wafer tray T8)→the rotary transporter 27R→the polishing table 34R→the rotary transporter 27R→the cleaning apparatus 23→the cleaning apparatus 6→the wafer station 90 (wafer tray T7)→the cleaning apparatus 5→the wafer cassette 1. And, the wafers W2 and W3 are processed in the following route: the wafer station 90 (wafer trays T5, T6)→the cleaning apparatus 22→the wafer station 90 (wafer tray T8)→the rotary transporter 27R→the polishing table 34R→the rotary transporter 27R→the wafer station 90 (wafer trays T5, T6)→the cleaning apparatus 23→the cleaning apparatus 6 the wafer station 90 (wafer tray T7)→the cleaning apparatus 5→the wafer cassette 1.

As described above, according to the present invention, it is possible to shorten time required to transfer workpieces to be polished, such as semiconductor wafers, to top rings for thereby greatly increasing the number of processed workpieces per unit time, i.e., throughput.

Although certain preferred embodiments of the present invention have been shown and described in detail, it should be understood that various changes and modifications may be made therein without departing from the scope of the appended claims.

What is claimed is:

1. A polishing apparatus comprising:
   a polishing table having a polishing surface;
   top rings for holding workpieces and pressing the workpieces against said polishing surface;
   a carousel for supporting said top rings and indexing said top rings;
   a rotary transporter disposed in a position which can be accessed by said top rings, said rotary transporter having on a circumference thereof portions for holding the workpieces, and said rotary transporter having an indexing function for indexing said portions; and
   a pusher for transferring the workpieces between said rotary transporter and said top rings.

2. The polishing apparatus according to claim 1, wherein each of said top rings is connected to said carousel through a swing arm so as to be angularly movable by said swing arm to a polishing position on said polishing table and a loading and unloading position on said rotary transporter.

3. The polishing apparatus according to claim 1, further comprising a second polishing table provided adjacent to said polishing table, wherein each of said top rings can access said second polishing table.

4. The polishing apparatus according to claim 3, wherein said each of said top rings is connected to said carousel through a swing arm so as also to be angularly movable by said swing arm to access said second polishing table.

5. The polishing apparatus according to claim 1, wherein each of said top rings is connected to said carousel through a swing arm so as to be angularly movable by said swing arm to an overhanging position at which a polished workpiece held by a corresponding each of said top rings projects from said polishing surface so as to cause a part of a polished surface of the polished workpiece to be exposed.

6. The polishing apparatus according to claim 1, further comprising a reversing device for allowing transfer of the workpieces to and from said rotary transporter, and for reversing the workpieces.

7. The polishing apparatus according to claim 6, further comprising a vertically moveable lifter for holding and moving a workpiece, wherein when said reversing device is positioned above or below said rotary transporter transfer of the workpieces to and from said rotary transporter is to be conducted by said lifter.

8. A polishing apparatus comprising:
   two polishing units, each of said two polishing units including:
   (i) a polishing table having a polishing surface;
   (ii) top rings for holding workpieces and pressing the workpieces against said polishing surface; and
   (iii) a carousel for supporting said top rings and indexing said top rings;
   two rotary transporters, said two rotary transporters being disposed in positions which can be accessed by said top rings of said two polishing units, respectively, each of said two rotary transporters having on a circumference thereof portions for holding the workpieces, and each of said two rotary transporters having an indexing function for indexing said portions; and two pushers, said two pushers being adapted for transferring the workpieces between said two rotary transporters and said top rings of said two polishing units, respectively.

9. The polishing apparatus according to claim 8, wherein said each of said two polishing units also includes a carousel, with each of said top rings being connected to a corresponding said carousel through a swing arm so as to be angularly movable by said swing arm to a polishing position on a corresponding said polishing table and a loading and unloading position on a corresponding one of said two rotary transporters.

10. The polishing apparatus according to claim 8, wherein said each of said two polishing units also includes a second polishing table provided adjacent to a corresponding said polishing table, and each of said top rings can access a corresponding said second polishing table.

11. The polishing apparatus according to claim 10, wherein said each of said two polishing units also includes a carousel, with said each of said top rings being connected to a corresponding said carousel through a swing arm so as to be angularly movable by said swing arm to access said corresponding said second polishing table.

12. The polishing apparatus according to claim 8, wherein said each of said two polishing units also includes a carousel, with each of said top rings being connected to a corresponding said carousel through a swing arm so as also to be angularly movable by said swing arm to an overhanging position at which a polished workpiece held by said each of said top rings projects from a corresponding said polishing surface so as to cause a part of a polished surface of the polished workpiece to be exposed.

13. The polishing apparatus according to claim 8, further comprising two reversing devices for allowing transfer of the workpieces to and from said two rotary transporters, respectively, and for reversing the workpieces.

14. The polishing apparatus according to claim 13, further comprising two vertically moveable lifters each for holding and moving a workpiece, wherein when said two reversing devices are positioned above or below said two rotary transporters, respectively, transfer of the workpieces to and from said two rotary transporters is to be conducted by said two lifters, respectively.

* * * * *